(12) United States Patent
Kawamura et al.

(10) Patent No.: US 11,631,817 B2
(45) Date of Patent: Apr. 18, 2023

(54) ORGANIC ELECTROLUMINESCENCE ELEMENT, ELECTRONIC DEVICE, COMPOSITION, MATERIAL FOR ORGANIC ELECTROLUMINESCENCE ELEMENT, AND COMPOSITION FILM

(71) Applicant: IDEMITSU KOSAN CO., LTD., Tokyo (JP)

(72) Inventors: Masahiro Kawamura, Sodegaura (JP); Tetsuya Masuda, Sodegaura (JP); Kazuki Nishimura, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 379 days.

(21) Appl. No.: 16/640,639

(22) PCT Filed: Aug. 20, 2018

(86) PCT No.: PCT/JP2018/030636
§ 371 (c)(1),
(2) Date: Feb. 20, 2020

(87) PCT Pub. No.: WO2019/039428
PCT Pub. Date: Feb. 28, 2019

(65) Prior Publication Data
US 2020/0365811 A1  Nov. 19, 2020

(30) Foreign Application Priority Data

Aug. 21, 2017  (JP) .............................. JP2017-158938

(51) Int. Cl.
*H01L 51/50* (2006.01)
*H01L 51/00* (2006.01)
*C09K 11/06* (2006.01)

(52) U.S. Cl.
CPC .......... *H01L 51/0072* (2013.01); *C09K 11/06* (2013.01); *H01L 51/0067* (2013.01);
(Continued)

(58) Field of Classification Search
None
See application file for complete search history.

(56) References Cited

U.S. PATENT DOCUMENTS

| 2011/0278555 A1 | 11/2011 | Inoue et al. |
| 2012/0305900 A1* | 12/2012 | Kim ....................... C09K 11/06 257/E51.026 |
| 2014/0151647 A1 | 6/2014 | Mizuki et al. |
| 2014/0306207 A1 | 10/2014 | Nishimura et al. |
| 2017/0213988 A1 | 7/2017 | Park et al. |
| 2017/0222160 A1 | 8/2017 | Lee et al. |

FOREIGN PATENT DOCUMENTS

| JP | 2014-094935 A | 5/2014 |
| KR | 2015-0052705 A | 5/2015 |
| WO | WO-2011/132684 A1 | 10/2011 |

(Continued)

OTHER PUBLICATIONS

International Searching Authority, "International Search Report," issued in connection with International Patent Application No. PCT/JP2018/030636, dated Nov. 6, 2018.
International Searching Authority, "Written Opinion," issued in connection with International Patent Application No. PCT/JP2018/030636, dated Nov. 6, 2018.
International Searching Authority, International Preliminary Report on Patentability issued in connection with International Patent Application No. PCT/JP2018/030636, dated Feb. 25, 2020.

*Primary Examiner* — Gregory D Clark
(74) *Attorney, Agent, or Firm* — Foley & Lardner LLP

(57) ABSTRACT

ABSTRACT An organic electroluminescence device includes an anode, a cathode, and at least one organic layer (Continued)

provided between the anode and the cathode, in which the at least one organic layer contains a first compound represented by a formula (1) and a second compound represented by a formula (2). In the formula (1), $A^1$ is a substituted or unsubstituted nitrogen-containing heterocyclic group having 5 to 24 ring atoms, and $L^1$ is a single bond, a substituted or unsubstituted divalent aryl group having 6 to 24 ring carbon atoms or a substituted or unsubstituted divalent heterocyclic group having 5 to 24 ring atoms. In the formula (2), $X^1$ is an oxygen atom or a sulfur atom.

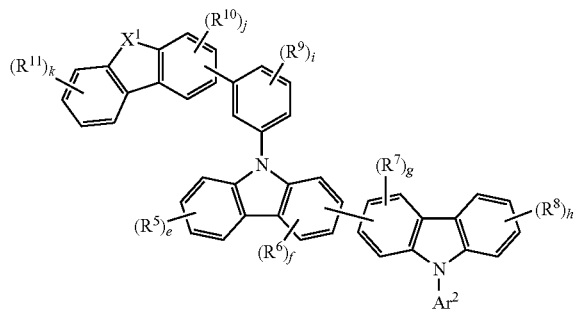

15 Claims, 1 Drawing Sheet

(52) U.S. Cl.
CPC ...... *H01L 51/0073* (2013.01); *H01L 51/0074* (2013.01); *C09K 2211/185* (2013.01); *H01L 51/5016* (2013.01); *H01L 51/5056* (2013.01); *H01L 51/5072* (2013.01); *H01L 51/5088* (2013.01); *H01L 51/5092* (2013.01)

(56) References Cited

FOREIGN PATENT DOCUMENTS

| WO | WO-2013/062075 A1 | 5/2013 |
| WO | WO-2013/084885 A1 | 6/2013 |
| WO | WO-2015/178732 A1 | 11/2015 |

* cited by examiner

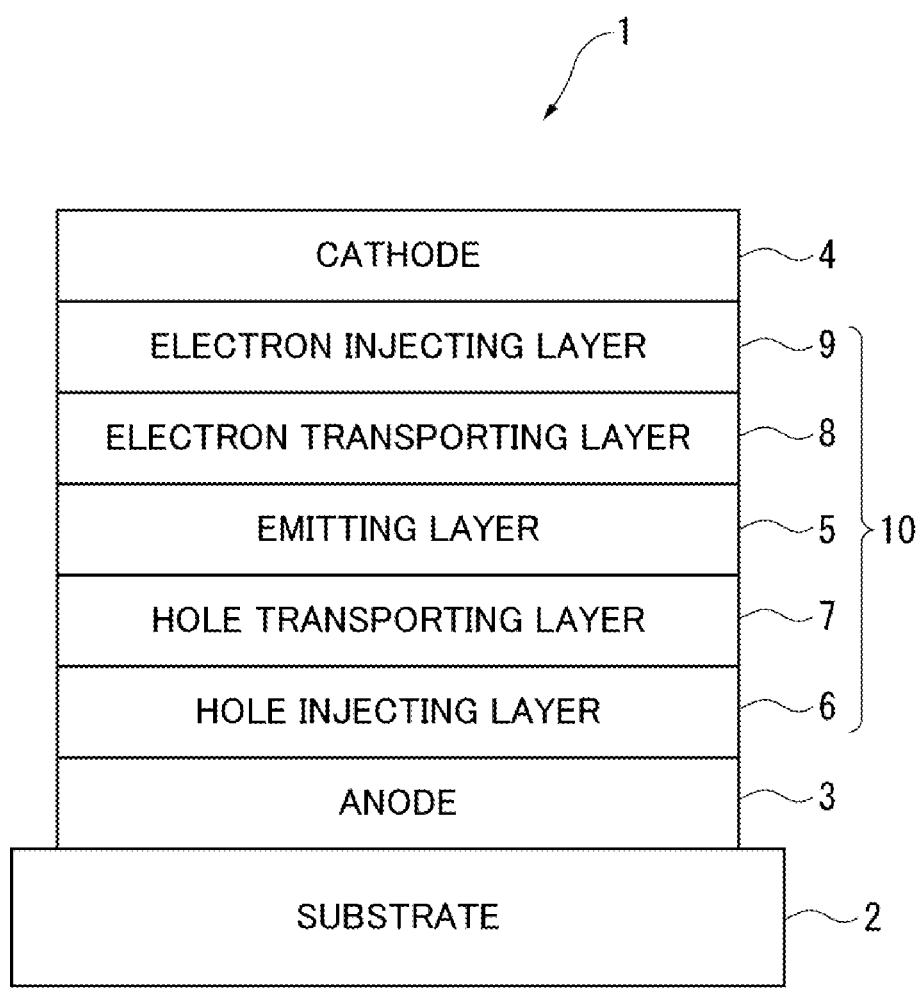

ORGANIC ELECTROLUMINESCENCE ELEMENT, ELECTRONIC DEVICE, COMPOSITION, MATERIAL FOR ORGANIC ELECTROLUMINESCENCE ELEMENT, AND COMPOSITION FILM

CROSS-REFERENCE TO RELATED APPLICATIONS

The present application claims priority under 37 U.S.C. § 371 to International Patent Application No. PCT/JP2018/030636, filed Aug. 20, 2018, which claims priority to and the benefit of Japanese Patent Application No. 2017-158938, filed on Aug. 21, 2017. The contents of these applications are hereby incorporated by reference in their entireties.

TECHNICAL FIELD

The present invention relates to an organic electroluminescence device, an electronic device, a composition, a material for an organic electroluminescence device, and a composition film.

BACKGROUND ART

Patent Literature 1 discloses an organic electroluminescence device containing a host material, which is used in combination with a phosphorescent dopant material, in a form of a biscarbazole compound having a triazine ring and a biscarbazole compound having a phenylene group substituted with a dibenzofuran ring at the para position to the biscarbazole compound.

Patent Literature 2 discloses an organic electroluminescence device containing a host material in a form of a biscarbazole compound having a triazinyl group or a quinoxalinyl group and a biscarbazole compound having a phenylene group substituted with dibenzothiophene at the para position to the biscarbazole compound.

CITED LITERATURE(S)

Patent Literature(S)

Patent Literature 1 International Publication No. 2013/062075
Patent Literature 2 International Publication No. 2015/178732

SUMMARY OF THE INVENTION

Problem(s) to be Solved by the Invention

Patent Literatures 1 and 2 fail to describe that performance of the organic electroluminescence device changes depending on bonding positions of the dibenzofuran ring and the dibenzothiophene ring to the phenylene group on a nitrogen atom at a 9-position of the biscarbazole compound (host compound).

An object of the invention is to provide an organic electroluminescence device exhibiting the same level of an external quantum efficiency and a longer lifetime as compared with a typical organic electroluminescence device, an electronic device including the organic electroluminescence device, a composition applicable to the organic electroluminescence device, a material for the organic electroluminescence device containing the composition, and a composition film containing the composition.

Means for Solving the Problems

According to an aspect of the invention, an organic electroluminescence device includes an anode, a cathode, and at least one organic layer provided between the anode and the cathode, in which the at least one organic layer contains a first compound represented by a formula (1) and a second compound represented by a formula (2).

[Formula 1]

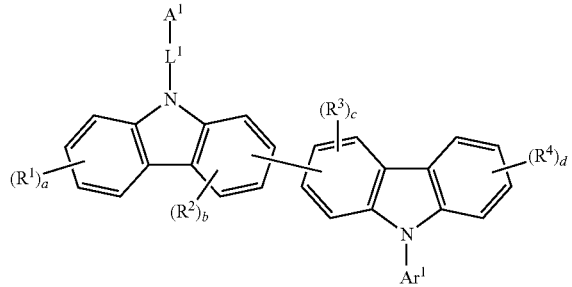

(1)

In the formula (1), $R^1$, $R^2$, $R^3$ and $R^4$ each independently represent a halogen atom, a substituted or unsubstituted alkyl group having 1 to 25 carbon atoms, a substituted or unsubstituted cycloalkyl group having 3 to 25 ring carbon atoms, a substituted or unsubstituted aryl group having 6 to 24 ring carbon atoms, a substituted or unsubstituted heterocyclic group having 3 to 30 ring atoms, a substituted or unsubstituted alkoxy group having 1 to 25 carbon atoms, a substituted or unsubstituted aryloxy group having 6 to 24 ring carbon atoms, a substituted or unsubstituted alkylthio group having 1 to 25 carbon atoms, a substituted or unsubstituted arylthio group having 6 to 24 ring carbon atoms, a substituted or unsubstituted aralkyl group having 7 to 25 carbon atoms, a silyl group substituted by at least one group selected from the group consisting of an alkyl group having 1 to 25 carbon atoms and an aryl group having 6 to 24 ring carbon atoms, or a cyano group.

a is 0, 1, 2, 3 or 4.
b is 0, 1, 2 or 3.
c is 0, 1, 2 or 3.
d is 0, 1, 2, 3 or 4.

A plurality of $R^1$ are mutually the same or different when a is 2 or more. The plurality of $R^1$ are mutually bonded to form a ring, or not bonded.

A plurality of $R^2$ are mutually the same or different when b is 2 or more. The plurality of $R^2$ are mutually bonded to form a ring, or not bonded.

A plurality of $R^3$ are mutually the same or different when c is 2 or more. The plurality of $R^3$ are mutually bonded to form a ring, or not bonded.

A plurality of $R^4$ are mutually the same or different when d is 2 or more. The plurality of $R^4$ are mutually bonded to form a ring, or not bonded.

$A^1$ is a substituted or unsubstituted nitrogen-containing heterocyclic group having 5 to 24 ring atoms.

$L^1$ is a single bond, a substituted or unsubstituted divalent aryl group having 6 to 24 ring carbon atoms, or a substituted or unsubstituted divalent heterocyclic group having 5 to 24 ring atoms.

Ar$^1$ is a substituted or unsubstituted aryl group having 6 to 24 ring carbon atoms, or a substituted or unsubstituted heterocyclic group having 5 to 24 ring atoms.

[Formula 2]

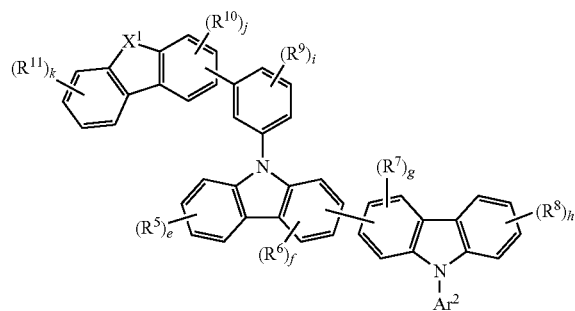

(2)

In the formula (2), $R^5$, $R^6$, $R^7$, $R_8$, $R^9$, $R^{10}$ and $R^{11}$ each independently represent a halogen atom, a substituted or unsubstituted alkyl group having 1 to 25 carbon atoms, a substituted or unsubstituted cycloalkyl group having 3 to 25 ring carbon atoms, a substituted or unsubstituted aryl group having 6 to 24 ring carbon atoms, a substituted or unsubstituted heterocyclic group having 3 to 30 ring atoms, a substituted or unsubstituted alkoxy group having 1 to 25 carbon atoms, a substituted or unsubstituted aryloxy group having 6 to 24 ring carbon atoms, a substituted or unsubstituted alkylthio group having 1 to 25 carbon atoms, a substituted or unsubstituted arylthio group having 6 to 24 ring carbon atoms, a substituted or unsubstituted aralkyl group having 7 to 25 carbon atoms, a silyl group substituted by at least one group selected from the group consisting of an alkyl group having 1 to 25 carbon atoms and an aryl group having 6 to 24 ring carbon atoms, or a cyano group.

e is 0, 1, 2, 3 or 4.
f is 0, 1, 2 or 3.
g is 0, 1, 2 or 3.
h is 0, 1, 2, 3 or 4.
i is 0, 1, 2, 3 or 4.
j is 0, 1, 2 or 3.
k is 0, 1, 2, 3 or 4.

A plurality of $R^5$ are mutually the same or different when e is 2 or more. The plurality of $R^5$ are mutually bonded to form a ring, or not bonded.

A plurality of $R^6$ are mutually the same or different when f is 2 or more. The plurality of $R^6$ are mutually bonded to form a ring, or not bonded.

A plurality of $R^7$ are mutually the same or different when g is 2 or more. The plurality of $R^7$ are mutually bonded to form a ring, or not bonded.

A plurality of $R^8$ are mutually the same or different when h is 2 or more. The plurality of $R^8$ are mutually bonded to form a ring, or not bonded.

A plurality of $R^9$ are mutually the same or different when i is 2 or more. The plurality of $R^9$ are mutually bonded to form a ring, or not bonded.

A plurality of $R^{10}$ are mutually the same or different when j is 2 or more. The plurality of $R^{10}$ are mutually bonded to form a ring, or not bonded.

A plurality of $R^{11}$ are mutually the same or different when k is 2 or more. The plurality of $R^{11}$ are mutually bonded to form a ring, or not bonded.

Ar$^2$ is a substituted or unsubstituted aryl group having 6 to 24 ring carbon atoms, or a substituted or unsubstituted heterocyclic group having 5 to 24 ring atoms.

$X^1$ is an oxygen atom or a sulfur atom.

According to another aspect of the invention, an electronic device including the organic electroluminescence device according to the above aspect of the invention is provided.

According to still another aspect of the invention, a composition containing the first and second compounds according to the above aspect of the invention is provided.

According to a further aspect of the invention, an organic-electroluminescence-device material containing the composition according to the above aspect of the invention is provided.

According to a still further aspect of the invention, a composition film containing the composition according to the above aspect of the invention is provided.

According to the above aspects of the invention, an organic electroluminescence device exhibiting the same level of an external quantum efficiency and a longer lifetime as compared with a typical organic electroluminescence device, an electronic device including the organic electroluminescence device, a composition applicable to the organic electroluminescence device, a material for the organic electroluminescence device containing the composition, and a composition film containing the composition can be provided.

BRIEF DESCRIPTION OF DRAWING

The FIGURE schematically shows an example of an organic electroluminescence device according to an exemplary embodiment.

DESCRIPTION OF EMBODIMENT(S)

First Exemplary Embodiment

Organic EL Device

An organic EL device according to a first exemplary embodiment includes an anode, a cathode, and an organic layer between the anode and the cathode. The organic layer includes at least one layer formed of an organic compound. Alternatively, the organic layer is provided by layering a plurality of layers each containing an organic compound. The organic layer may further contain an inorganic compound. In the organic EL device of the exemplary embodiment, at least one layer forming the organic layer(s) is an emitting layer. Accordingly, the organic layer may consist of a single emitting layer or, alternatively, may further include layers usable in the organic EL device. Examples of the layer usable in the organic EL device, which are not particularly limited, include at least one layer selected from the group consisting of a hole injecting layer, hole transporting layer, electron injecting layer, electron transporting layer, and blocking layer.

In the first exemplary embodiment, the organic layer includes a plurality of layers, in which a first compound and a second compound according to the exemplary embodiment are contained preferably in one or more layers of the plurality of layers, more preferably in a single one of the plurality of layers. The first compound is different from the second compound in a molecular structure.

In the organic EL device according to the first exemplary embodiment, the emitting layer preferably contains the first compound and the second compound according to the first exemplary embodiment.

In the first exemplary embodiment, the organic EL device preferably further contains a hole transporting layer between the anode and the emitting layer.

In the first exemplary embodiment, the organic EL device preferably further contains an electron transporting layer between the cathode and the emitting layer.

The organic EL device may have the following typical arrangements (a) to (f).

(a) anode/emitting layer/cathode (b) anode/hole injecting-transporting layer/emitting layer/cathode (c) anode/emitting layer/electron injecting-transporting layer/cathode (d) anode/hole injecting-transporting layer/emitting layer/electron injecting-transporting layer/cathode (e) anode/hole injecting-transporting layer/emitting layer/blocking layer/electron injecting-transporting layer/cathode (f) anode/hole injecting-transporting layer/blocking layer/emitting layer/blocking layer/electron injecting-transporting layer/cathode Among the above, the arrangement (d) is preferably usable. However, the invention is not limited to these arrangements. It should be noted that the term "emitting layer" means an organic layer having a luminescent function. The term "hole injecting/transporting layer" means "at least one of a hole injecting layer and a hole transporting layer." The term "electron injecting/transporting layer" means "at least one of an electron injecting layer and an electron transporting layer." When the organic EL device includes a hole injecting layer and a hole transporting layer, the hole injecting layer is preferably provided between the hole transporting layer and the anode. When the organic EL device includes an electron injecting layer and an electron transporting layer, the electron injecting layer is preferably provided between the electron transporting layer and the cathode. Each of the hole injecting layer, the hole transporting layer, the electron transporting layer, and the electron injecting layer may consist of a single layer or a plurality of layers.

The FIGURE schematically shows an exemplary arrangement of the organic EL device of the first exemplary embodiment.

An organic EL device 1 includes a light-transmissive substrate 2, an anode 3, a cathode 4 and an organic layer 10 disposed between the anode 3 and the cathode 4. The organic layer 10 includes a hole injecting layer 6, a hole transporting layer 7, an emitting layer 5, an electron transporting layer 8, and an electron injecting layer 9. The organic layer 10 includes the hole injecting layer 6, the hole transporting layer 7, the emitting layer 5, the electron transporting layer 8, and the electron injecting layer 9, which are sequentially laminated on the anode 3.

The emitting layer 5 of the organic EL device 1 contains the first compound and the second compound according to the first exemplary embodiment.

The organic EL device according to the first exemplary embodiment, which contains the first compound and the second compound in combination in the organic layer, emits light for a long lifetime. In order that the organic EL device emits light for a long lifetime, the first compound and the second compound are preferably contained in a single emitting layer.

Use of the first compound and the second compound according to the first exemplary embodiment in at least on layer of the organic EL device according to the first exemplary embodiment provides an organic electroluminescence device having the same level of an external quantum efficiency and a longer lifetime as compared with a typical organic electroluminescence device.

First Compound

The first compound is represented by a formula (1) below.

[Formula 3]

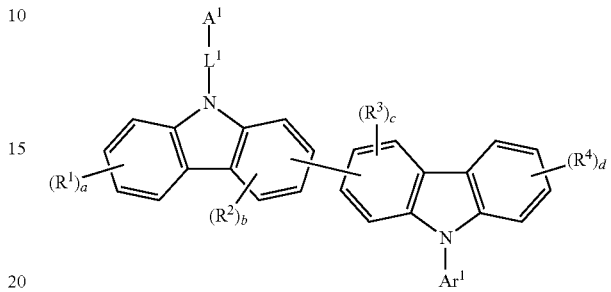

In the formula (1), $R^1$, $R^2$, $R^3$ and $R^4$ each independently represent a halogen atom, a substituted or unsubstituted alkyl group having 1 to 25 carbon atoms, a substituted or unsubstituted cycloalkyl group having 3 to 25 ring carbon atoms, a substituted or unsubstituted aryl group having 6 to 24 ring carbon atoms, a substituted or unsubstituted heterocyclic group having 3 to 30 ring atoms, a substituted or unsubstituted alkoxy group having 1 to 25 carbon atoms, a substituted or unsubstituted aryloxy group having 6 to 24 ring carbon atoms, a substituted or unsubstituted alkylthio group having 1 to 25 carbon atoms, a substituted or unsubstituted arylthio group having 6 to 24 ring carbon atoms, a substituted or unsubstituted aralkyl group having 7 to 25 carbon atoms, a silyl group substituted by at least one group selected from the group consisting of an alkyl group having 1 to 25 carbon atoms and an aryl group having 6 to 24 ring carbon atoms, or a cyano group.

a is 0, 1, 2, 3 or 4.

b is 0, 1, 2 or 3.

c is 0, 1, 2 or 3.

d is 0, 1, 2, 3 or 4;

A plurality of $R^1$ are mutually the same or different when a is 2 or more. The plurality of $R^1$ are mutually bonded to form a ring, or not bonded.

A plurality of $R^2$ are mutually the same or different when b is 2 or more. The plurality of $R^2$ are mutually bonded to form a ring, or not bonded.

A plurality of $R^3$ are mutually the same or different when c is 2 or more. The plurality of $R^3$ are mutually bonded to form a ring, or not bonded.

A plurality of $R^4$ are mutually the same or different when d is 2 or more. The plurality of $R^4$ are mutually bonded to form a ring, or not bonded.

$A^1$ is a substituted or unsubstituted nitrogen-containing heterocyclic group having 5 to 24 ring atoms.

$L^1$ is a single bond, a substituted or unsubstituted divalent aryl group having 6 to 24 ring carbon atoms, or a substituted or unsubstituted divalent heterocyclic group having 5 to 24 ring atoms.

$Ar^1$ is a substituted or unsubstituted aryl group having 6 to 24 ring carbon atoms, or a substituted or unsubstituted heterocyclic group having 5 to 24 ring atoms.

The first compound represented by the formula (1) is preferably represented by a formula (3) or (4).

[Formula 4]

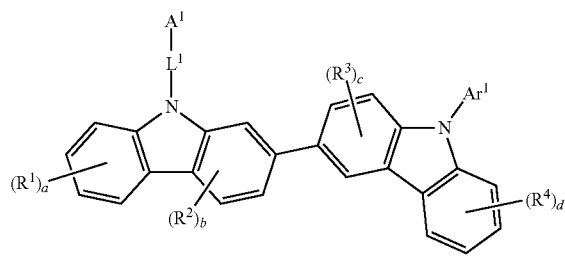

(3)

[Formula 5]

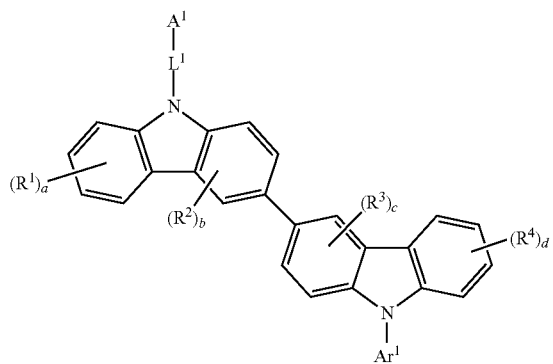

(4)

In the formulae (3) and (4), $R^1$, $R^2$, $R^3$ and $R^4$ each independently represent a halogen atom, a substituted or unsubstituted alkyl group having 1 to 25 carbon atoms, a substituted or unsubstituted cycloalkyl group having 3 to 25 ring carbon atoms, a substituted or unsubstituted aryl group having 6 to 24 ring carbon atoms, a substituted or unsubstituted heterocyclic group having 3 to 30 ring atoms, a substituted or unsubstituted alkoxy group having 1 to 25 carbon atoms, a substituted or unsubstituted aryloxy group having 6 to 24 ring carbon atoms, a substituted or unsubstituted alkylthio group having 1 to 25 carbon atoms, a substituted or unsubstituted arylthio group having 6 to 24 ring carbon atoms, a substituted or unsubstituted aralkyl group having 7 to 25 carbon atoms, a silyl group substituted by at least one group selected from the group consisting of an alkyl group having 1 to 25 carbon atoms and an aryl group having 6 to 24 ring carbon atoms, or a cyano group.

a is 0, 1, 2, 3 or 4.
b is 0, 1, 2 or 3.
c is 0, 1, 2 or 3.
d is 0, 1, 2, 3 or 4.

A plurality of $R^1$ are mutually the same or different when a is 2 or more. The plurality of $R^1$ are mutually bonded to form a ring, or not bonded.

A plurality of $R^2$ are mutually the same or different when b is 2 or more. The plurality of $R^2$ are mutually bonded to form a ring, or not bonded.

A plurality of $R^3$ are mutually the same or different when c is 2 or more. The plurality of $R^3$ are mutually bonded to form a ring, or not bonded.

A plurality of $R^4$ are mutually the same or different when d is 2 or more. The plurality of $R^4$ are mutually bonded to form a ring, or not bonded.

$A^1$ is a substituted or unsubstituted nitrogen-containing heterocyclic group having 5 to 24 ring atoms.

$L^1$ is a single bond, a substituted or unsubstituted divalent aryl group having 6 to 24 ring carbon atoms, or a substituted or unsubstituted divalent heterocyclic group having 5 to 24 ring atoms.

$Ar^1$ is a substituted or unsubstituted aryl group having 6 to 24 ring carbon atoms, or a substituted or unsubstituted heterocyclic group having 5 to 24 ring atoms.

In the first compound, $R^1$, $R^2$, $R^3$ and $R^4$ are preferably each independently a substituted or unsubstituted aryl group having 6 to 24 ring carbon atoms, or a substituted or unsubstituted heterocyclic group having 3 to 30 ring atoms.

In the first compound, $A^1$ is preferably a substituent represented by a formula (5) below.

[Formula 6]

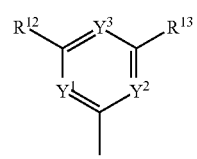

(5)

In the formula (5), $Y^1$, $Y^2$ and $Y^3$ each independently represent $CR^{14}$ or a nitrogen atom.

At least one of $Y^1$, $Y^2$ and $Y^3$ is a nitrogen atom.

$R^{12}$, $R^{13}$ and $R^{14}$ represent a hydrogen atom, a halogen atom, a substituted or unsubstituted alkyl group having 1 to 25 carbon atoms, a substituted or unsubstituted cycloalkyl group having 3 to 25 ring carbon atoms, a substituted or unsubstituted aryl group having 6 to 24 ring carbon atoms, a substituted or unsubstituted heterocyclic group having 3 to 30 ring atoms, a substituted or unsubstituted alkoxy group having 1 to 25 carbon atoms, a substituted or unsubstituted aryloxy group having 6 to 24 ring carbon atoms, a substituted or unsubstituted alkylthio group having 1 to 25 carbon atoms, a substituted or unsubstituted arylthio group having 6 to 24 ring carbon atoms, a substituted or unsubstituted aralkyl group having 7 to 25 carbon atoms, a silyl group substituted by at least one group selected from the group consisting of an alkyl group having 1 to 25 carbon atoms and an aryl group having 6 to 24 ring carbon atoms, or a cyano group.

$R^{12}$ and $R^{14}$ are mutually bonded to form a ring, or not bonded.

$R^{13}$ and $R^{14}$ are mutually bonded to form a ring, or not bonded.

In the first compound, at least two of $Y^1$, $Y^2$ and $Y^3$ are preferably nitrogen atoms.

In the first compound, $R^{12}$, $R^{13}$, and $R^{14}$ are preferably each independently a substituted or unsubstituted aryl group having 6 to 24 ring carbon atoms, or a substituted or unsubstituted heterocyclic group having 3 to 30 ring atoms.

For instance, when $Y^1$ and $Y^2$ are nitrogen atoms and $Y^3$ is $CR^{14}$, the compound represented by the formula (5) is represented by a formula (5a) below.

[Formula 7]

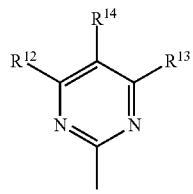

(5a)

For instance, when $R^{12}$ and $R^{14}$ are mutually bonded to form a ring, the compound represented by the formula (5a) is represented by a formula (5a-1) below.

[Formula 8]

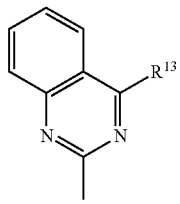

(5a-1)

For instance, when $Y^1$, $Y^2$ and $Y^3$ are nitrogen atoms, the compound represented by the formula (5) is represented by a formula (5b) below.

[Formula 9]

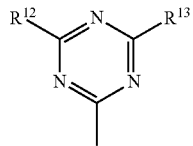

(5b)

In the first compound, $L^1$ is preferably a substituted or unsubstituted divalent aryl group having 6 to 24 ring carbon atoms, or a substituted or unsubstituted divalent heterocyclic group having 5 to 24 ring atoms.

$L^1$ is more preferably a group represented by a formula (5c), (5d), (5e), (5f) or (5g). The groups represented by the formulae (5c), (5d), (5e), (5f) and (5g) may be substituted. In the formula (5g), R is a substituted or unsubstituted monovalent aryl group having 6 to 24 ring carbon atoms.

[Formula 10]

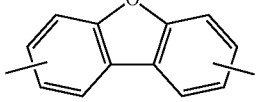

(5c)

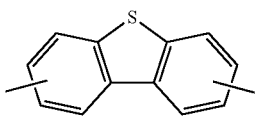

(5d)

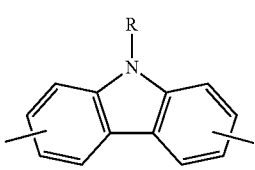

(5e)

(5f)

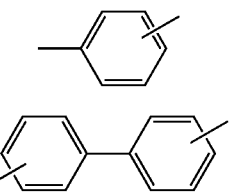

(5g)

$L^1$ is further preferably a substituted or unsubstituted 1,3-phenylene group or a substituted or unsubstituted 1,4-phenylene group, still further preferably an unsubstituted 1,3-phenylene group or an unsubstituted 1,4-phenylene group.

In the first compound, a, b, c and d are preferably 0.

When a, b, c and d are 0 in the formula (1), the first compound is represented by a formula (1A) below.

[Formula 11]

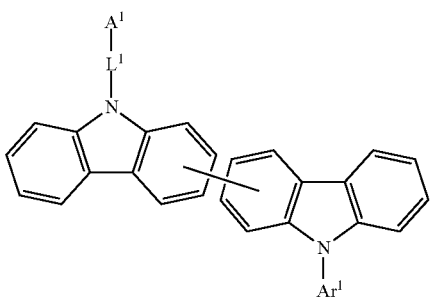

(1A)

In the formula (1A), $A^1$ is a substituted or unsubstituted nitrogen-containing heterocyclic group having 5 to 24 ring atoms.

$L^1$ is a single bond, a substituted or unsubstituted divalent aryl group having 6 to 24 ring carbon atoms, or a substituted or unsubstituted divalent heterocyclic group having 5 to 24 ring atoms.

$Ar^1$ is a substituted or unsubstituted aryl group having 6 to 24 ring carbon atoms, or a substituted or unsubstituted heterocyclic group having 5 to 24 ring atoms.

When a, b, c and d are 0 in the formula (3), the first compound is represented by a formula (3A) below.

[Formula 12]

(3A)

In the formula (3A), $A^1$ is a substituted or unsubstituted nitrogen-containing heterocyclic group having 5 to 24 ring atoms.

$L^1$ is a single bond, a substituted or unsubstituted divalent aryl group having 6 to 24 ring carbon atoms, or a substituted or unsubstituted divalent heterocyclic group having 5 to 24 ring atoms.

$Ar^1$ is a substituted or unsubstituted aryl group having 6 to 24 ring carbon atoms, or a substituted or unsubstituted heterocyclic group having 5 to 24 ring atoms.

When a, b, c and d are 0 in the formula (4), the first compound is represented by a formula (4A) below.

[Formula 13]

(4A)

In the formula (4A), $A^1$ is a substituted or unsubstituted nitrogen-containing heterocyclic group having 5 to 24 ring atoms.

$L^1$ is a single bond, a substituted or unsubstituted divalent aryl group having 6 to 24 ring carbon atoms, or a substituted or unsubstituted divalent heterocyclic group having 5 to 24 ring atoms.

$Ar^1$ is a substituted or unsubstituted aryl group having 6 to 24 ring carbon atoms, or a substituted or unsubstituted heterocyclic group having 5 to 24 ring atoms.

The first compound can be manufactured by a combination of known methods (e.g., International Publication No. WO2011/132684).

Examples of the first compound according to the exemplary embodiment are given below. It should be noted that the first compound in the exemplary embodiment are by no means limited to the examples below.

[Formula 14]

[Formula 15]

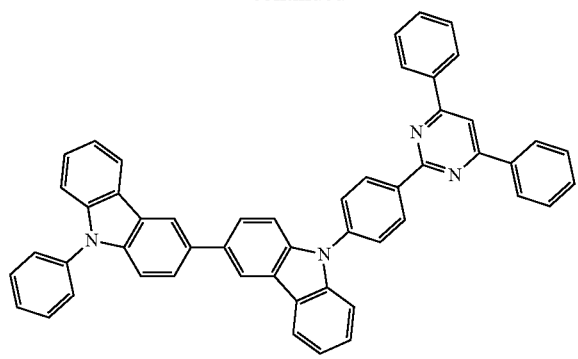
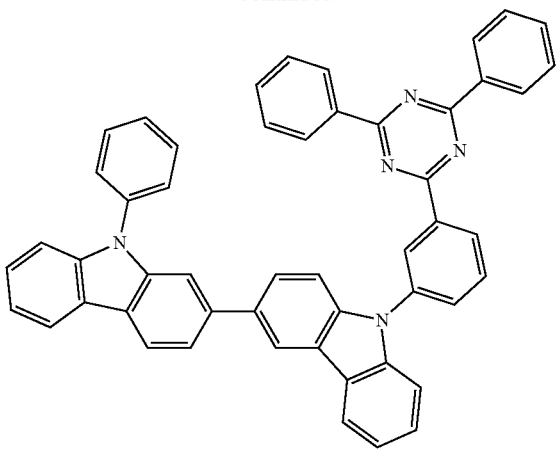
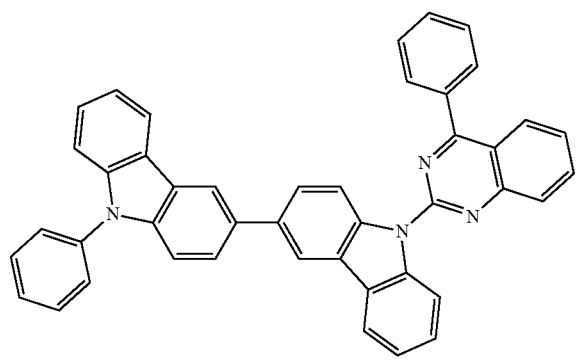
[Formula 17]
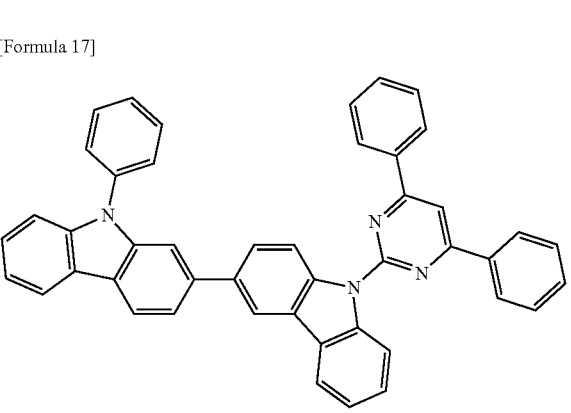
[Formula 16]
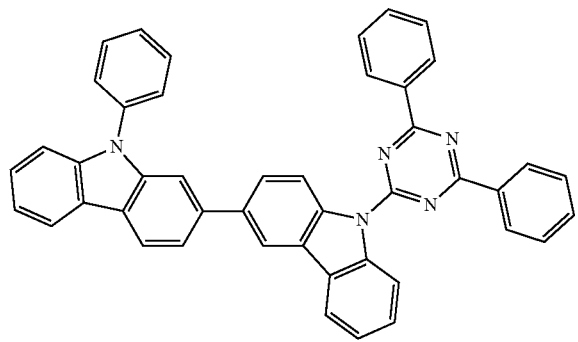
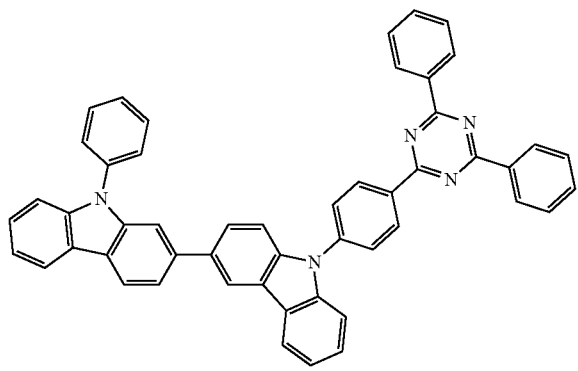

[Formula 18]
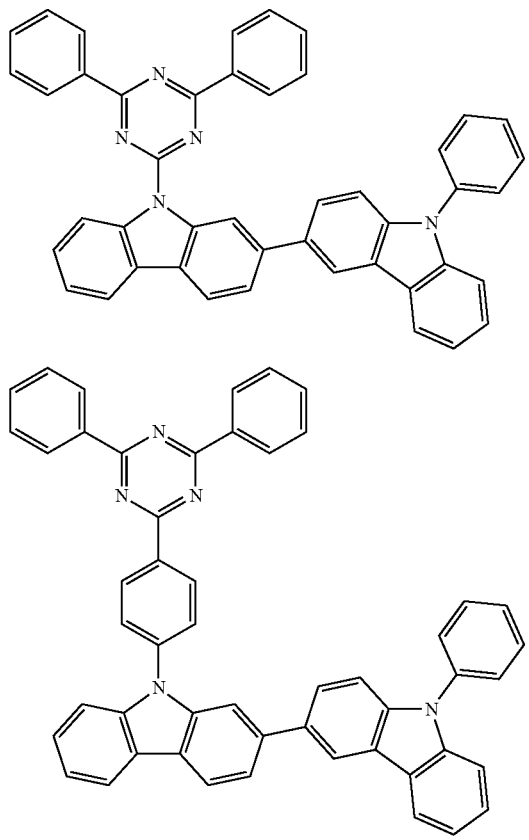
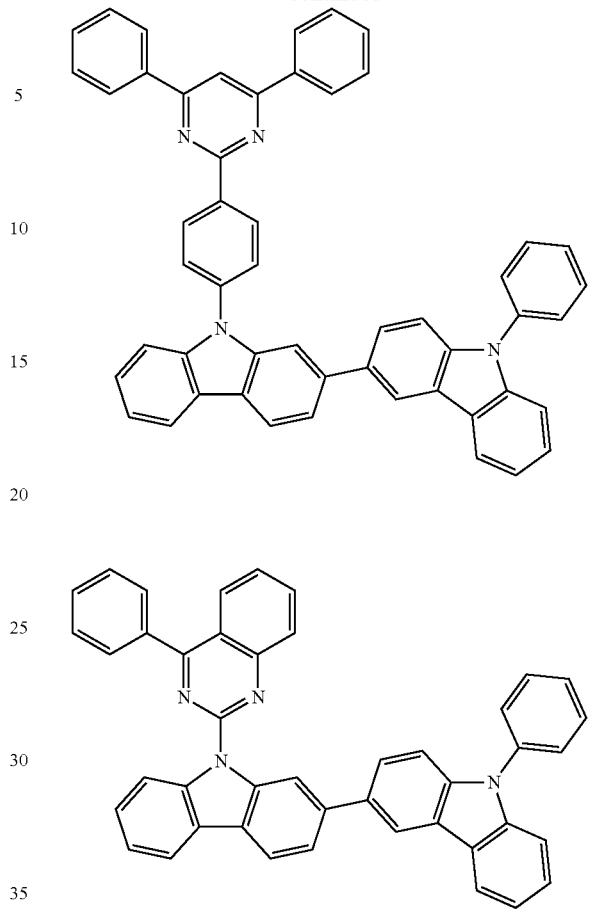
[Formula 19]
[Formula 20]
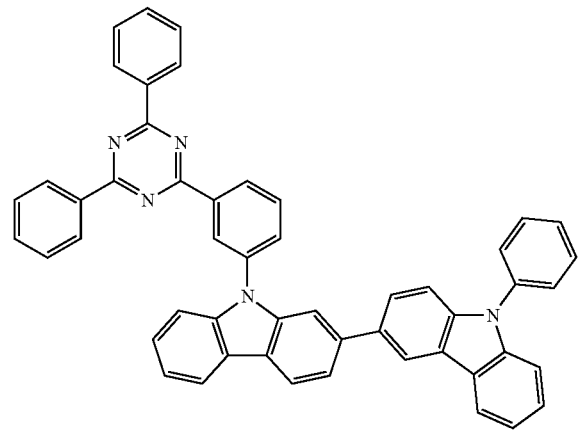
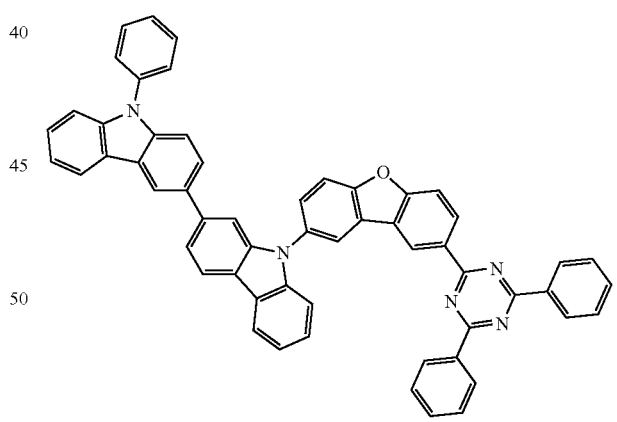
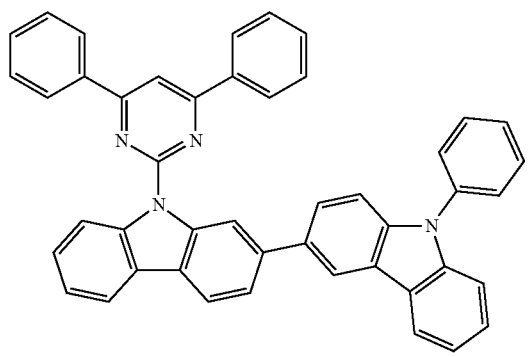
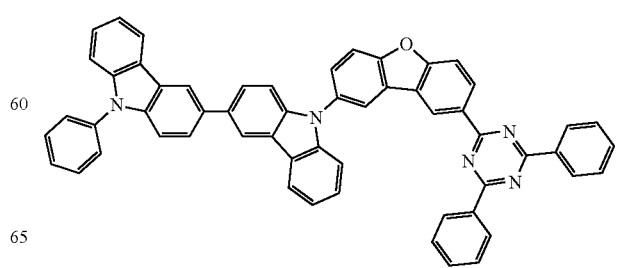

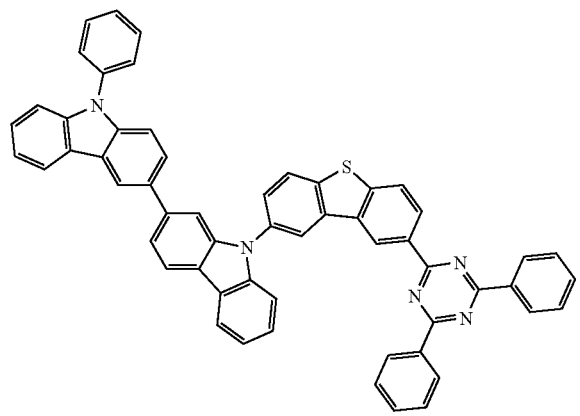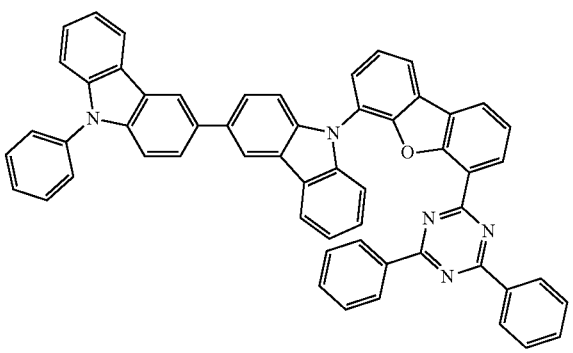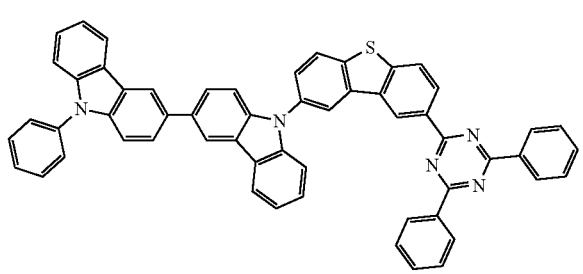
[Formula 21]
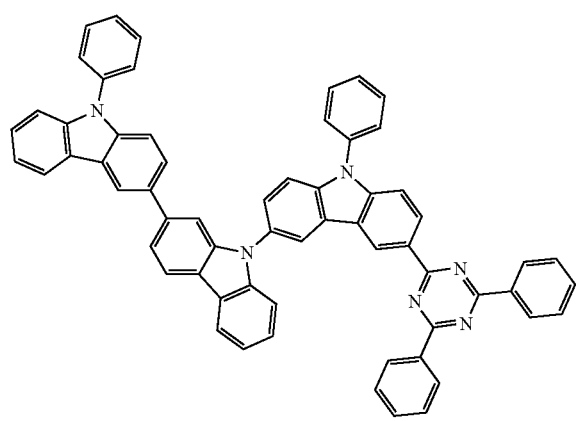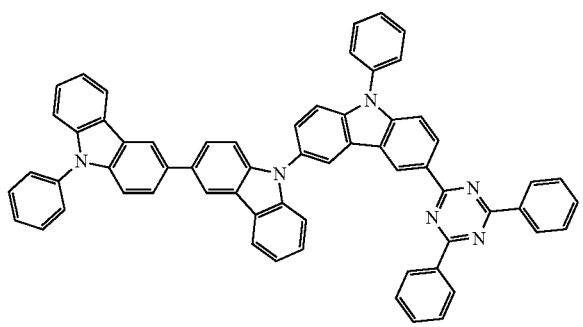

[Formula 22]
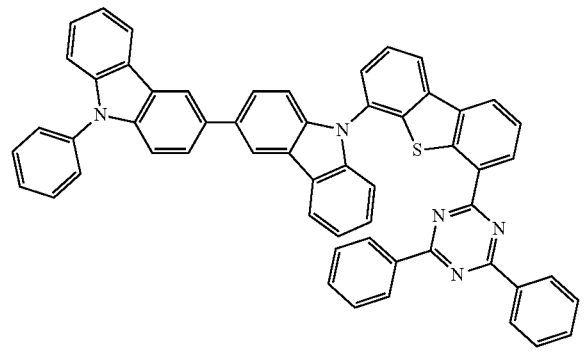
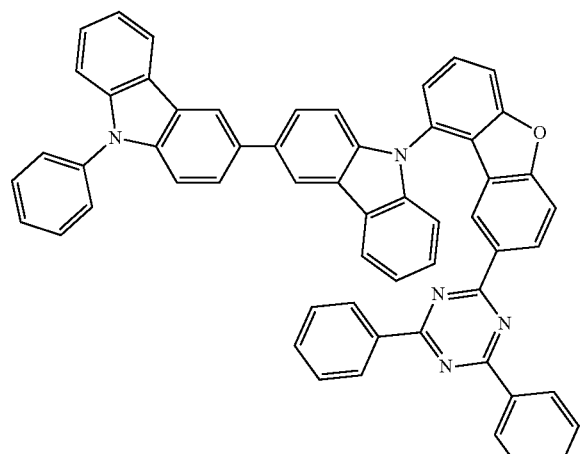
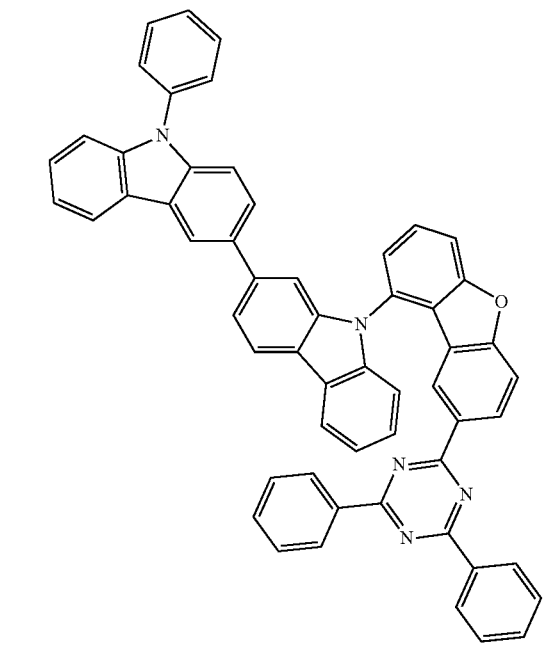
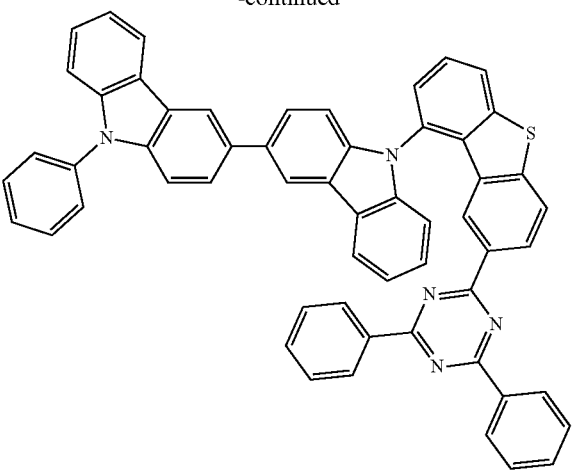
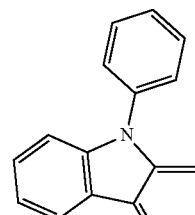
[Formula 23]
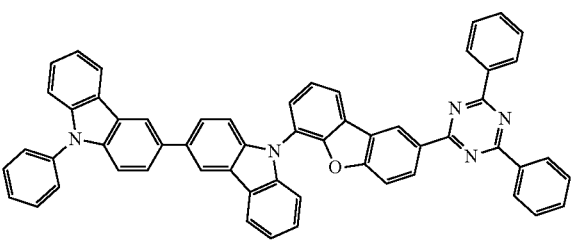
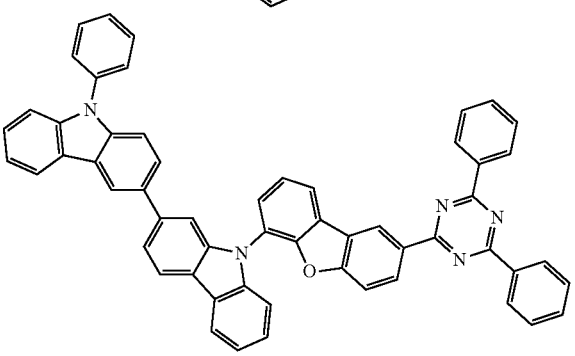

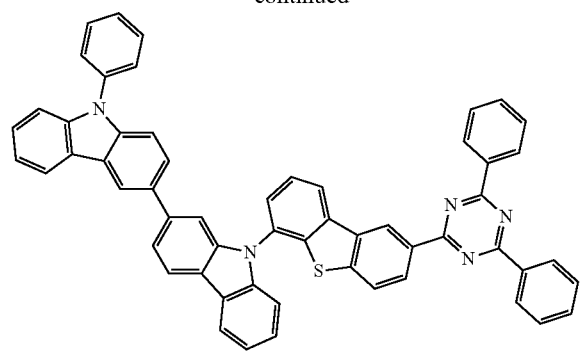
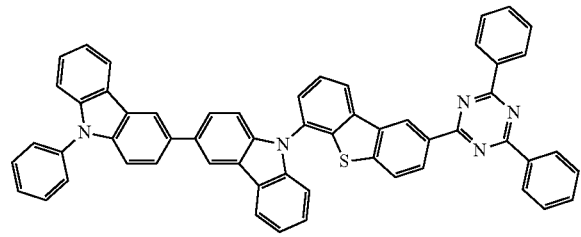
[Formula 24]
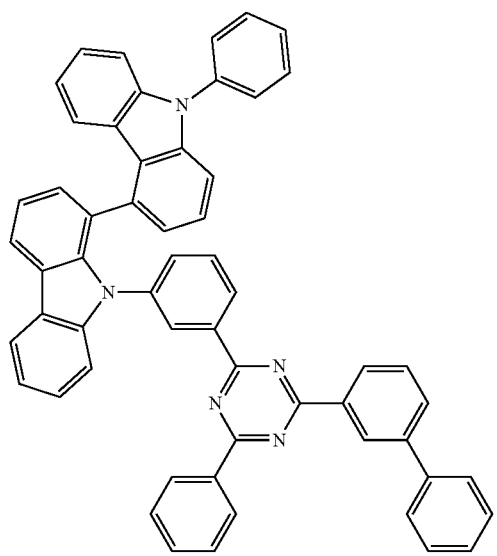
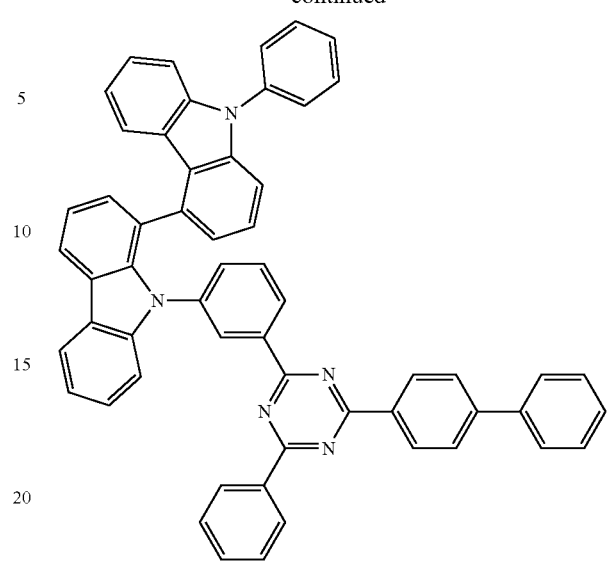
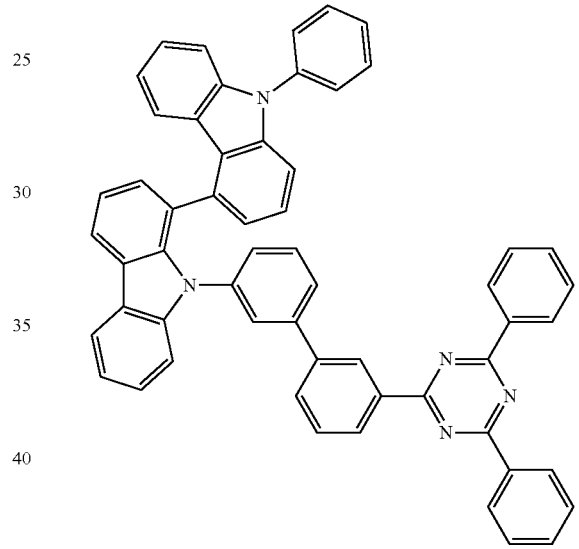
[Formula 25]
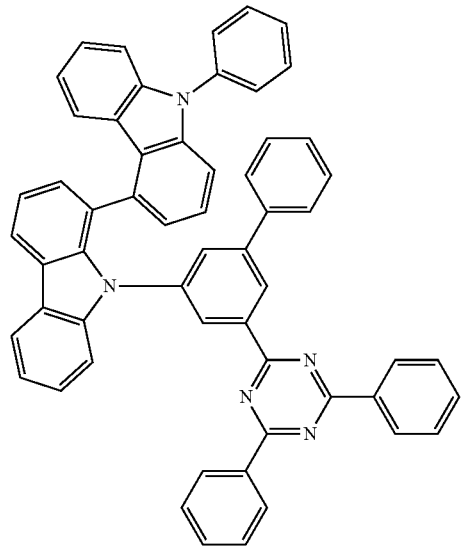
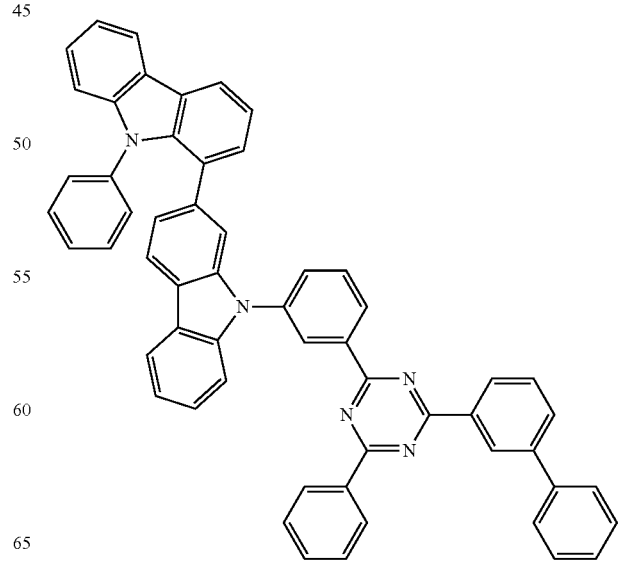

-continued
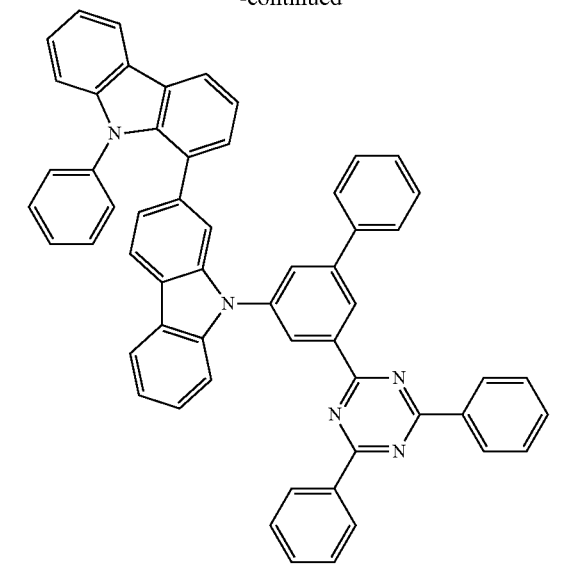
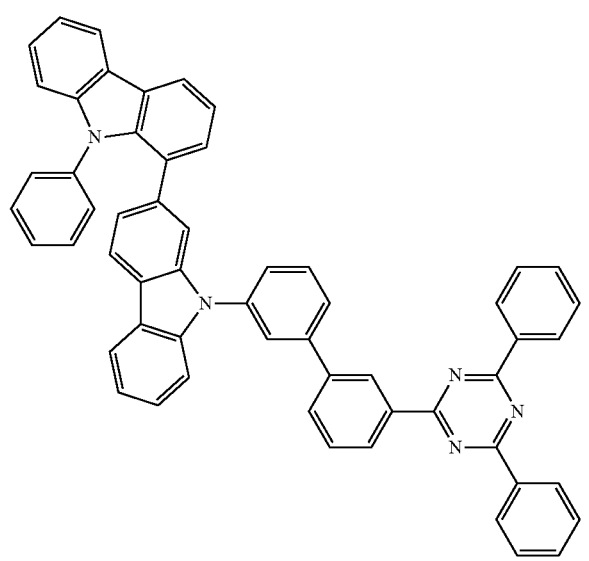
[Formula 26]
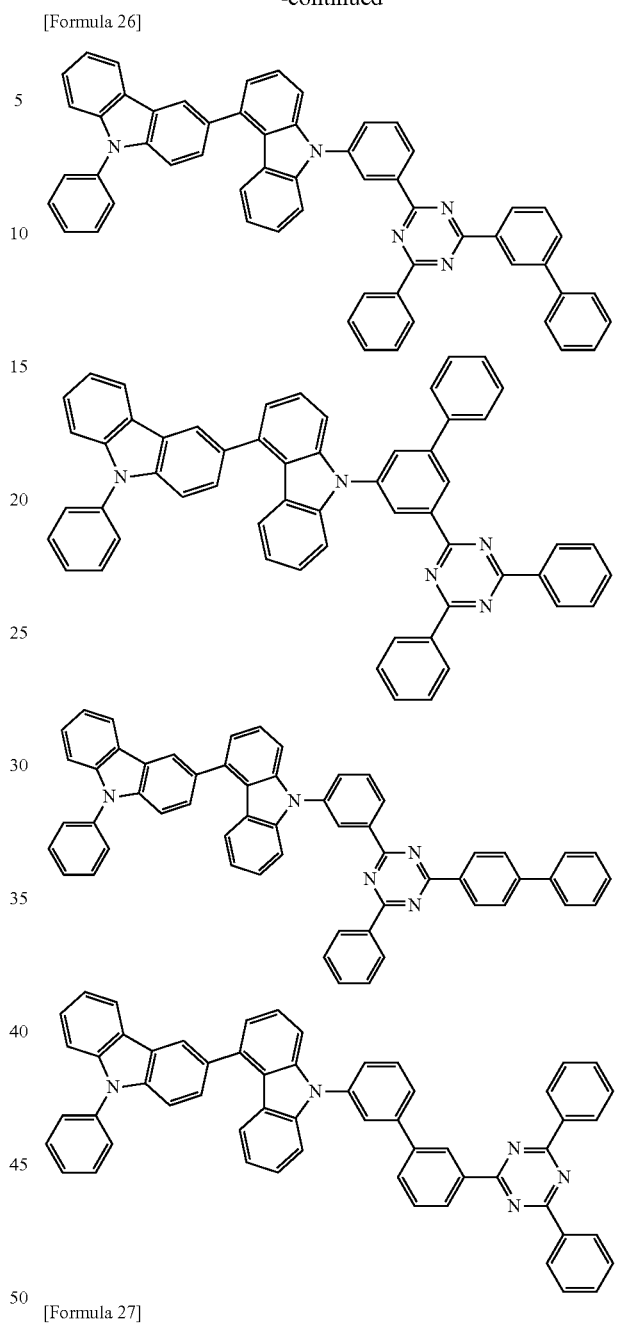
[Formula 27]
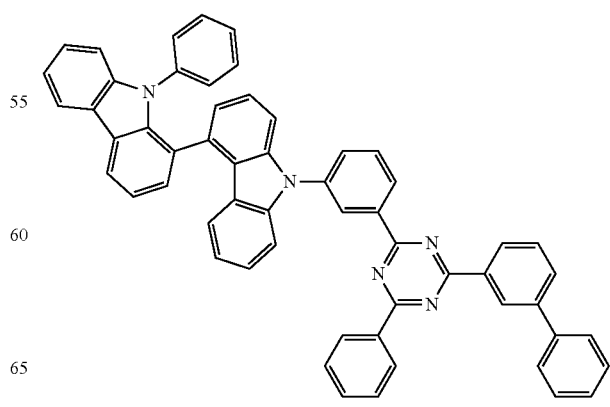

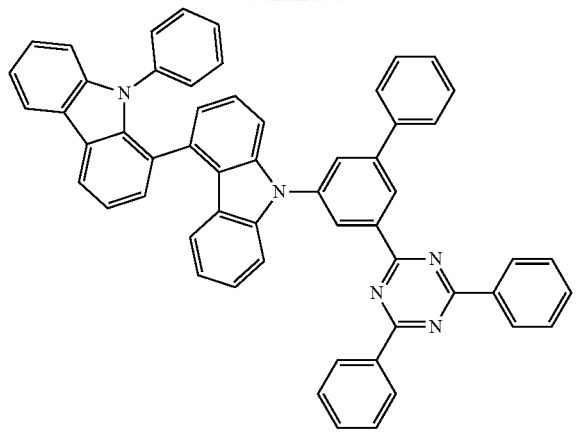
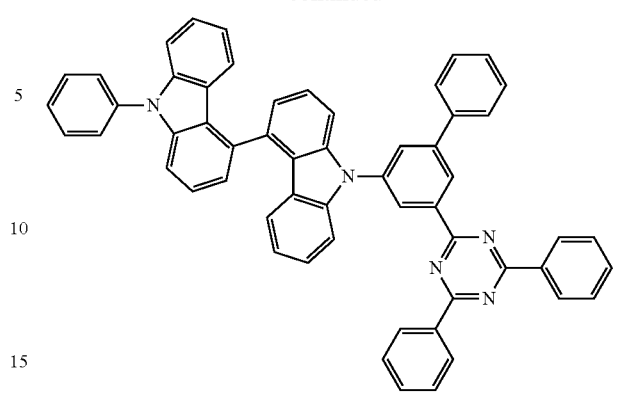
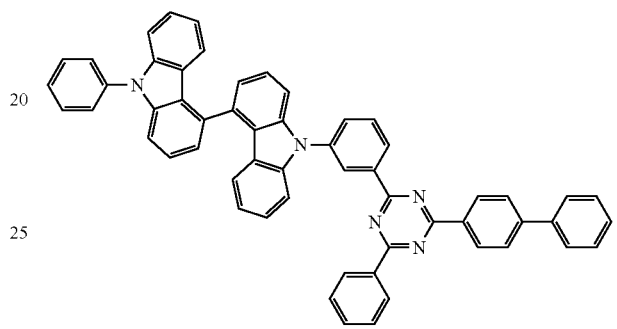
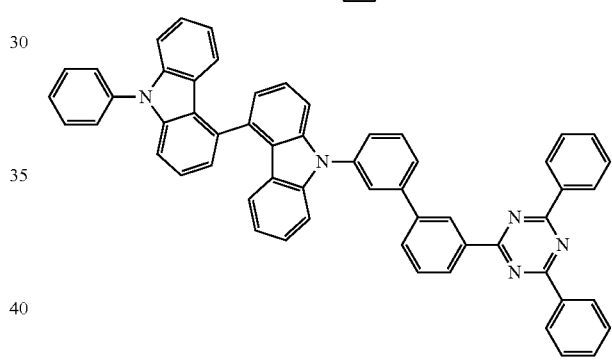
[Formula 28]
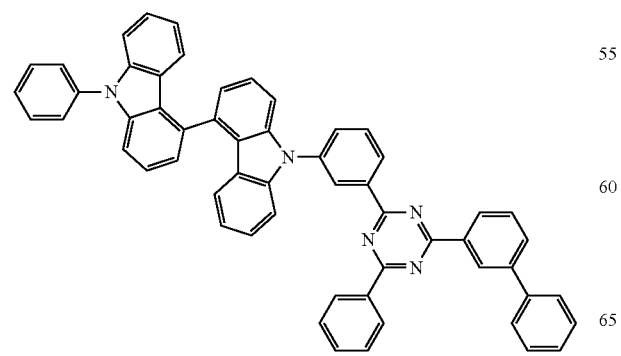
[Formula 29]
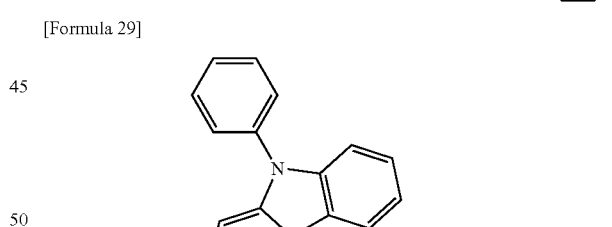
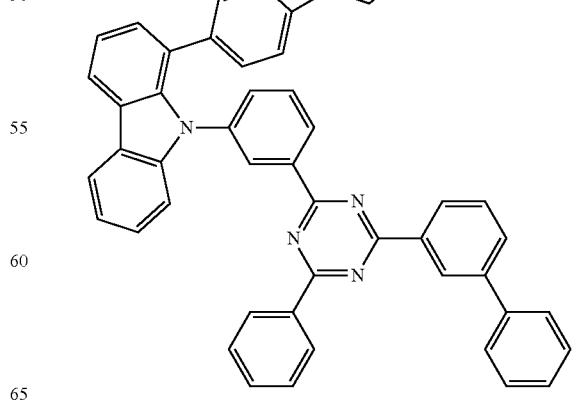

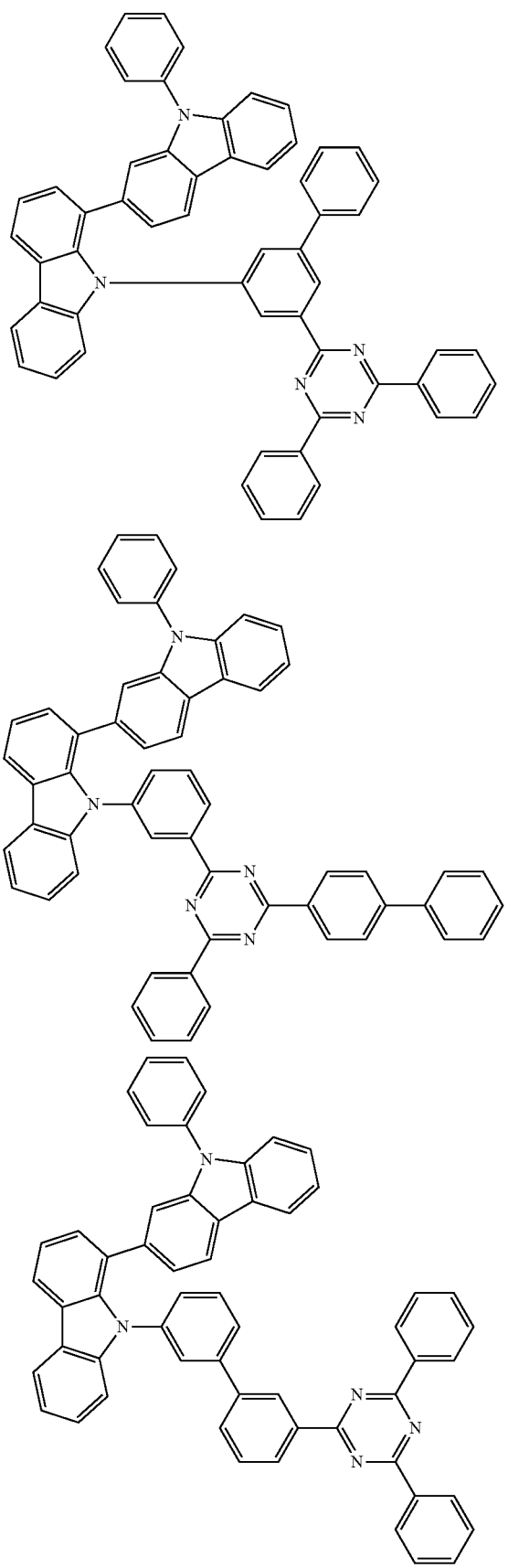
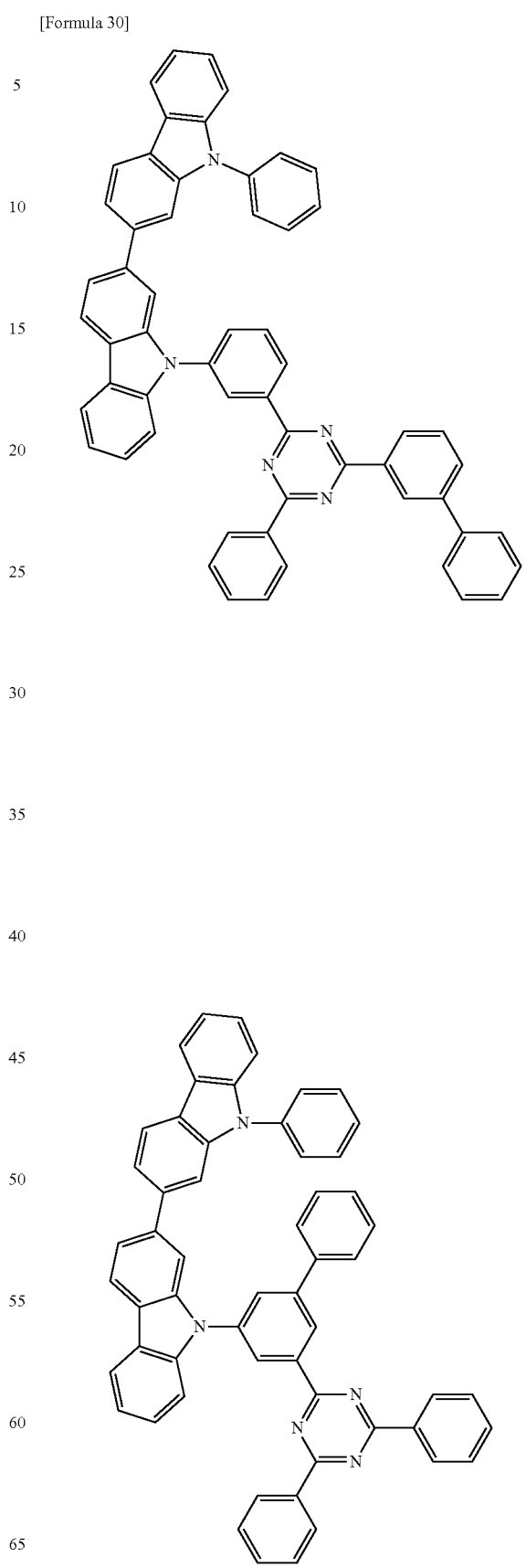

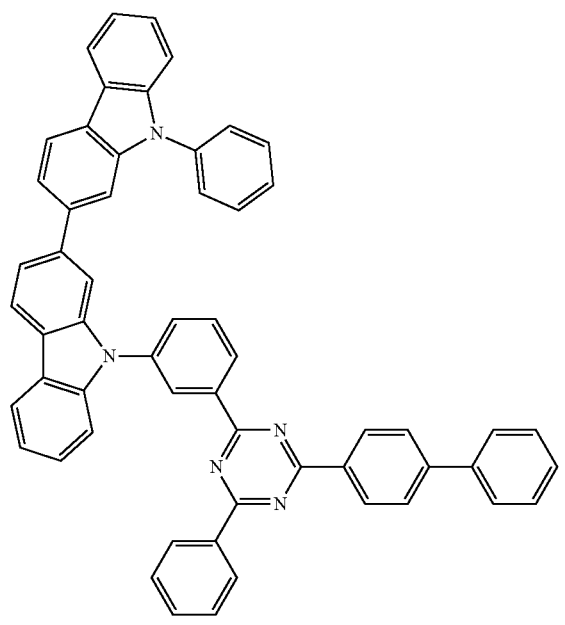
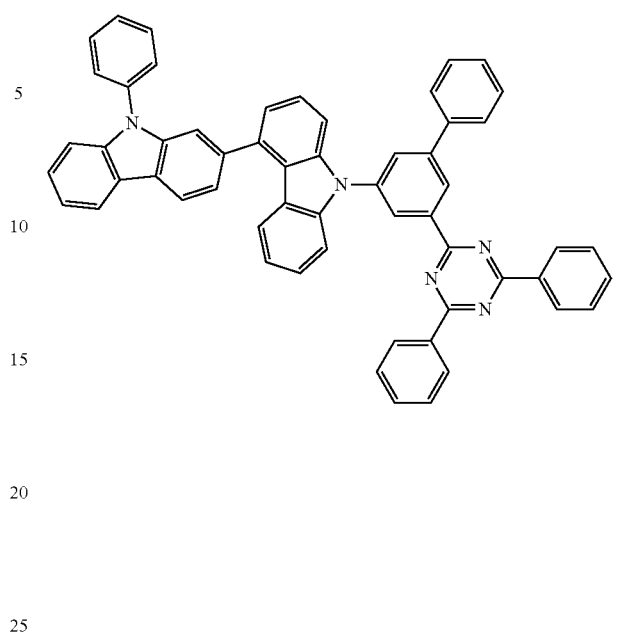
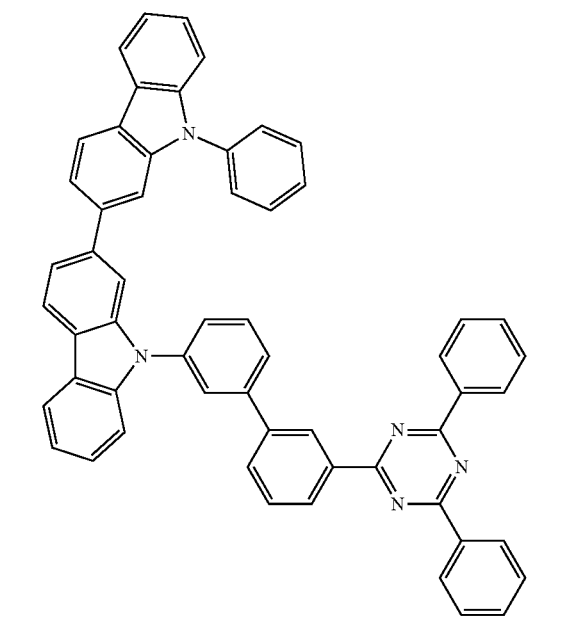
[Formula 31]
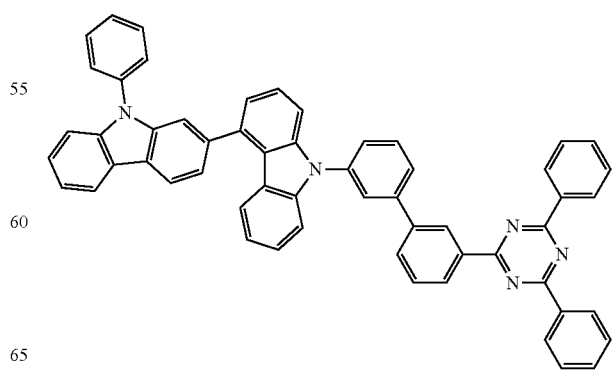

[Formula 32]
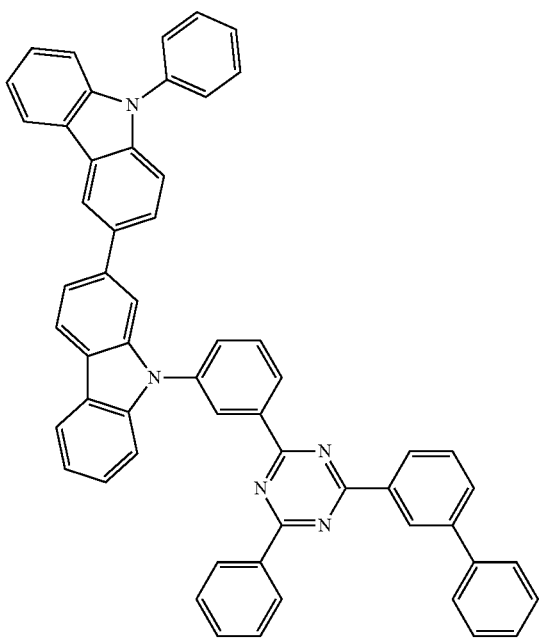
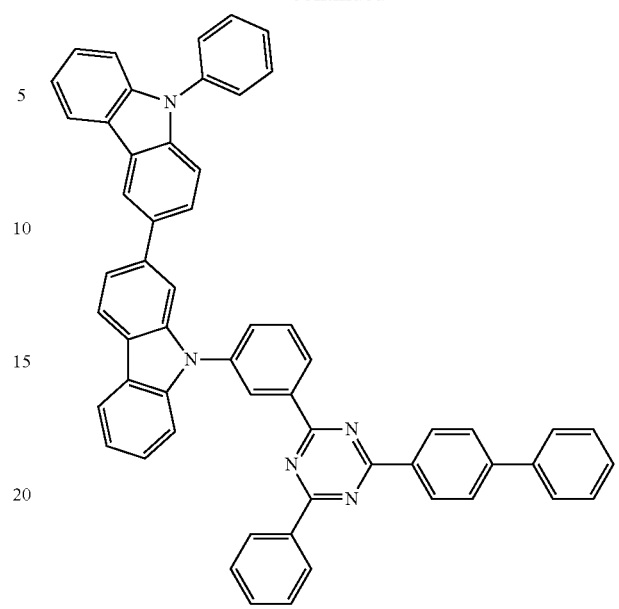
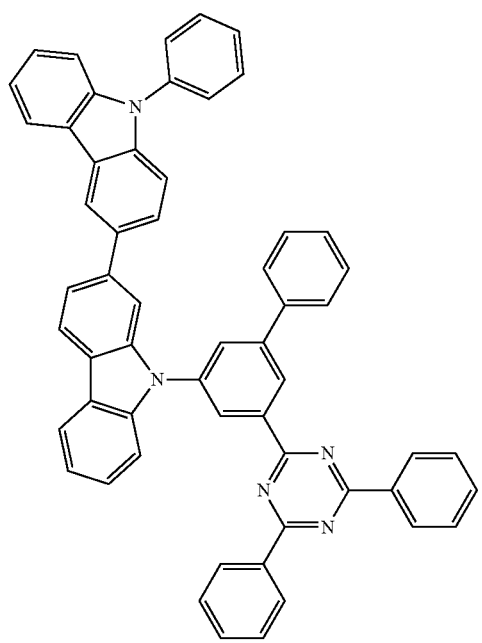
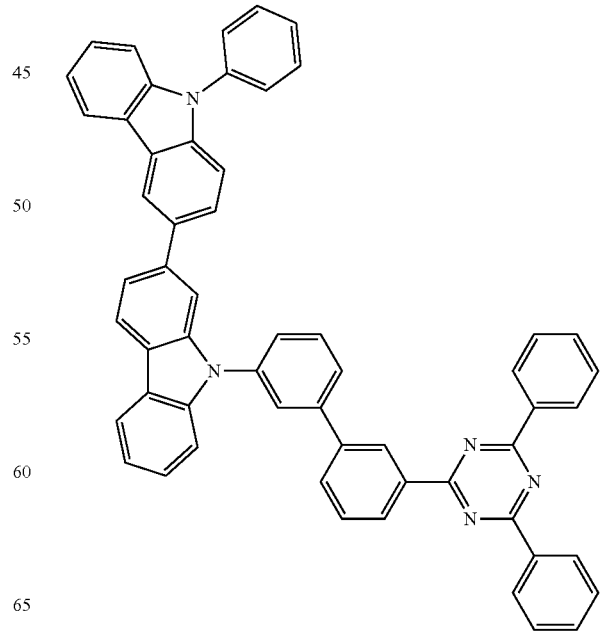

[Formula 33]
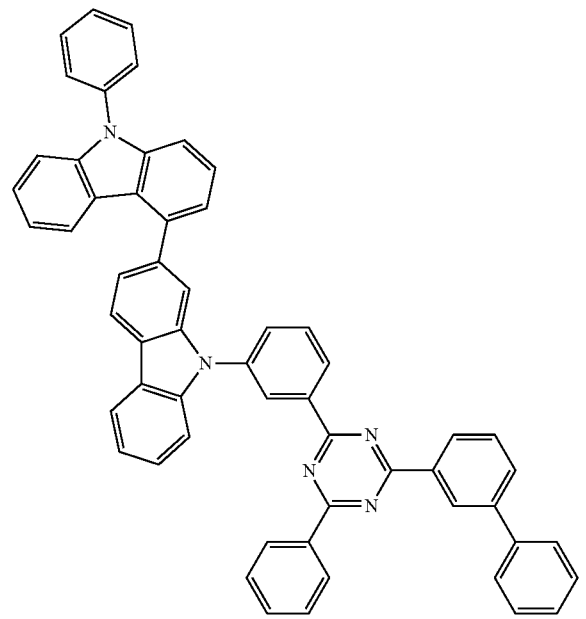
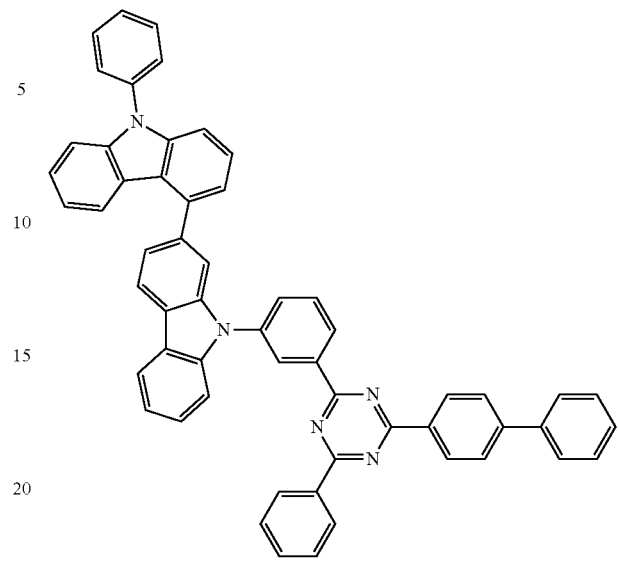

[Formula 34]
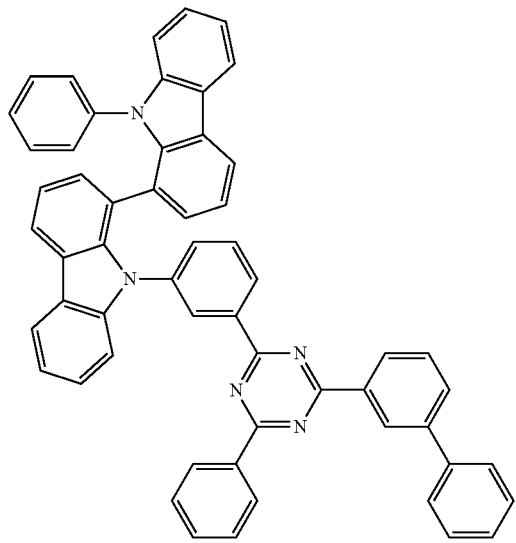
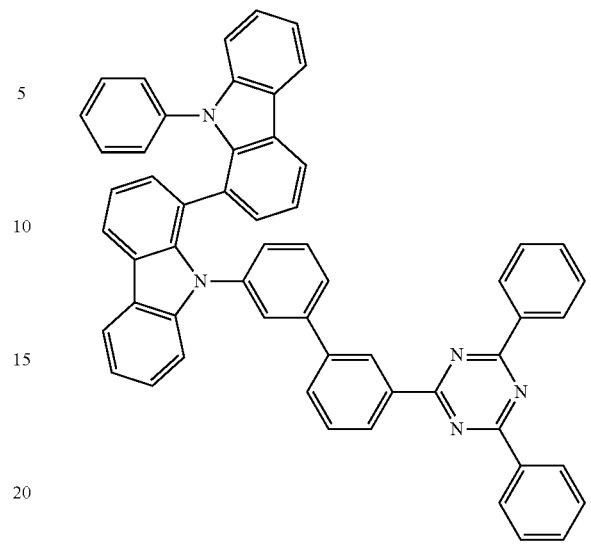
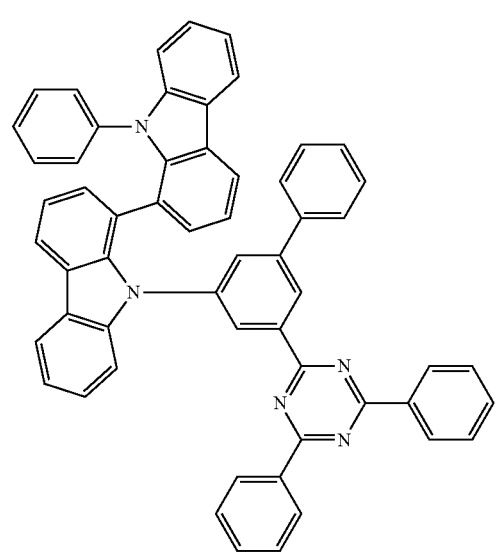
[Formula 35]
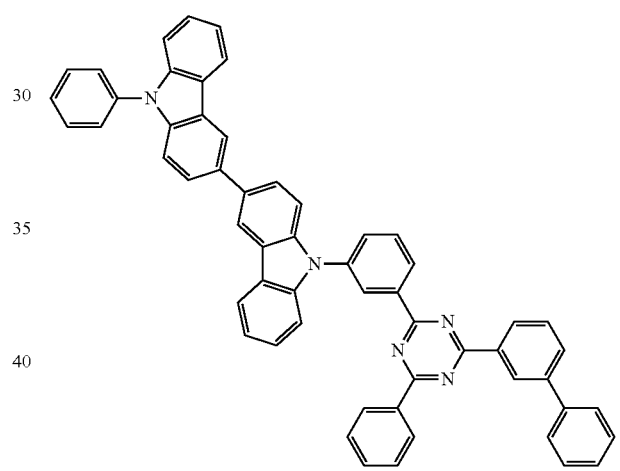
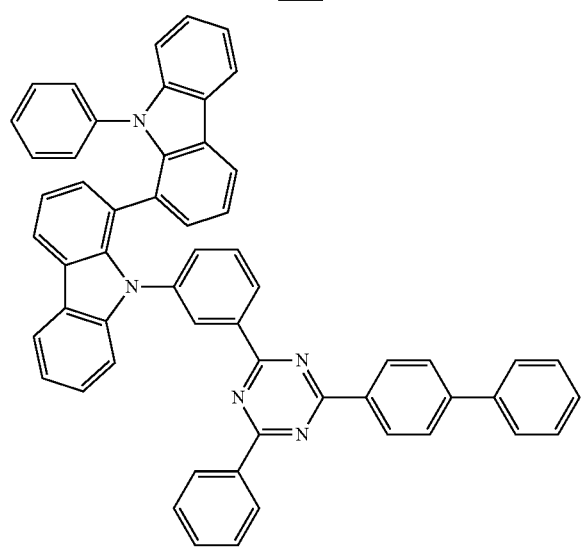

-continued
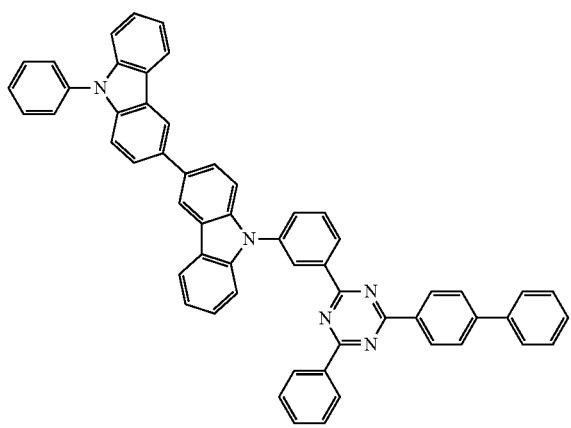
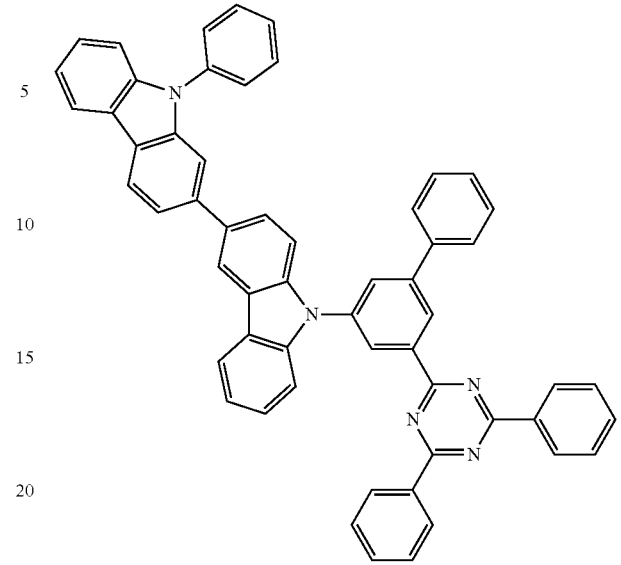
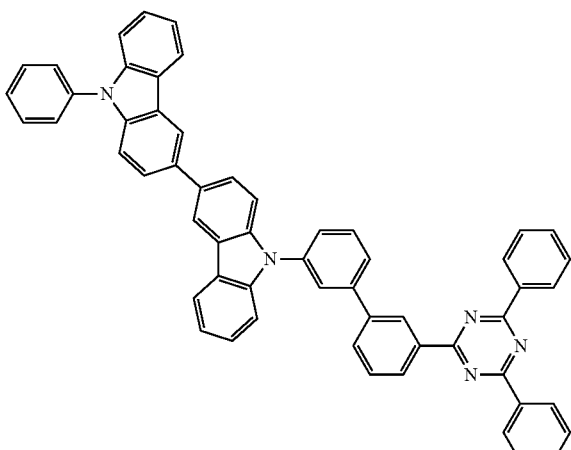
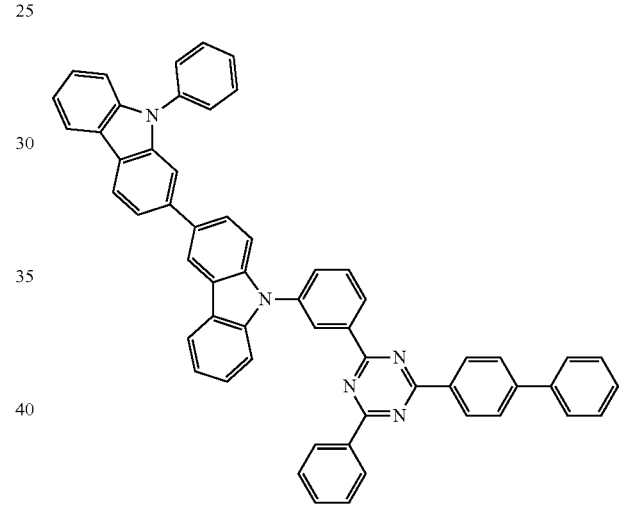
[Formula 36]
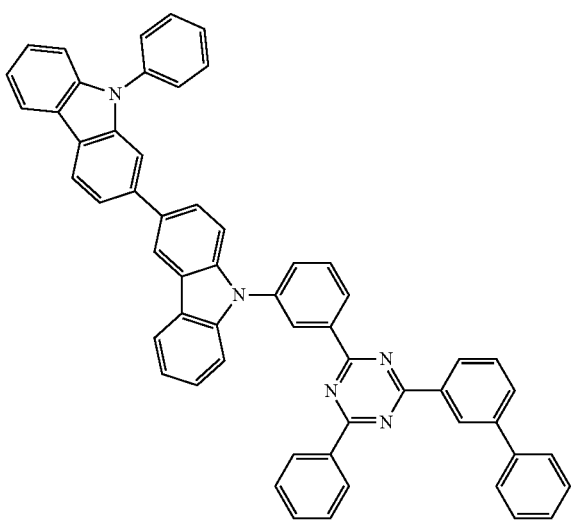
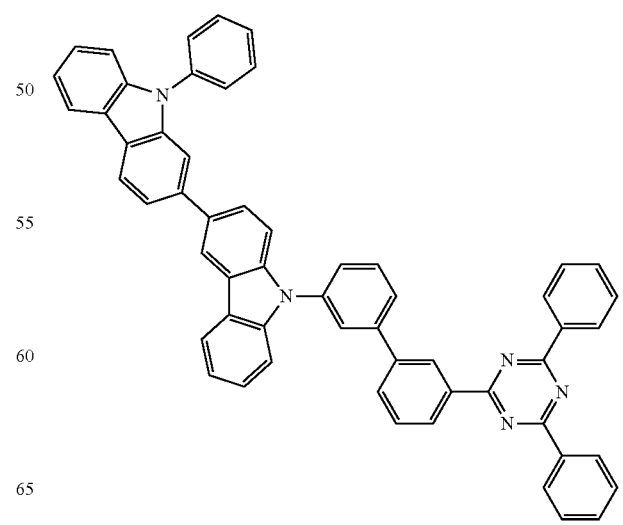

[Formula 37]
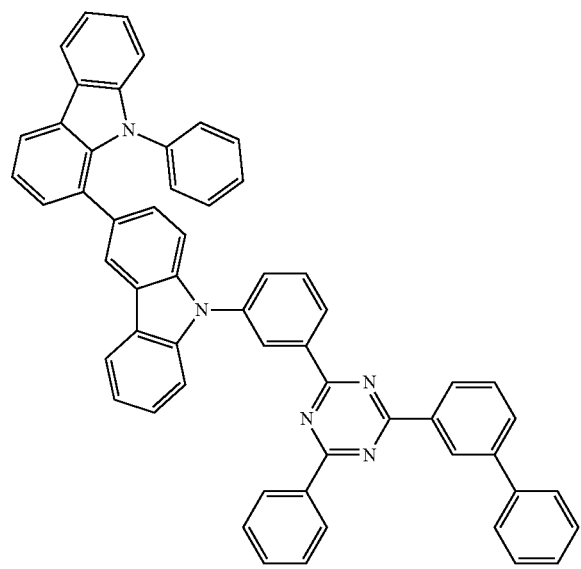
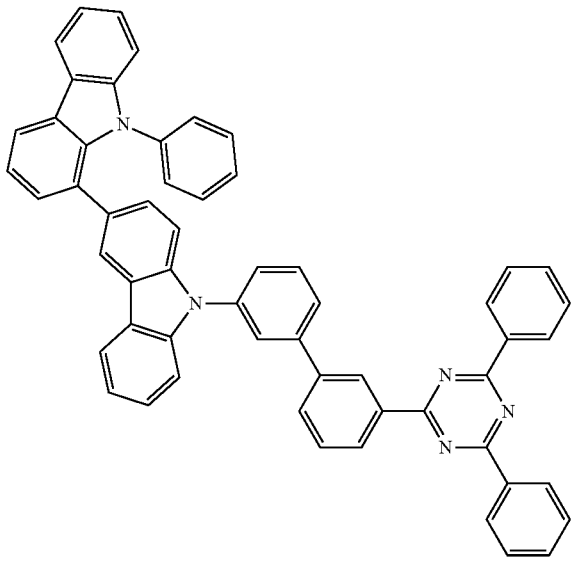
[Formula 38]
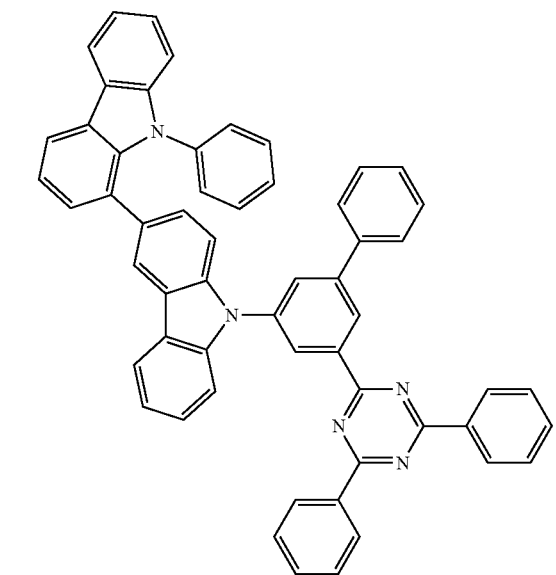
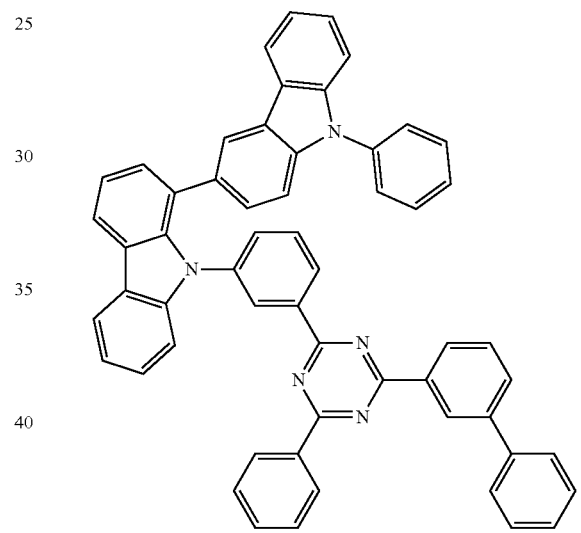
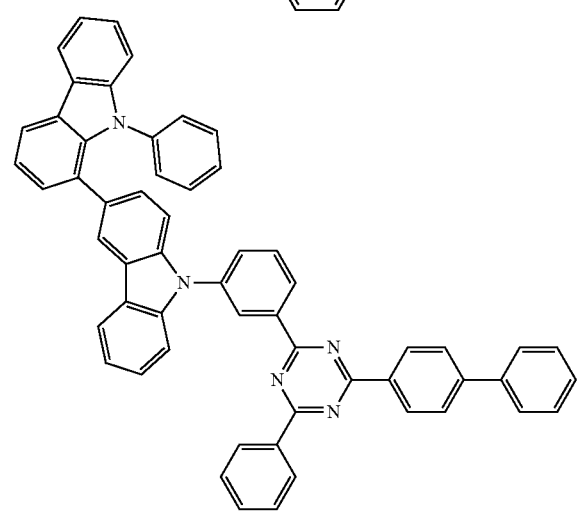
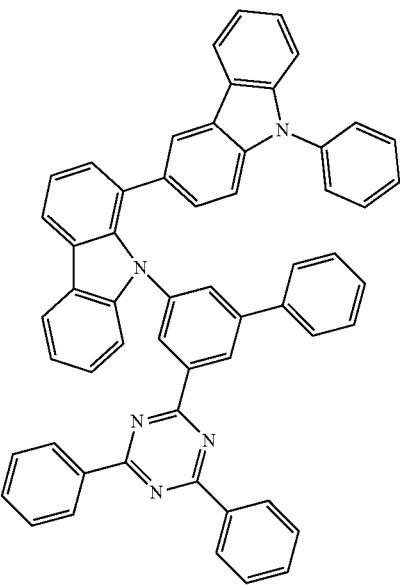

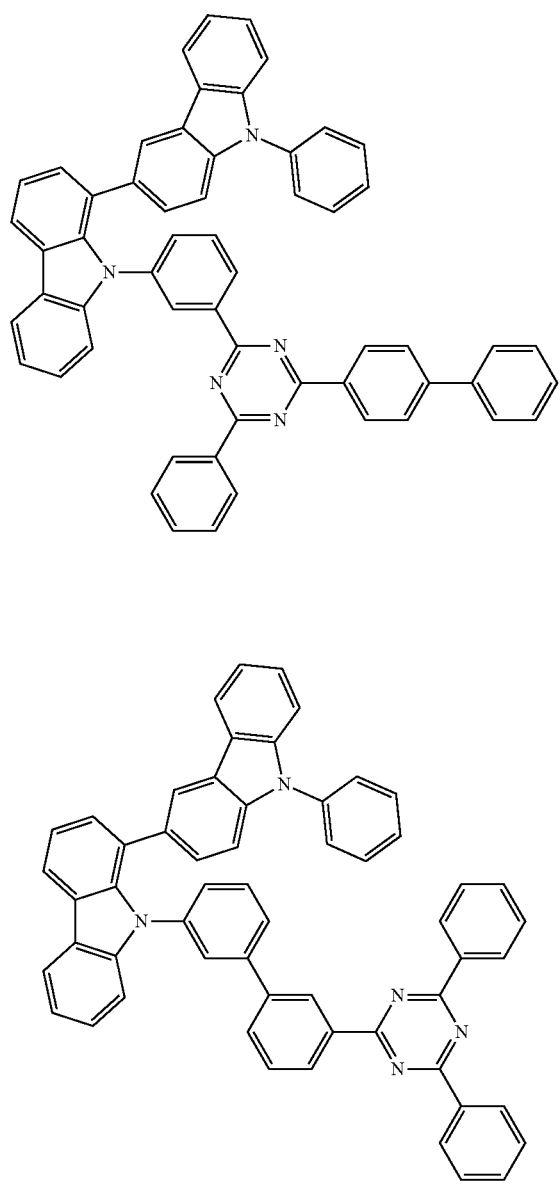
[Formula 39]
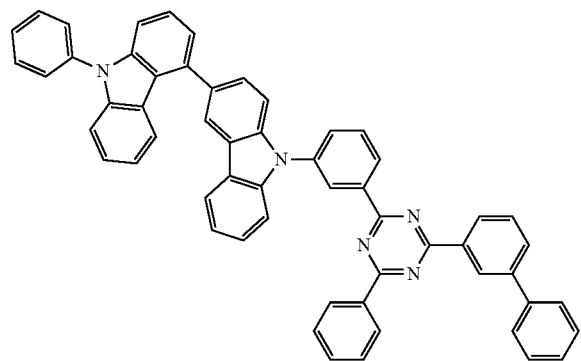
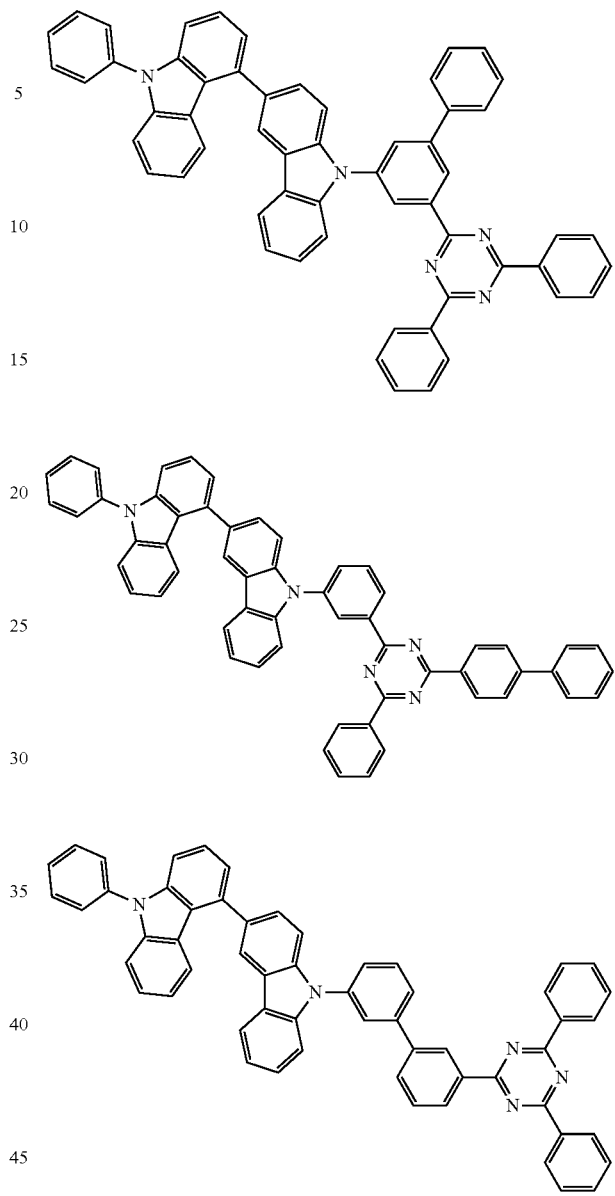
[Formula 40]
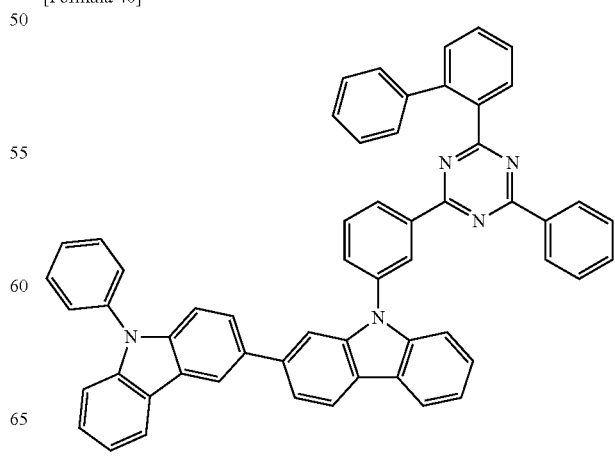

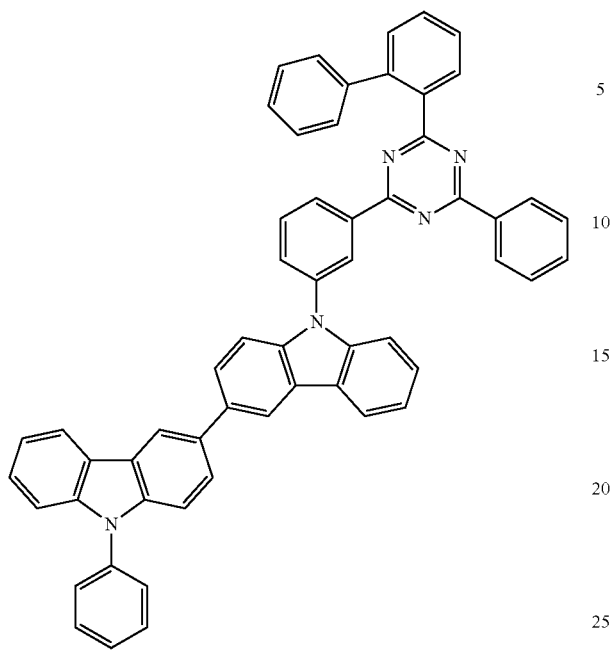
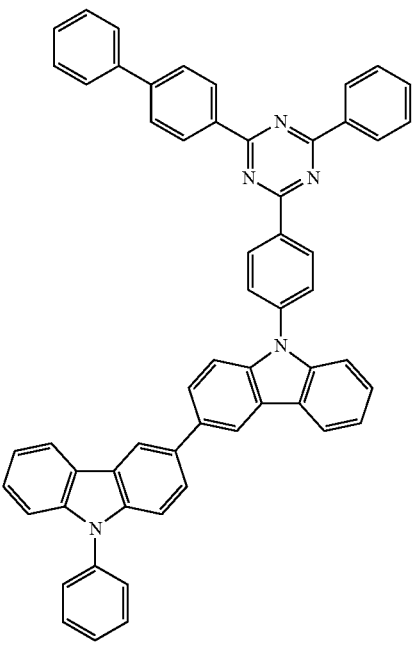
[Formula 41]
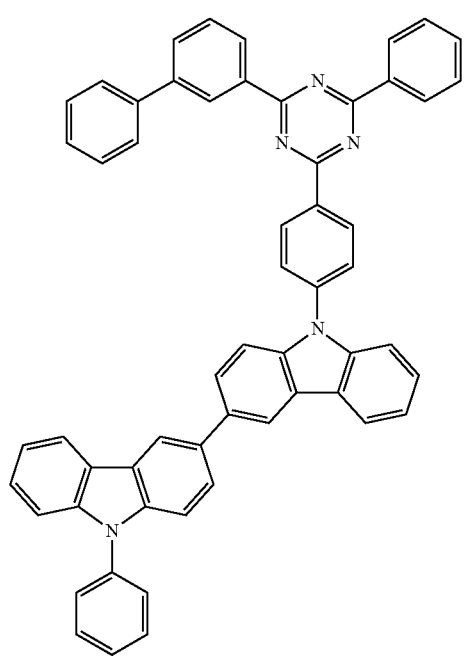
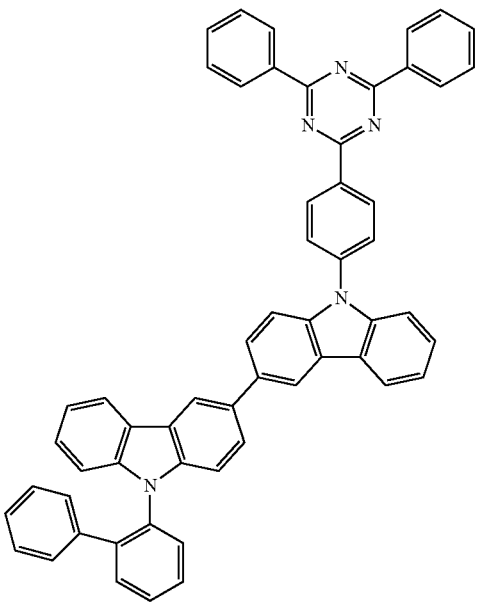

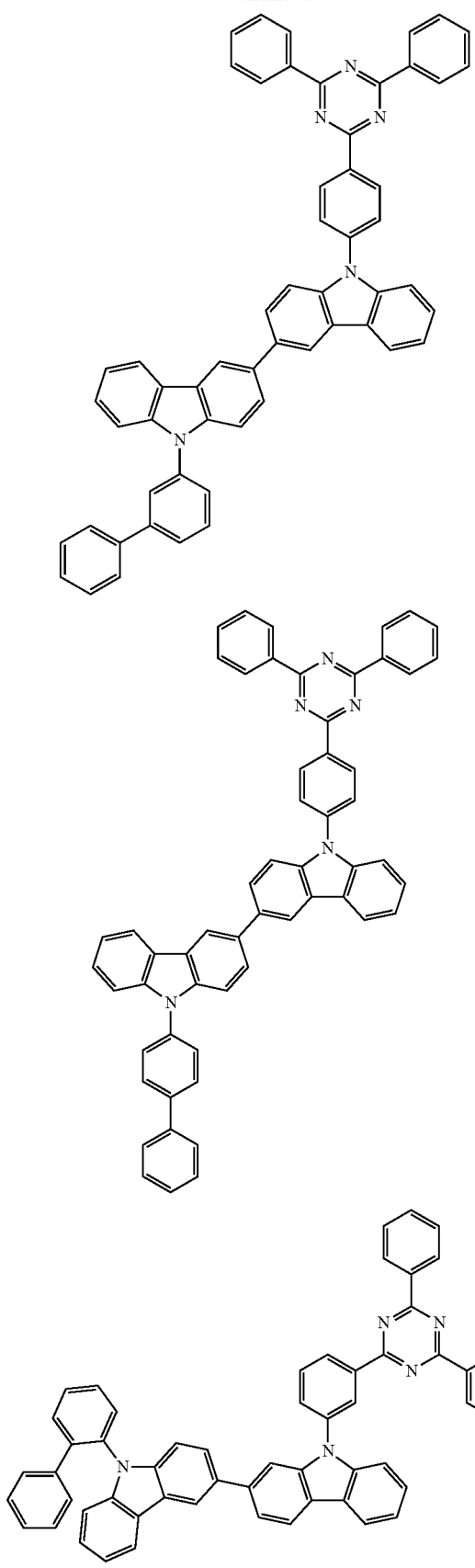
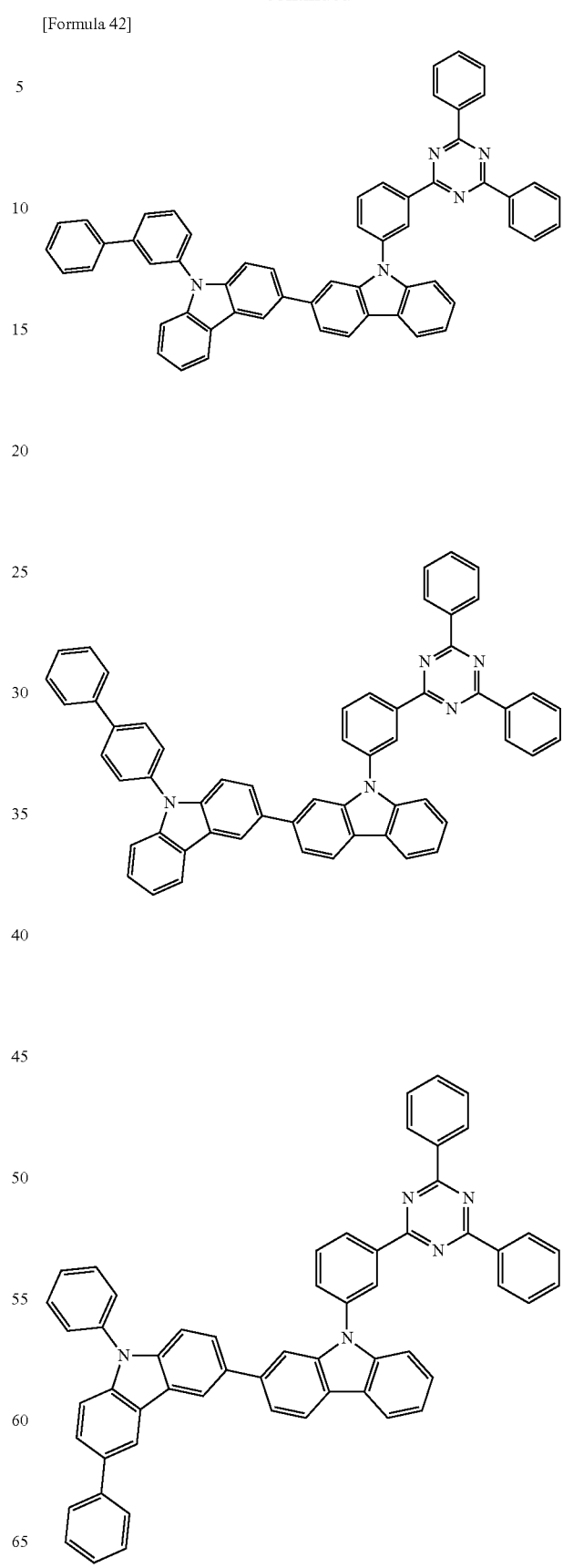
[Formula 42]

47
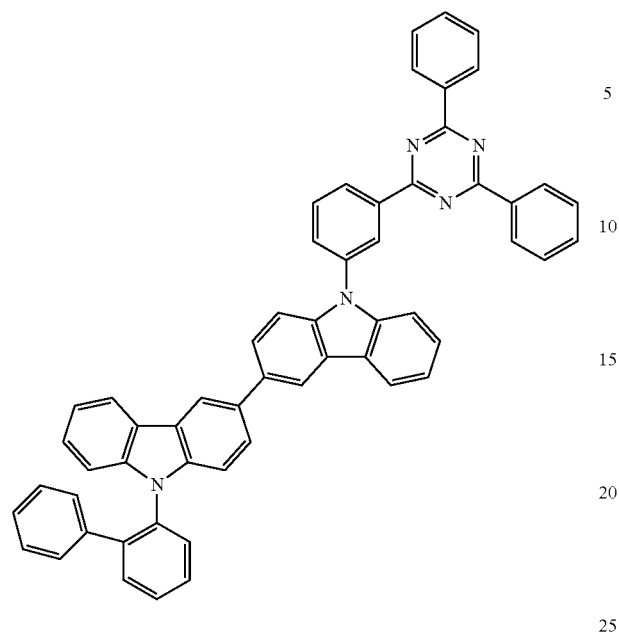
48
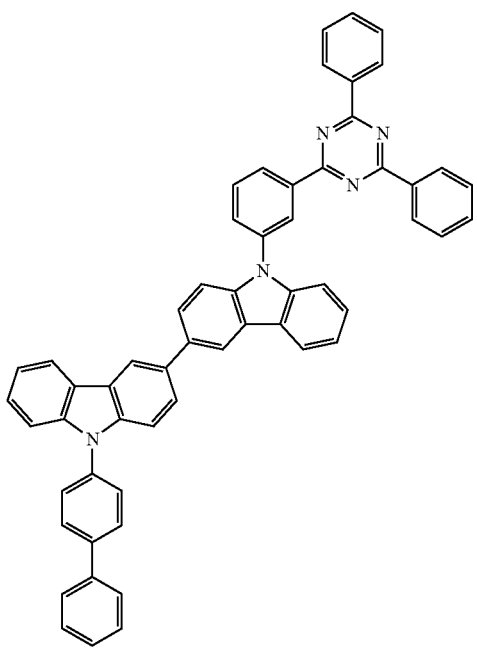
[Formula 43]
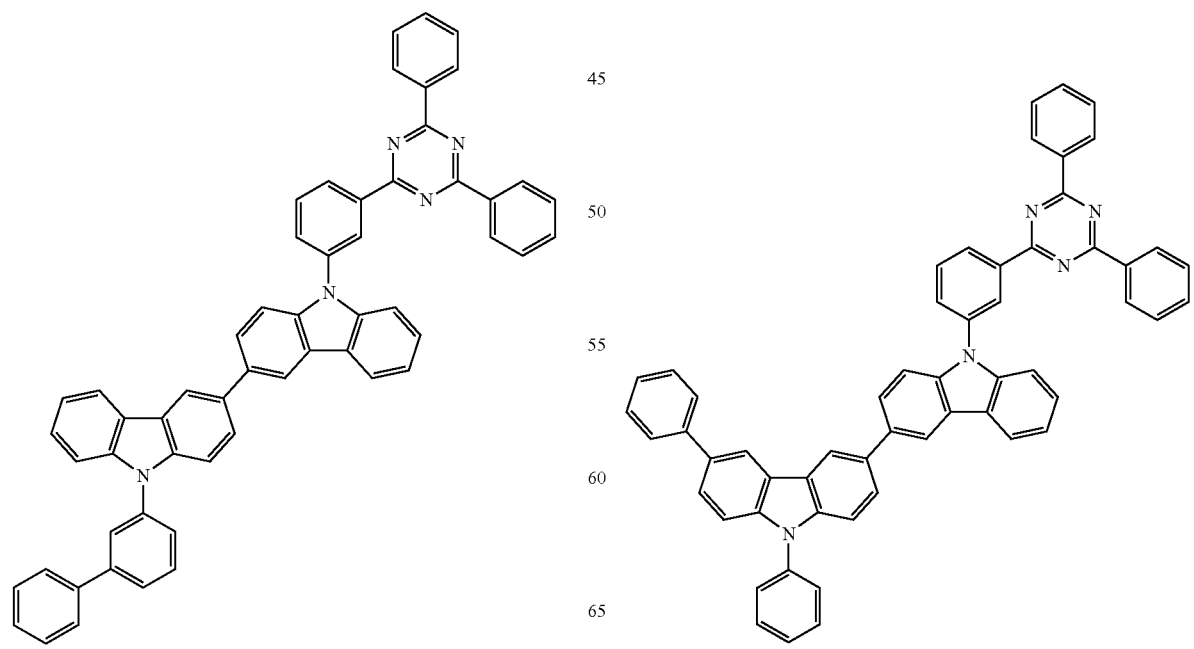

49
-continued
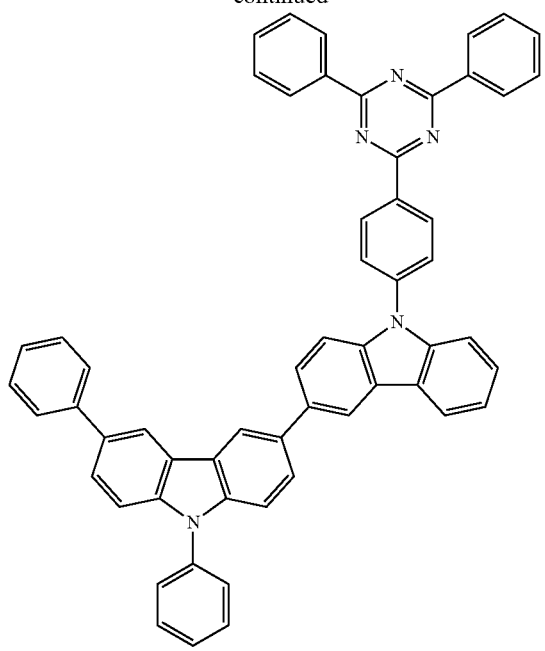
50
-continued
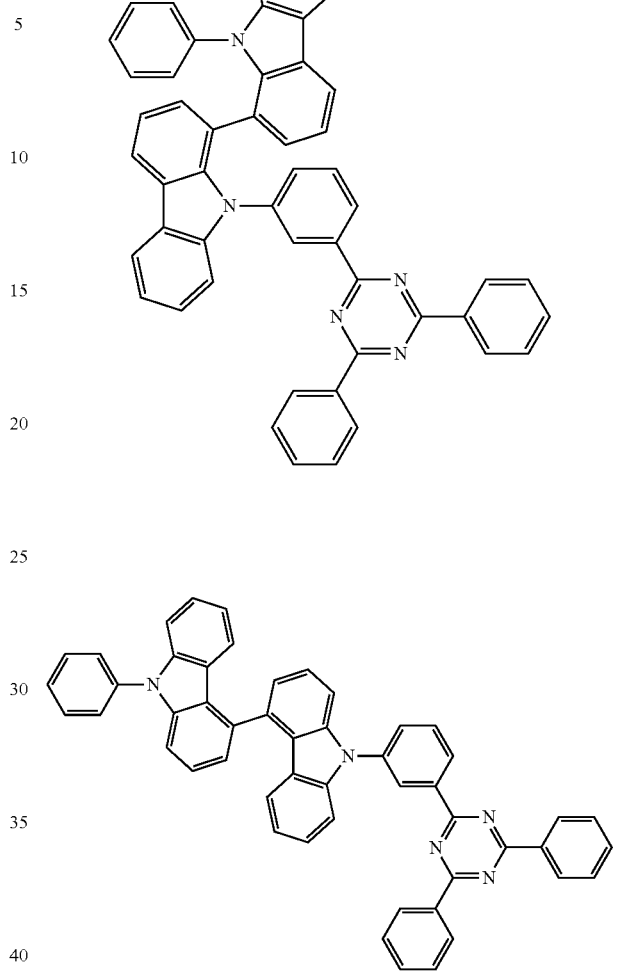
[Formula 44]
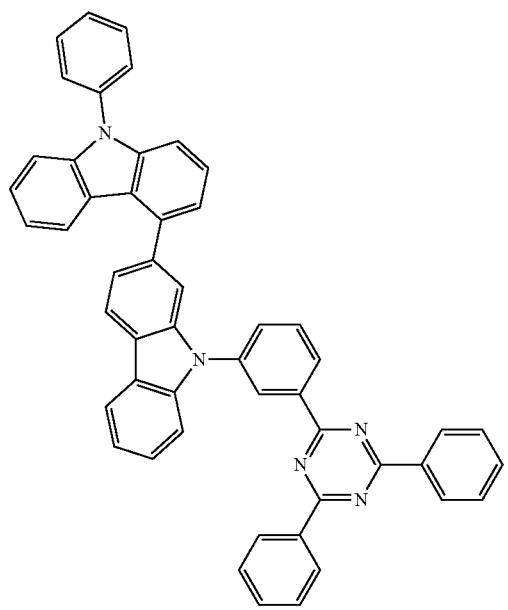
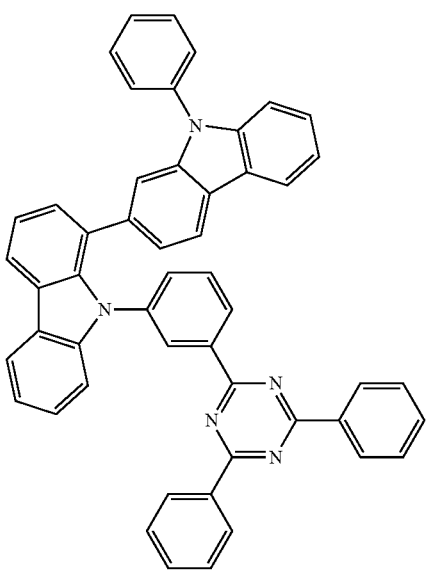

[Formula 45]
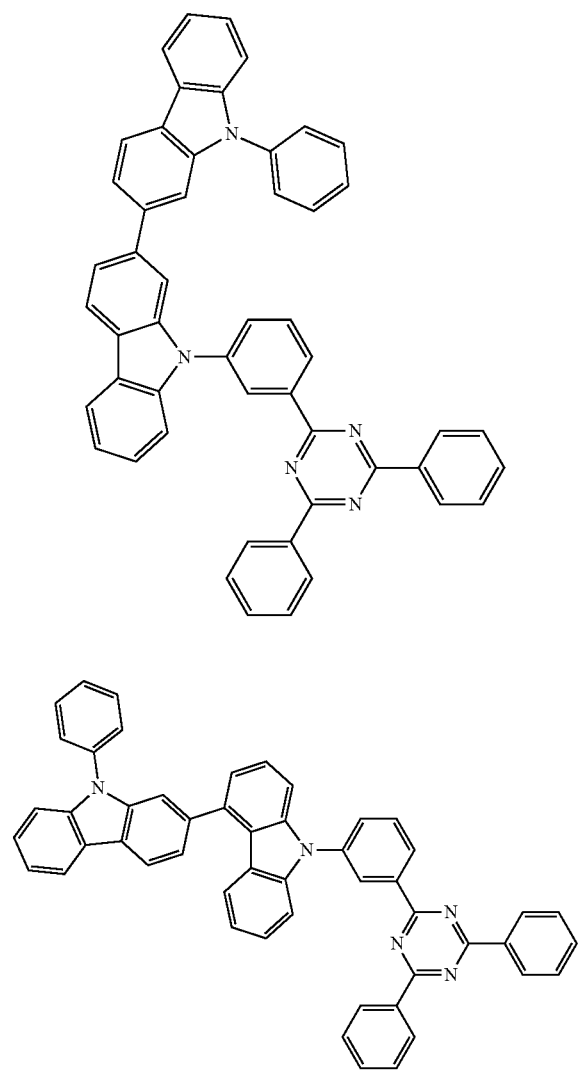
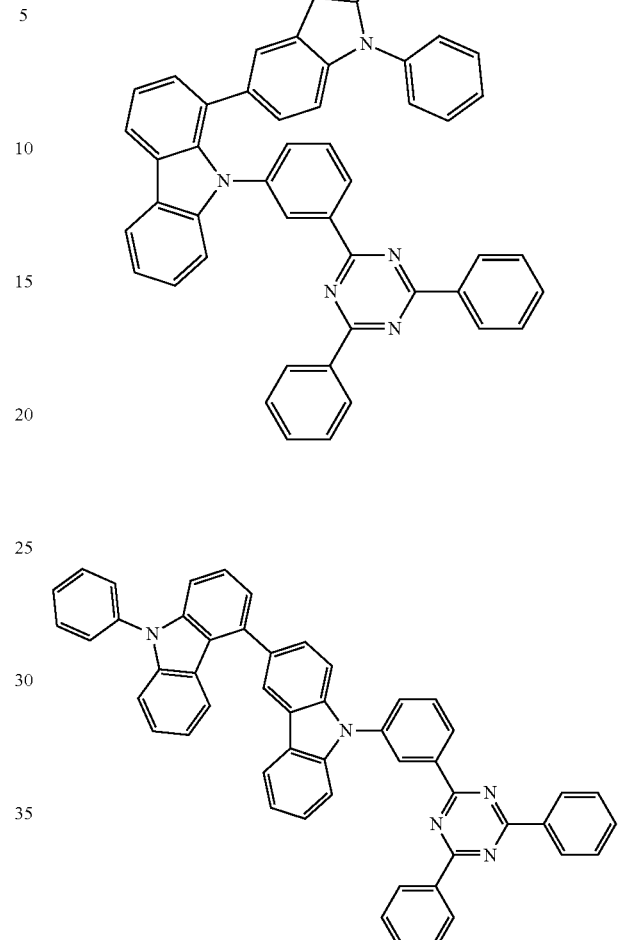
[Formula 46]
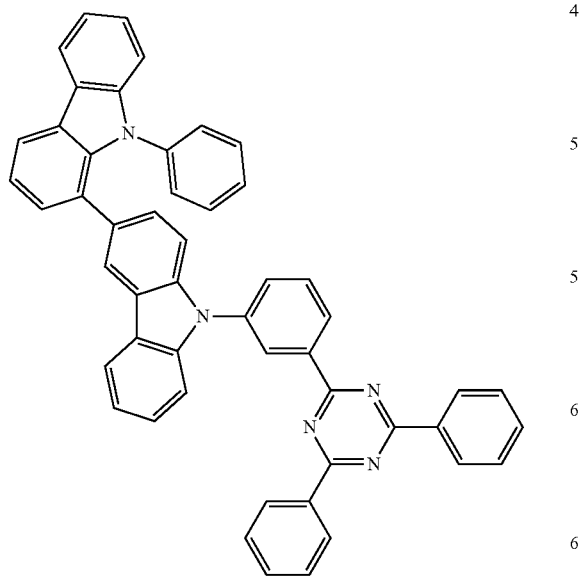
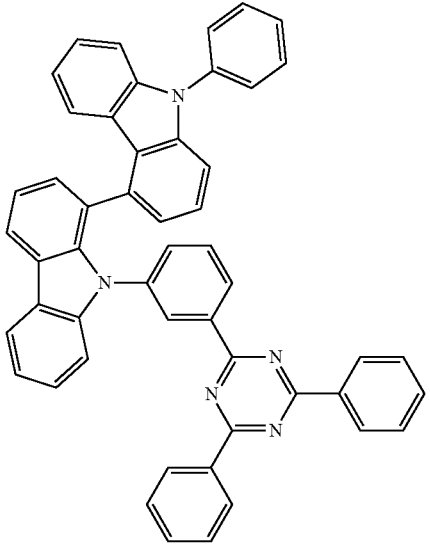

-continued

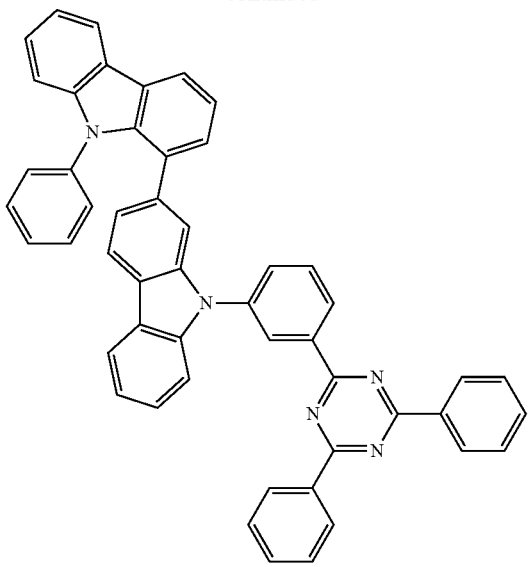

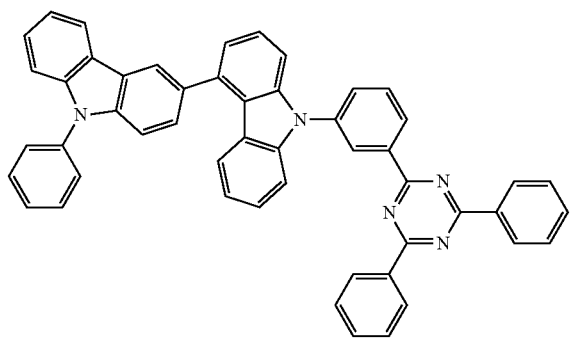

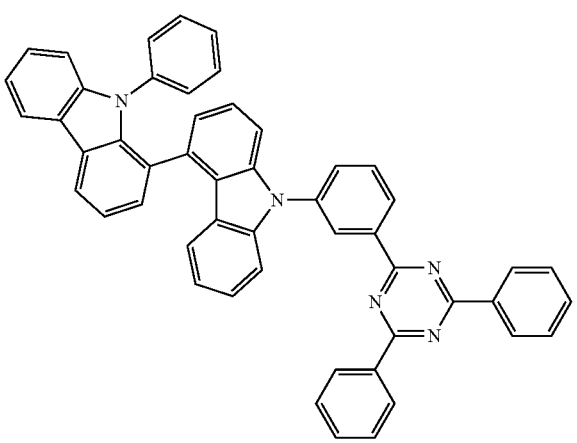

Second Compound

A second compound is represented by a formula (2) below.

[Formula 47]

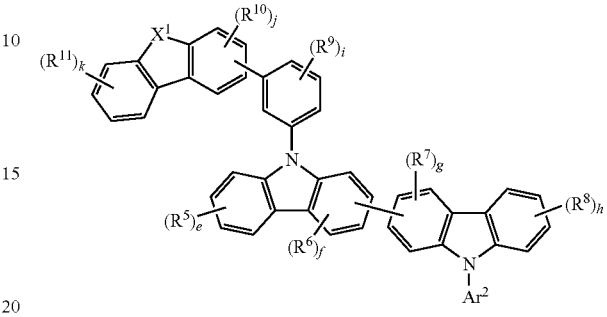

(2)

In the formula (2), $R^5$, $R^6$, $R^7$, $R_8$, $R^9$, $R^{10}$ and $R^{11}$ each independently represent a halogen atom, a substituted or unsubstituted alkyl group having 1 to 25 carbon atoms, a substituted or unsubstituted cycloalkyl group having 3 to 25 ring carbon atoms, a substituted or unsubstituted aryl group having 6 to 24 ring carbon atoms, a substituted or unsubstituted heterocyclic group having 3 to 30 ring atoms, a substituted or unsubstituted alkoxy group having 1 to 25 carbon atoms, a substituted or unsubstituted aryloxy group having 6 to 24 ring carbon atoms, a substituted or unsubstituted alkylthio group having 1 to 25 carbon atoms, a substituted or unsubstituted arylthio group having 6 to 24 ring carbon atoms, a substituted or unsubstituted aralkyl group having 7 to 25 carbon atoms, a silyl group substituted by at least one group selected from the group consisting of an alkyl group having 1 to 25 carbon atoms and an aryl group having 6 to 24 ring carbon atoms, or a cyano group.

e is 0, 1, 2, 3 or 4.
f is 0, 1, 2 or 3.
g is 0, 1, 2 or 3.
h is 0, 1, 2, 3 or 4.
i is 0, 1, 2, 3 or 4.
j is 0, 1, 2 or 3.
k is 0, 1, 2, 3 or 4.

A plurality of $R^5$ are mutually the same or different when e is 2 or more. The plurality of $R^5$ are mutually bonded to form a ring, or not bonded.

A plurality of $R^6$ are mutually the same or different when f is 2 or more. The plurality of $R^6$ are mutually bonded to form a ring, or not bonded.

A plurality of $R^7$ are mutually the same or different when g is 2 or more. The plurality of $R^7$ are mutually bonded to form a ring, or not bonded.

A plurality of $R^8$ are mutually the same or different when h is 2 or more. The plurality of $R^8$ are mutually bonded to form a ring, or not bonded.

A plurality of $R^9$ are mutually the same or different when i is 2 or more. The plurality of $R^9$ are mutually bonded to form a ring, or not bonded.

A plurality of $R^{10}$ are mutually the same or different when j is 2 or more. The plurality of $R^{10}$ are mutually bonded to form a ring, or not bonded.

A plurality of $R^{11}$ are mutually the same or different when k is 2 or more. The plurality of $R^{11}$ are mutually bonded to form a ring, or not bonded.

$Ar^2$ is a substituted or unsubstituted aryl group having 6 to 24 ring carbon atoms, or a substituted or unsubstituted heterocyclic group having 5 to 24 ring atoms.

$X^1$ is an oxygen atom or a sulfur atom.

The compound represented by the formula (2) is preferably represented by a formula (6) below.

[Formula 48]

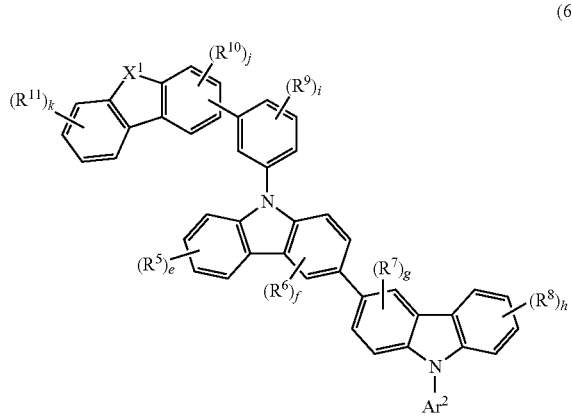

(6)

In the formula (6), $R^5$, $R^6$, $R^7$, $R^8$, $R^9$, $R^{10}$ and $R^{11}$ each independently represent a halogen atom, a substituted or unsubstituted alkyl group having 1 to 25 carbon atoms, a substituted or unsubstituted cycloalkyl group having 3 to 25 ring carbon atoms, a substituted or unsubstituted aryl group having 6 to 24 ring carbon atoms, a substituted or unsubstituted heterocyclic group having 3 to 30 ring atoms, a substituted or unsubstituted alkoxy group having 1 to 25 carbon atoms, a substituted or unsubstituted aryloxy group having 6 to 24 ring carbon atoms, a substituted or unsubstituted alkylthio group having 1 to 25 carbon atoms, a substituted or unsubstituted arylthio group having 6 to 24 ring carbon atoms, a substituted or unsubstituted aralkyl group having 7 to 25 carbon atoms, a silyl group substituted by at least one group selected from the group consisting of an alkyl group having 1 to 25 carbon atoms and an aryl group having 6 to 24 ring carbon atoms, or a cyano group.

e is 0, 1, 2, 3 or 4.
f is 0, 1, 2 or 3.
g is 0, 1, 2 or 3.
h is 0, 1, 2, 3 or 4.
i is 0, 1, 2, 3 or 4.
j is 0, 1, 2 or 3.
k is 0, 1, 2, 3 or 4.

A plurality of $R^5$ are mutually the same or different when e is 2 or more. The plurality of $R^5$ are mutually bonded to form a ring, or not bonded.

A plurality of $R^6$ are mutually the same or different when f is 2 or more. The plurality of $R^6$ are mutually bonded to form a ring, or not bonded.

A plurality of $R^7$ are mutually the same or different when g is 2 or more. The plurality of $R^7$ are mutually bonded to form a ring, or not bonded.

A plurality of $R^8$ are mutually the same or different when h is 2 or more. The plurality of $R^8$ are mutually bonded to form a ring, or not bonded.

A plurality of $R^9$ are mutually the same or different when i is 2 or more. The plurality of $R^9$ are mutually bonded to form a ring, or not bonded.

A plurality of $R^{10}$ are mutually the same or different when j is 2 or more. The plurality of $R^{10}$ are mutually bonded to form a ring, or not bonded.

A plurality of $R^{11}$ are mutually the same or different when k is 2 or more. The plurality of $R^{11}$ are mutually bonded to form a ring, or not bonded.

$Ar^2$ is a substituted or unsubstituted aryl group having 6 to 24 ring carbon atoms, or a substituted or unsubstituted heterocyclic group having 5 to 24 ring atoms.

$X^1$ is an oxygen atom or a sulfur atom.

In the second compound, $R^5$, $R^6$, $R^7$, $R^8$, $R^9$, $R^{10}$ and $R^{11}$ are preferably each independently a substituted or unsubstituted aryl group having 6 to 24 ring carbon atoms or a substituted or unsubstituted heterocyclic group having 3 to 30 ring atoms, more preferably a substituted or unsubstituted aryl group having 6 to 24 ring carbon atoms.

In the second compound, $Ar^2$ is preferably a substituted or unsubstituted aryl group having 6 to 24 ring carbon atoms.

When $Ar^2$ has a substituent, the substituent is preferably an unsubstituted aryl group having 6 to 24 ring carbon atoms.

In the second compound, $X^1$ is preferably a sulfur atom.

In the second compound, e, f, g, h, i, j and k are preferably 0.

When e, f, g, h, i, j and k are 0 in the formula (2), the second compound is represented by a formula (2A) below.

[Formula 49]

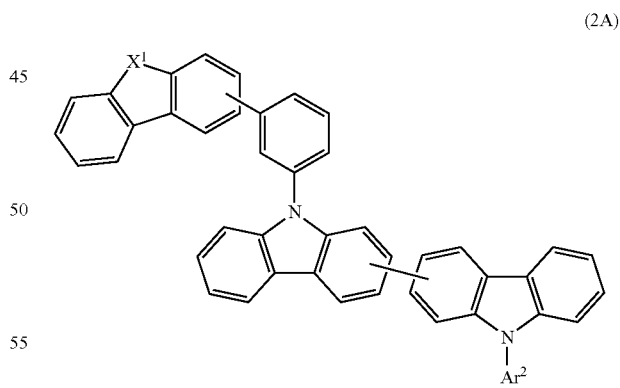

(2A)

In the formula (2A), $Ar^2$ is a substituted or unsubstituted aryl group having 6 to 24 ring carbon atoms, or a substituted or unsubstituted heterocyclic group having 5 to 24 ring atoms, $X^1$ is an oxygen atom or a sulfur atom.

When e, f, g, h, i, j and k are 0 in the formula (6), the second compound is represented by a formula (6A) below.

[Formula 50]

(6A)

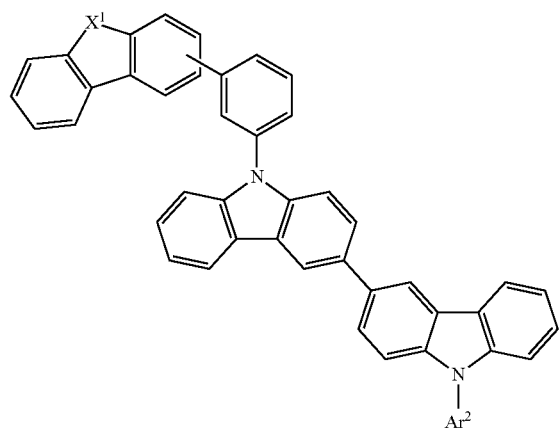

In the formula (6A), $Ar^2$ is a substituted or unsubstituted aryl group having 6 to 24 ring carbon atoms, or a substituted or unsubstituted heterocyclic group having 5 to 24 ring atoms.

$X^1$ is an oxygen atom or a sulfur atom.

In the second compound, a substituent represented by a formula (7) is preferably a substituent represented by a formula (7A) or (7B).

[Formula 51]

(7)

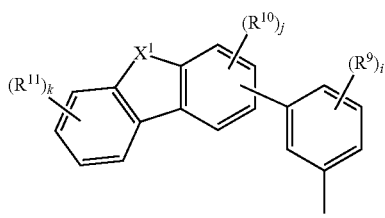

[Formula 52]

(7A)

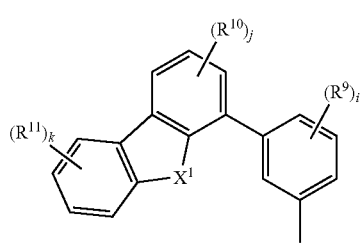

[Formula 53]

(7B)

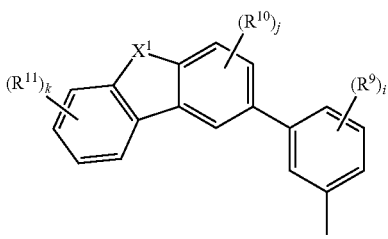

In the formulae (7), (7A) and (7B), $R^9$, $R^{10}$ and $R^{11}$ each independently represent a halogen atom, a substituted or unsubstituted alkyl group having 1 to 25 carbon atoms, a substituted or unsubstituted cycloalkyl group having 3 to 25 ring carbon atoms, a substituted or unsubstituted aryl group having 6 to 24 ring carbon atoms, a substituted or unsubstituted heterocyclic group having 3 to 30 ring atoms, a substituted or unsubstituted alkoxy group having 1 to 25 carbon atoms, a substituted or unsubstituted aryloxy group having 6 to 24 ring carbon atoms, a substituted or unsubstituted alkylthio group having 1 to 25 carbon atoms, a substituted or unsubstituted arylthio group having 6 to 24 ring carbon atoms, a substituted or unsubstituted aralkyl group having 7 to 25 carbon atoms, a silyl group substituted by at least one group selected from the group consisting of an alkyl group having 1 to 25 carbon atoms and an aryl group having 6 to 24 ring carbon atoms, or a cyano group.

i is 0, 1, 2, 3 or 4.
j is 0, 1, 2 or 3.
k is 0, 1, 2, 3 or 4.

A plurality of $R^9$ are mutually the same or different when i is 2 or more. The plurality of $R^9$ are mutually bonded to form a ring, or not bonded.

A plurality of $R^{10}$ are mutually the same or different when j is 2 or more. The plurality of $R^{10}$ are mutually bonded to form a ring, or not bonded.

A plurality of $R^{11}$ are mutually the same or different when k is 2 or more. The plurality of $R^{11}$ are mutually bonded to form a ring, or not bonded.

$X^1$ is an oxygen atom or a sulfur atom.

The compound represented by the formula (6A) is preferably represented by a formula (6A-1) or (6A-2).

[Formula 54]

(6A-1)

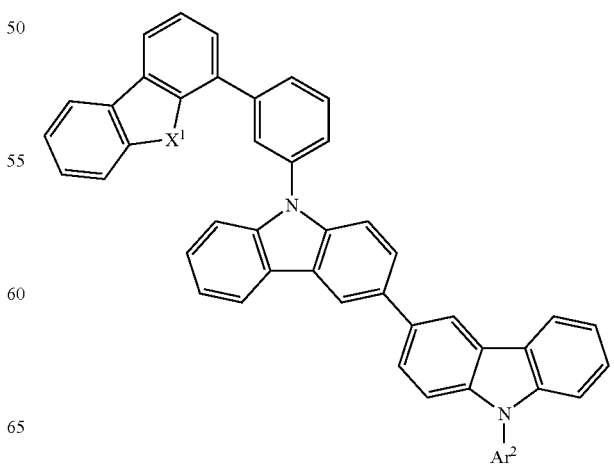

[Formula 55]

(6A-2)

In the formulae (6A-1) and (6A-2), Ar² is a substituted or unsubstituted aryl group having 6 to 24 ring carbon atoms, or a substituted or unsubstituted heterocyclic group having 5 to 24 ring atoms.

X¹ is an oxygen atom or a sulfur atom.

The second compound can be manufactured by a combination of known methods (e.g., International Publication No. WO2013/084885).

Examples of the second compound according to the exemplary embodiment are given below. It should be noted that the second compound in the exemplary embodiment are by no means limited to the examples below.

[Formula 56]

[Formula 57]

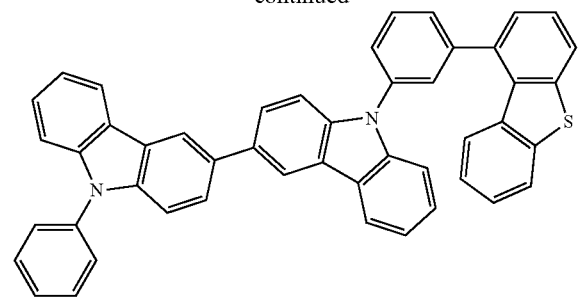
[Formula 58]
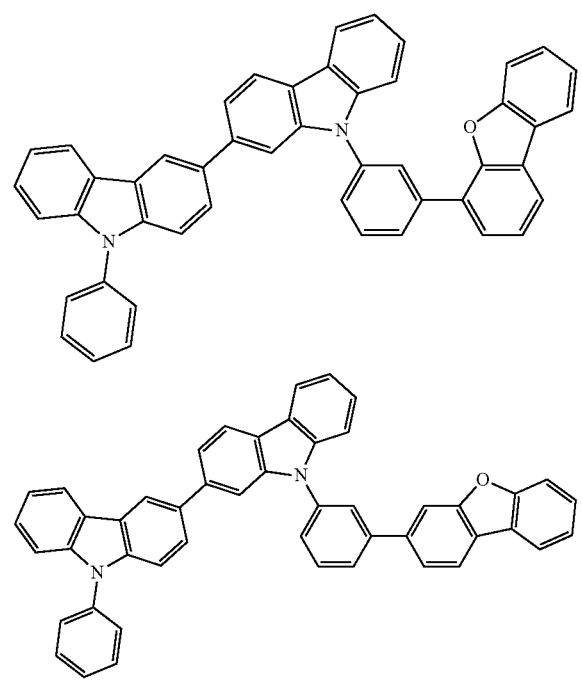
[Formula 59]
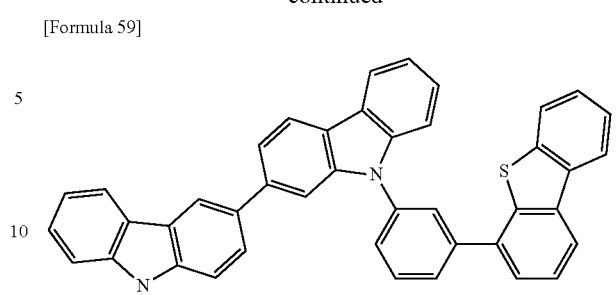
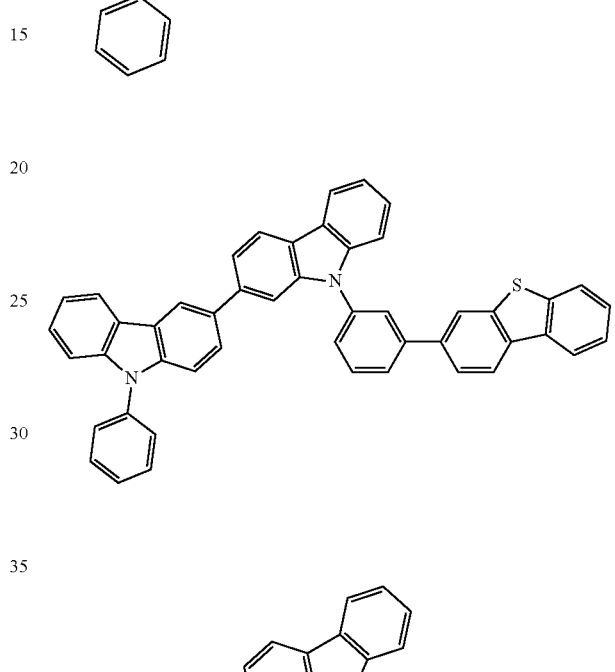
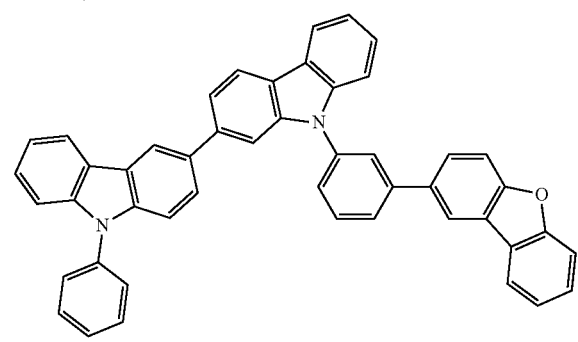
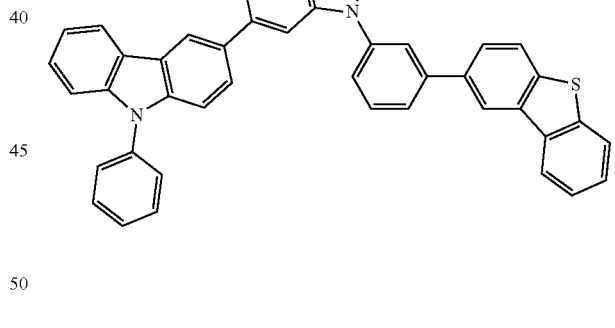
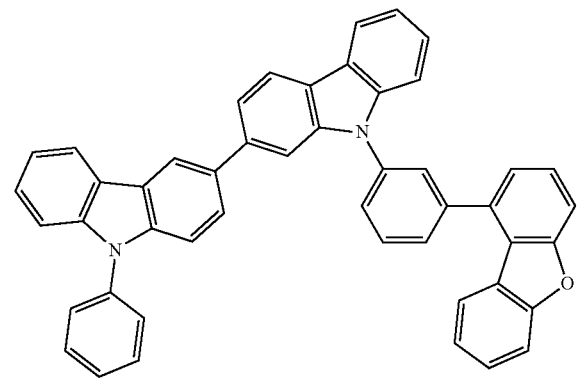
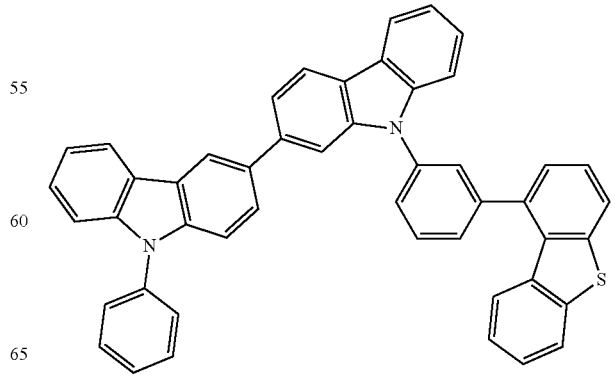

[Formula 60]
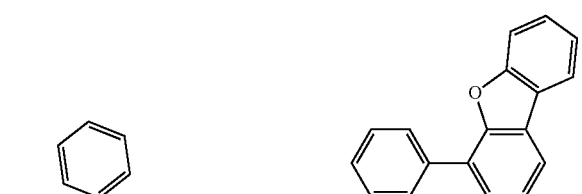
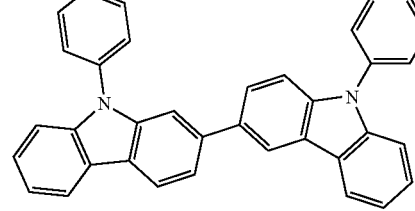
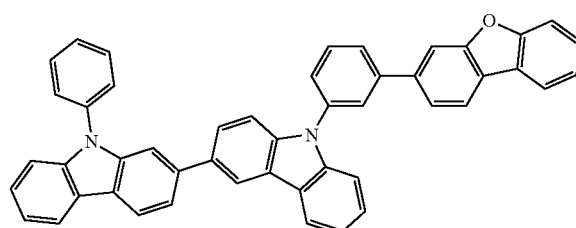
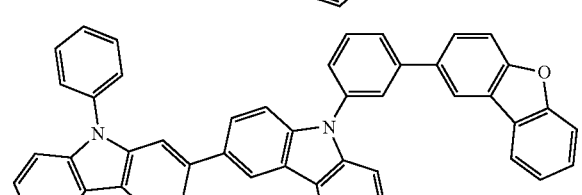
[Formula 61]
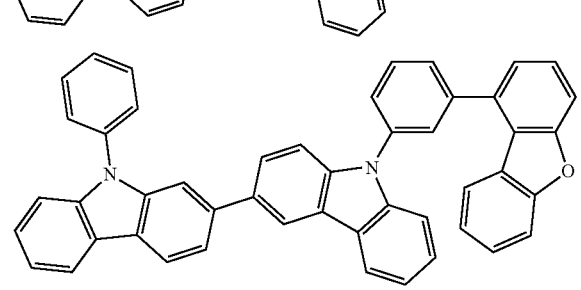
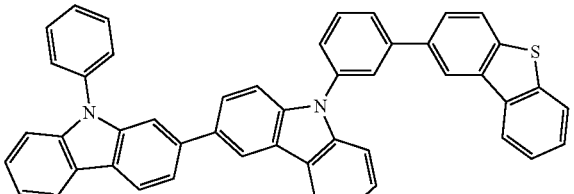
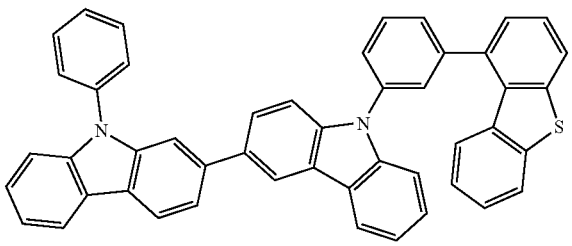
[Formula 62]
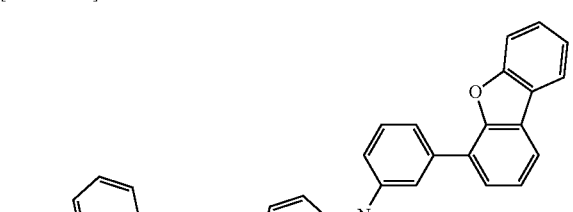
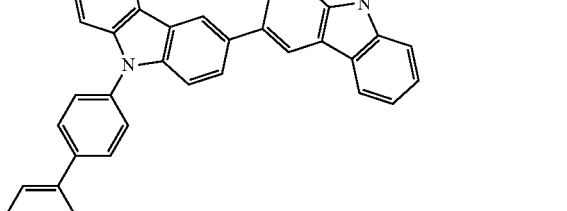
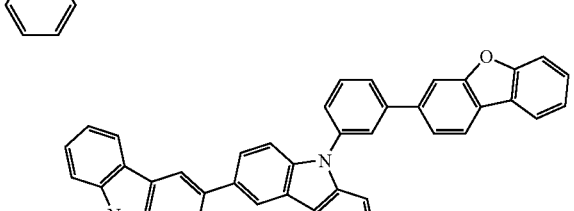
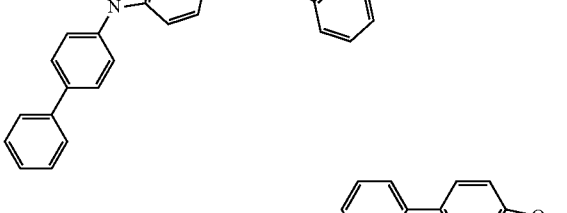

65
-continued
66
-continued
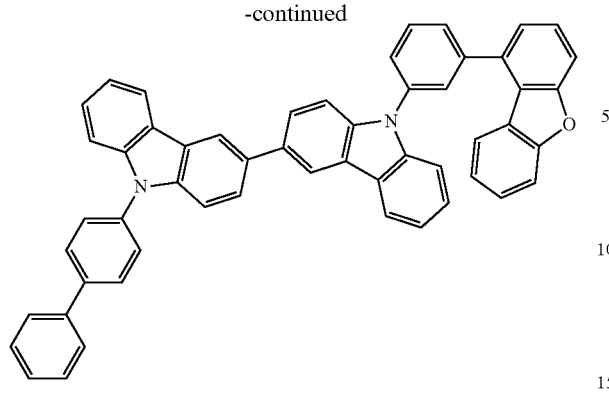
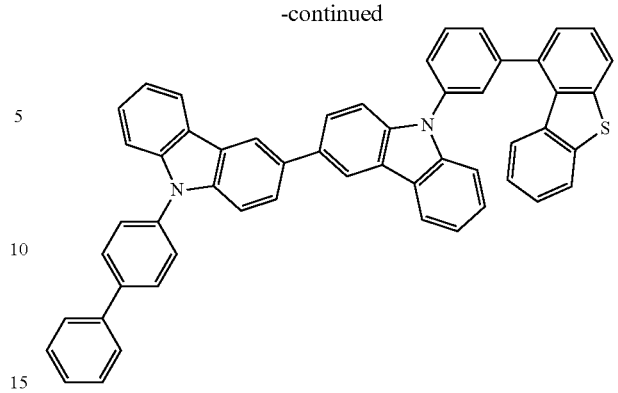
[Formula 63]
[Formula 64]
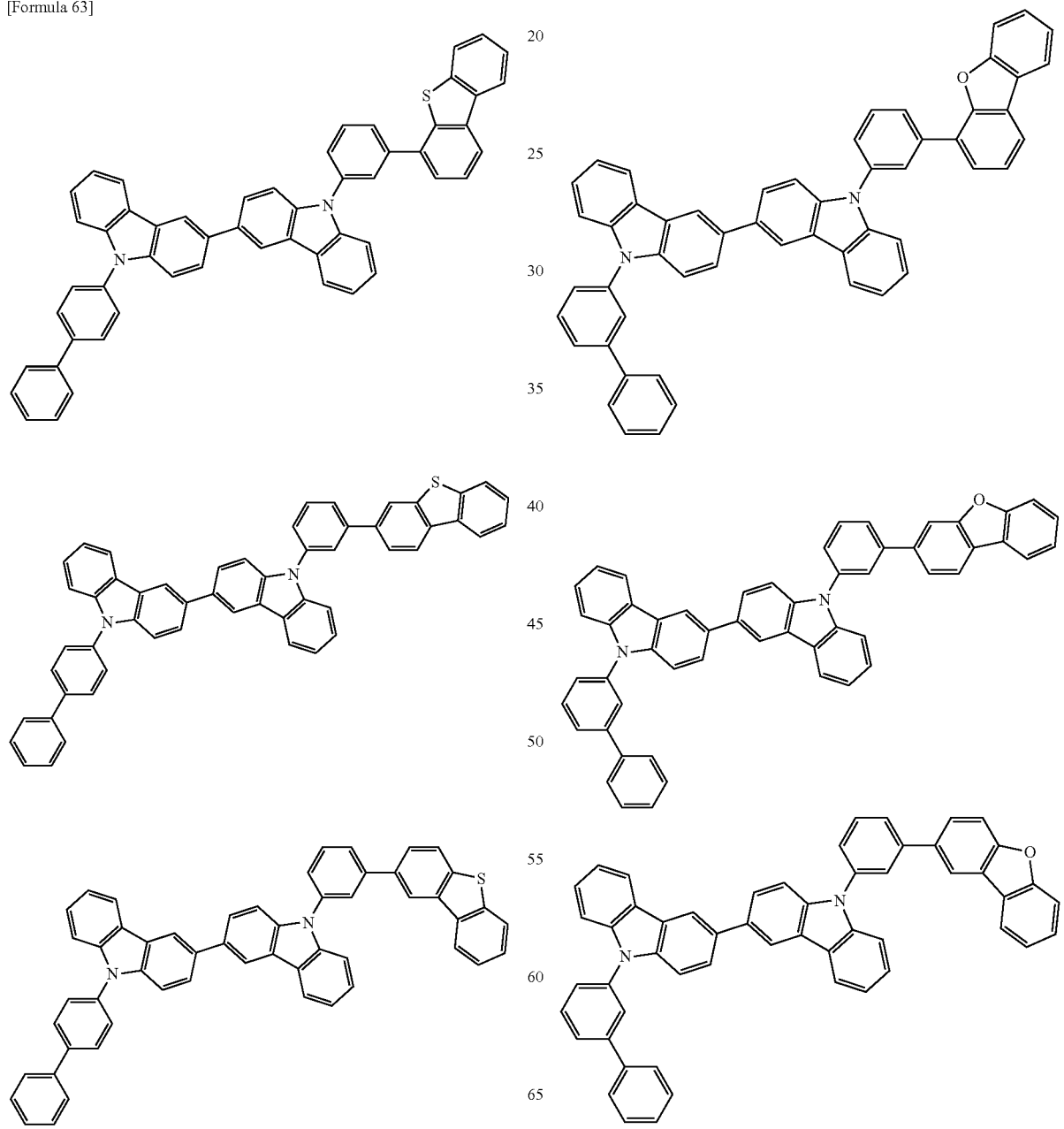

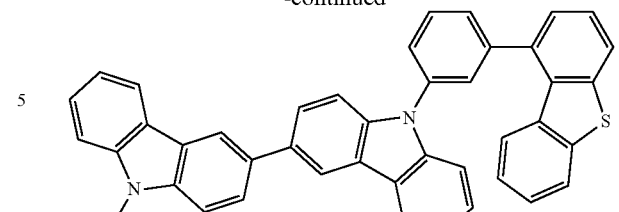
[Formula 65]
[Formula 66]
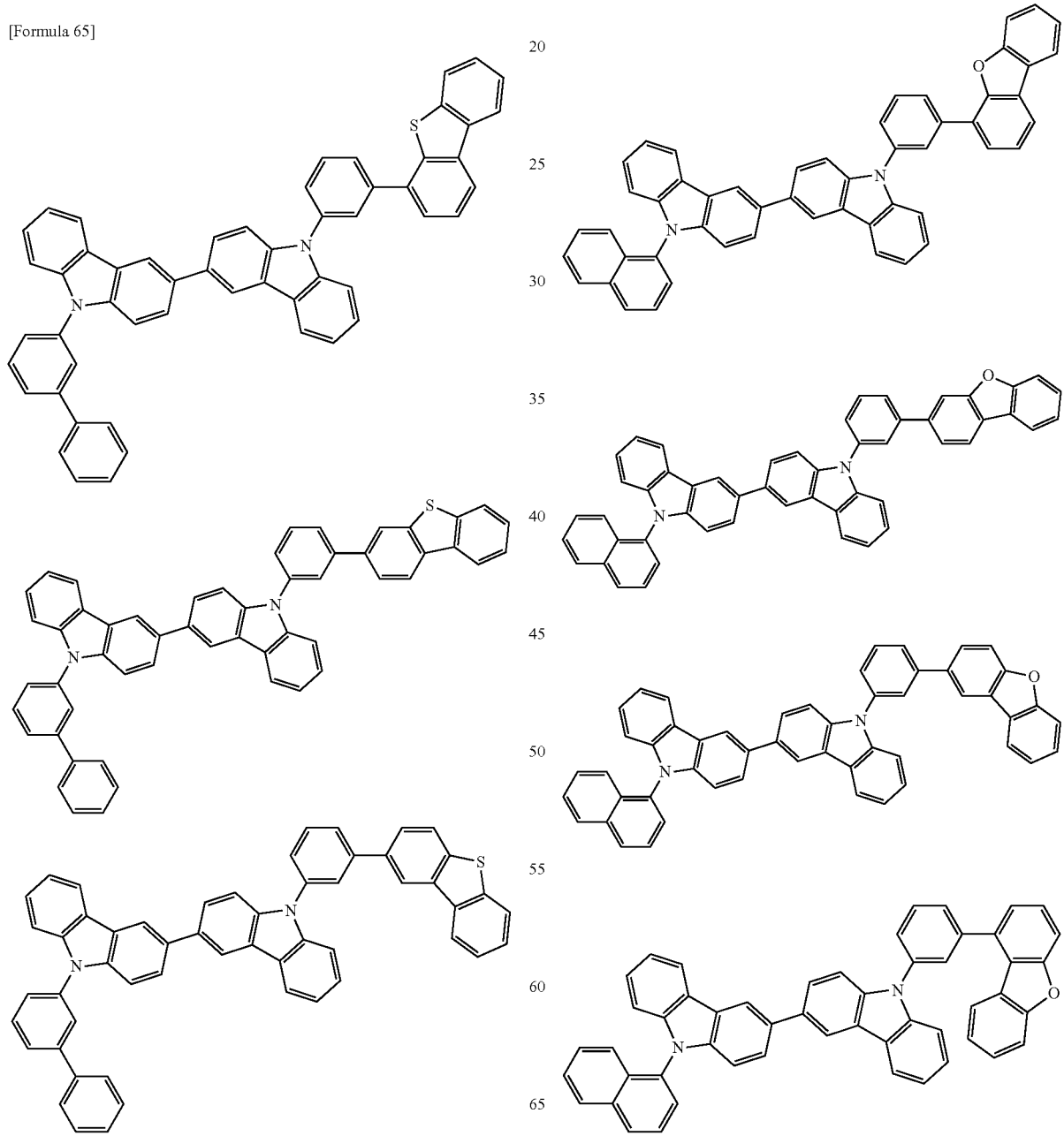

[Formula 67]
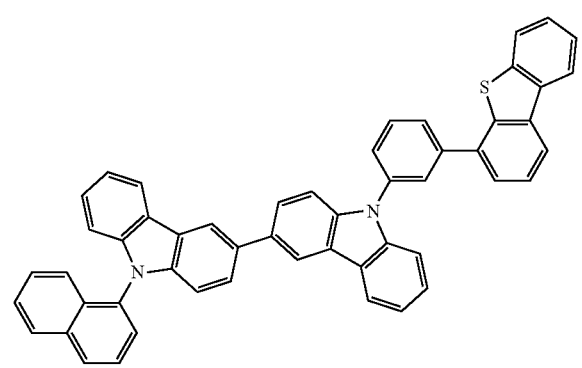
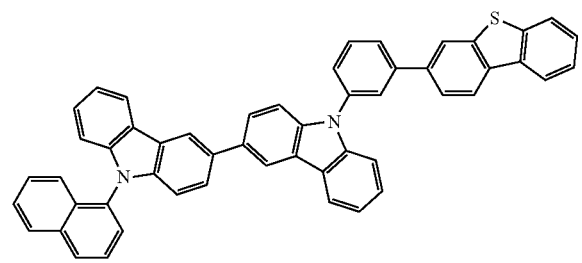
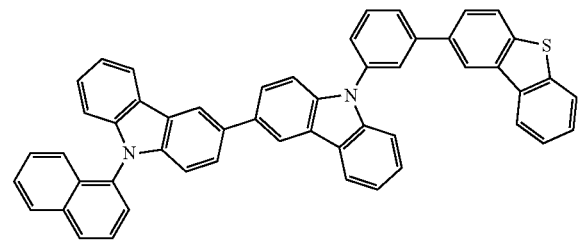
[Formula 68]
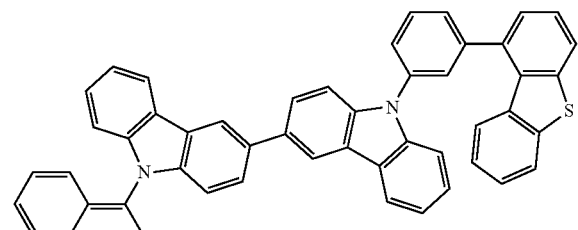
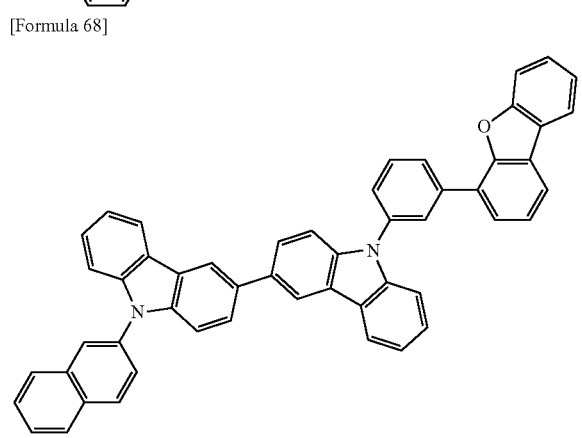
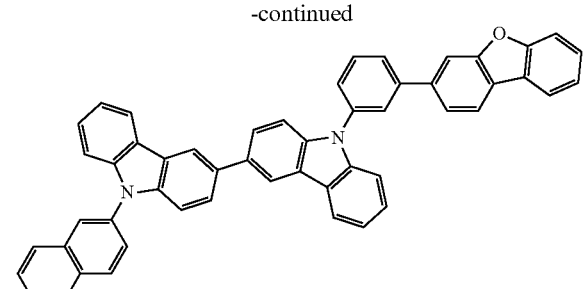
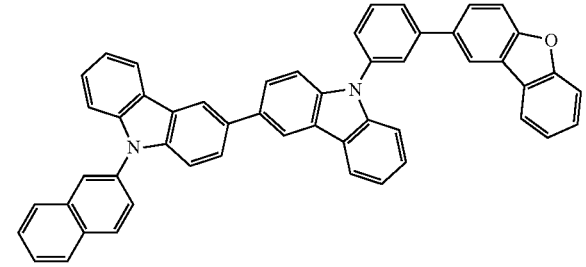
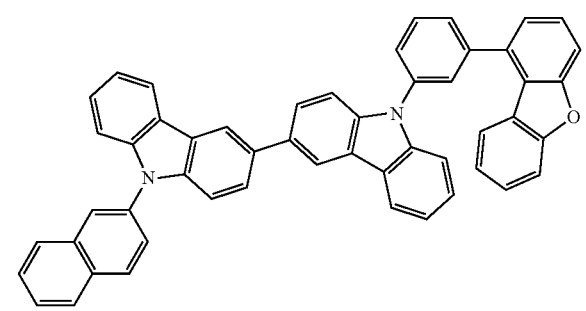
[Formula 69]
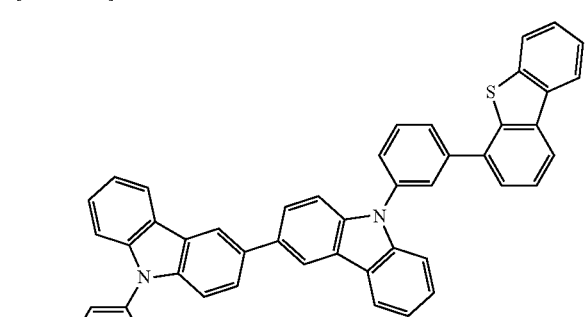
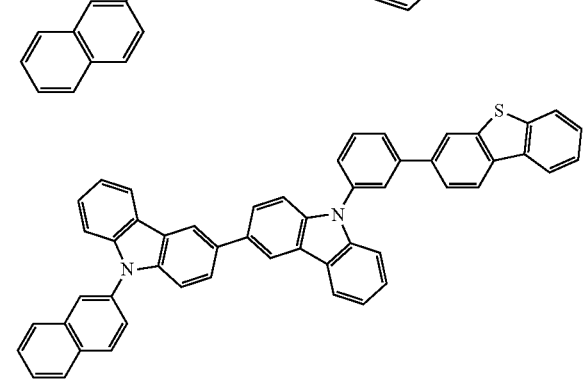

-continued
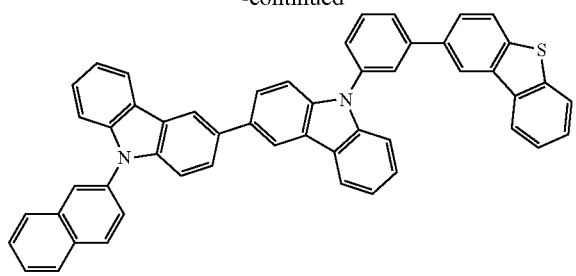
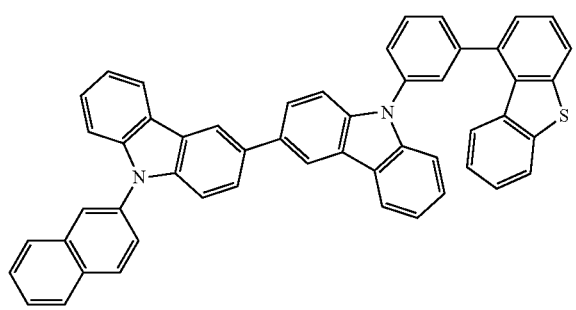
[Formula 70]
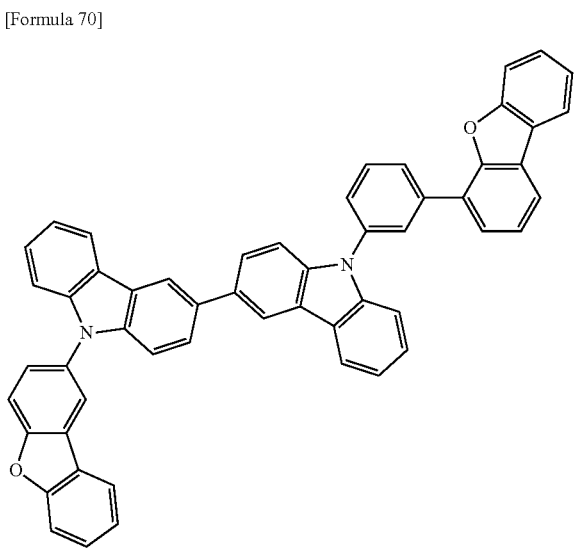
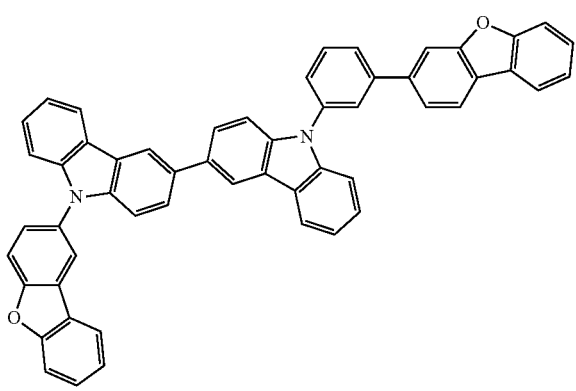
-continued
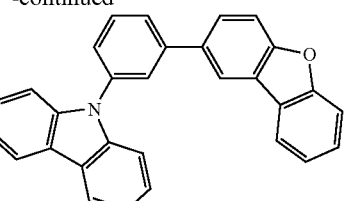
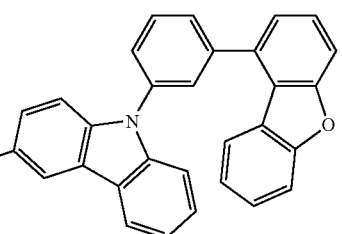
[Formula 71]
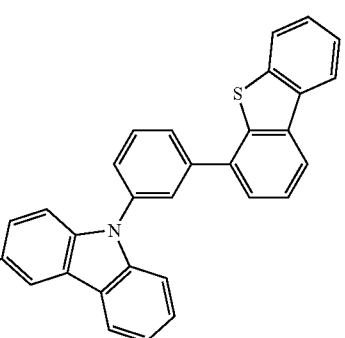
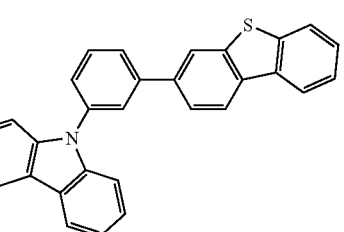

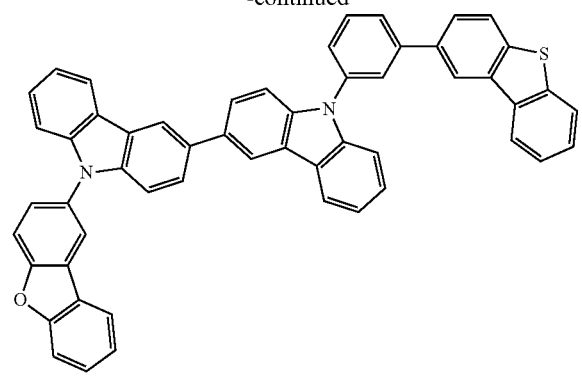
[Formula 72]
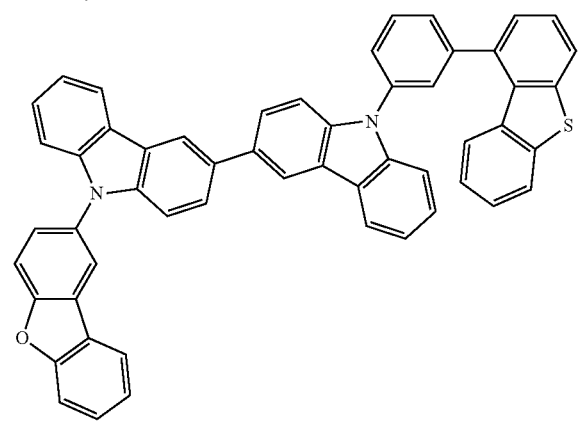
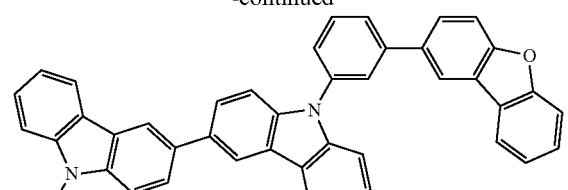
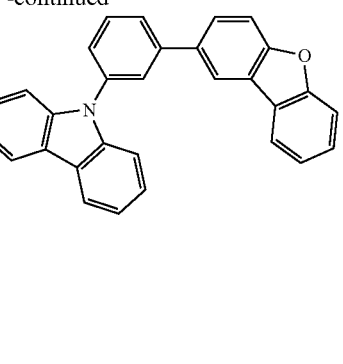
[Formula 73]
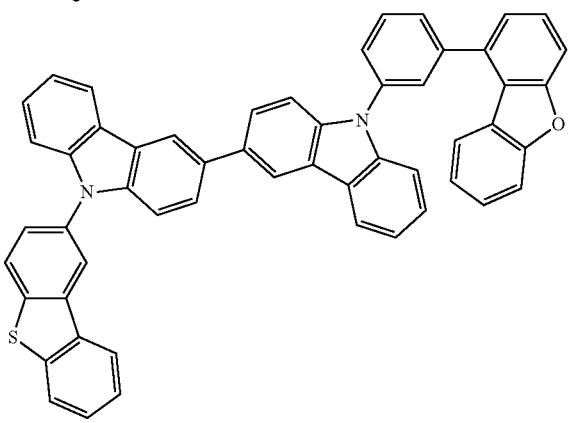
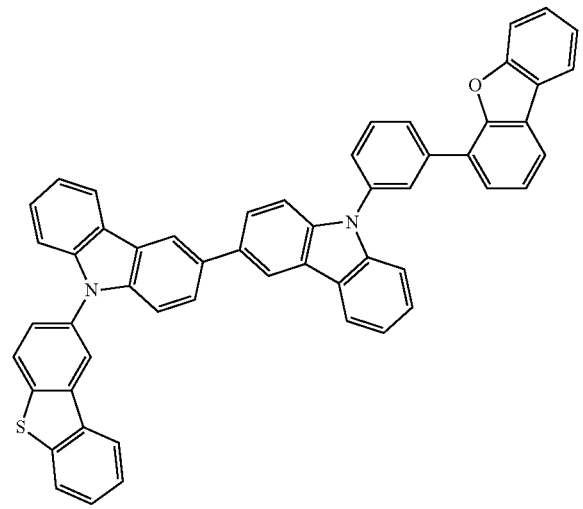

75
-continued
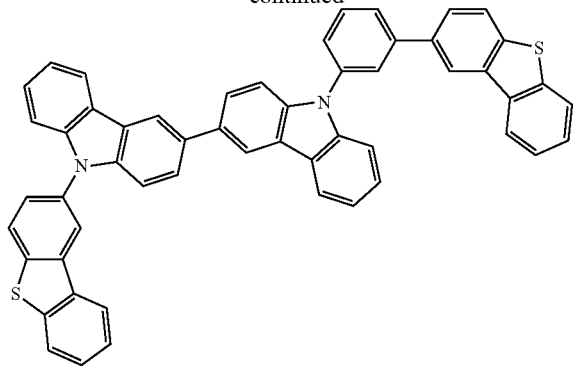
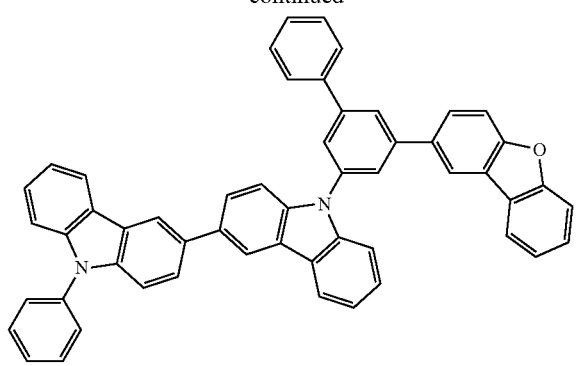
76
-continued
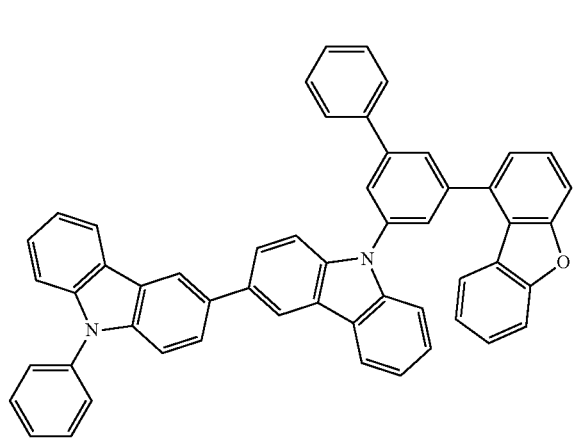
[Formula 74]
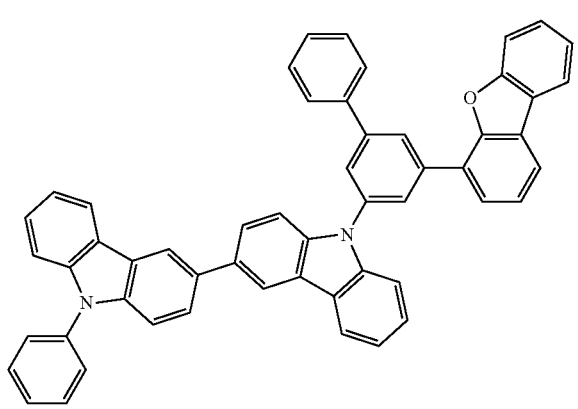
[Formula 75]
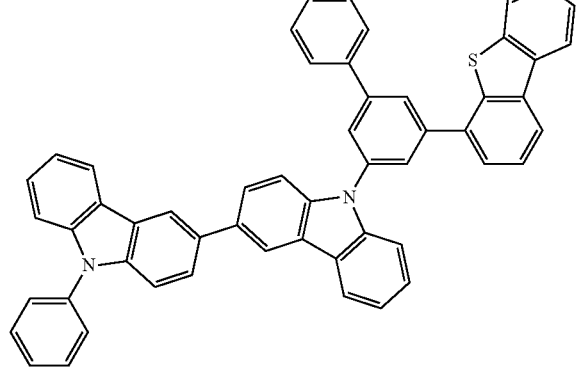
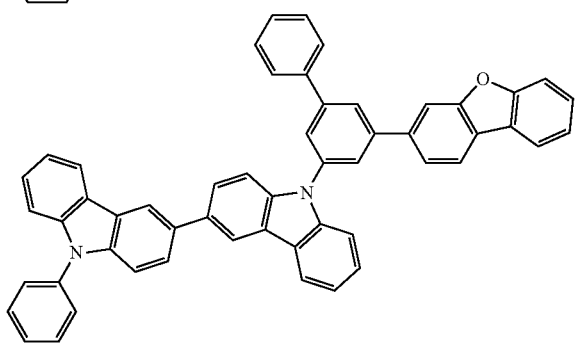
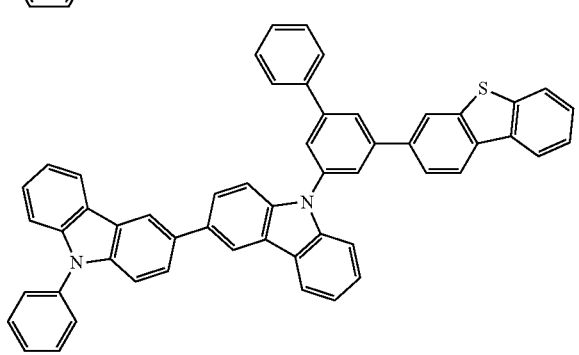

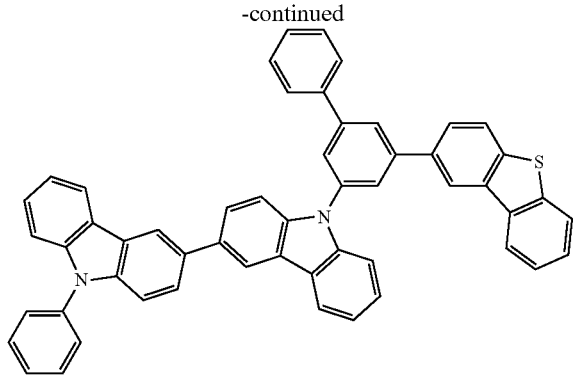
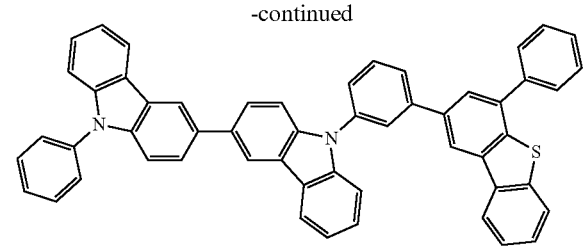
[Formula 77]
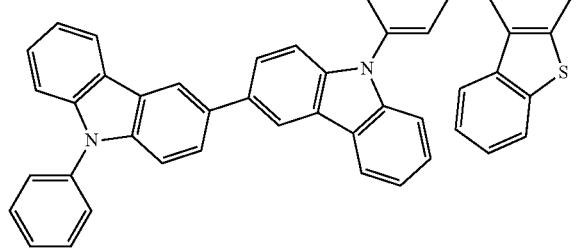
[Formula 76]
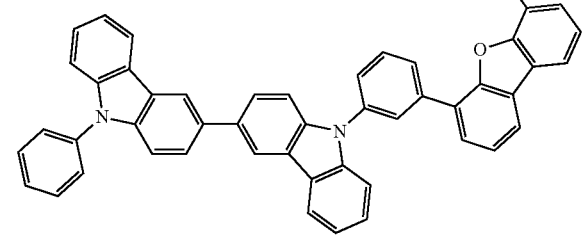
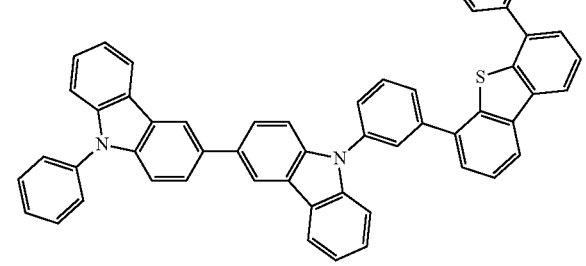
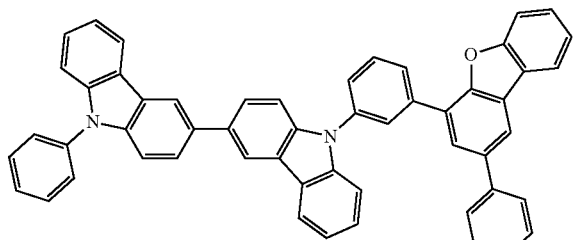
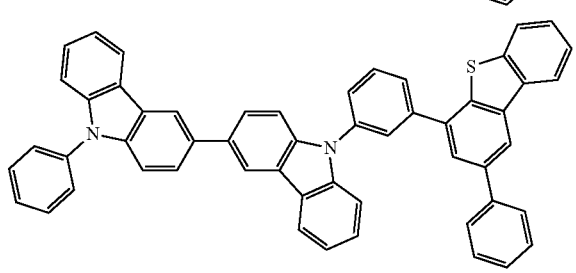
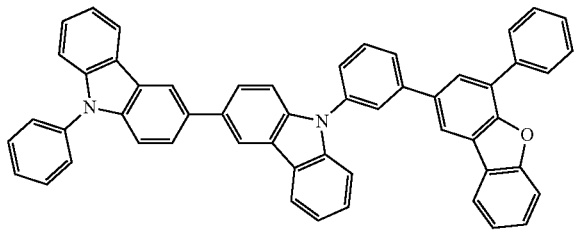
Compounding Ratio of First Compound and Second Compound
In an exemplary embodiment of the invention, a compounding ratio of the first compound and the second compound is not particularly limited. The compounding ratio of the first compound and the second compound only needs to be appropriately determined depending on desired effects of the organic EL device. The compounding ratio (mass ratio) represented by the first compound:the second compound is usually in a range from 1:99 to 99:1, preferably in a range from 1090 to 90:10.

Layer Formation Method(s)

A forming method of each layer of the organic EL device according to the exemplary embodiment is not particularly limited unless otherwise specified herein. Known methods such as a dry film-forming method and a wet film-forming method are usable as the forming method of the layer. Examples of the dry film-forming include vacuum evaporation, sputtering, plasma deposition and ion plating. Examples of the wet film-forming include spin coating, dipping, flow coating and ink-jet.

Film Thickness

A film thickness of each layer in the organic EL device according to the exemplary embodiment is not limited except for the above particular description. The film thickness of each layer needs to be set at an appropriate thickness. When the film thickness is too thick, a large applied voltage may be required for obtaining emission at a certain level, which may deteriorate efficiency. When the film thickness is too thin, pin holes and the like may generate, which may cause an insufficient luminescence intensity even when an electric field is applied The film thickness is typically preferably in a range from 5 nm to 10 μm, more preferably in a range of 10 nm to 0.2 μm.

Materials and the like of components of the organic EL device will be described below.

Substrate

A substrate is used as a support for an emitting device. For instance, glass, quartz, plastics and the like are usable as the substrate. A flexible substrate is also usable. The flexible substrate is a bendable substrate, which is exemplified by a plastic substrate formed from polycarbonate and polyvinyl chloride.

Anode

Metal having a large work function (specifically, 4.0 eV or more), an alloy, an electrically conductive compound and a mixture thereof are preferably usable as the anode formed on the substrate. Specific examples of the material for the anode include indium tin oxide (ITO), indium tin oxide containing silicon or silicon oxide, indium zinc oxide, tungsten oxide, indium oxide containing zinc oxide, and graphene. In addition, the examples of the material for the anode further include nitrides of gold (Au), platinum (Pt), or metal materials (e.g., titanium nitride).

Hole Injecting Layer

The hole injecting layer is a layer for efficiently injecting holes from the anode into the organic layer. Examples of a substance used for the hole injecting layer include molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, aromatic amine compound, acceptor compound, and high-molecular compound (e.g., oligomer, dendrimer, and polymer).

Among the above examples, the substance used for the hole injecting layer is preferably an aromatic amine derivative or the acceptor compound, more preferably the acceptor compound. Preferable examples of the acceptor compound include a heterocyclic derivative substituted by an electron-withdrawing group, a quinone derivative substituted by an electron-withdrawing group, an aryl borane derivative, and a heteroaryl borane derivative. Among the examples, hexa- cyanohexaazatriphenylene, F4TCNQ (2,3,5,6-tetrafluoro-7,7,8,8-tetracyanoquinodimethane), or 1,2,3-tris[(cyano)(4-cyano-2,3,5,6-tetrafluorophenyl)methylene]cyclopropaneispreferablyused.

It is also preferable that a layer containing the acceptor compound further contains a matrix material. Organic-EL-device materials are widely usable as the matrix material. The matrix material used in combination with the acceptor compound is preferably a donor compound, more preferably an aromatic amine compound.

Hole Transporting Layer

The hole transporting layer is a layer containing a highly hole-transporting substance. An aromatic amine compound, carbazole derivative, anthracene derivative and the like are usable for the hole transporting layer. Moreover, a high-molecule compound such as poly(N-vinylcarbazole) (abbreviation: PVK) and poly(4-vinyltriphenylamine) (abbreviation: PVTPA) is also usable for the hole transporting layer. However, any substance having a hole transporting performance higher than an electron transporting performance may be used in addition to the above substances. The layer including the highly hole-transporting substance may be provided in the form of a single layer or a laminate of two or more layers containing the above substance. A hole transporting material is preferably a compound represented by a formula (H) below.

[Formula 78]

In the formula (H), $Ar_1$ to $Ar_3$ each independently represent a substituted or unsubstituted aryl group having 6 to 50 ring carbon atoms, a substituted or unsubstituted heterocyclic group having 5 to 50 ring atoms, or a group formed by combining the substituted or unsubstituted aryl group with the substituted or unsubstituted heterocyclic group. The aryl group is preferably a substituent such as a phenyl group, biphenyl group, terphenyl group, fluorenyl group, spirobifluorenyl group, indenofluorenyl group, naphthyl group, phenanthryl group, anthryl group, and triphenylenyl group. The heterocyclic group is preferably a dibenzofuranyl group, dibenzothiophenyl group, carbazolyl group and the like. The group formed by combining the aryl group with the heterocyclic group is preferably a dibenzofuran-substituted aryl group, dibenzothiophene-substituted aryl group, and carbazole-substituted aryl group. The above substituents may have an additional substituent, preferable examples of which are described below.

The compound represented by the formula (H) is preferably in a form of a compound in which at least one of $Ar_1$ to $Ar_3$ is further substituted by an aryl amino group, and is also preferably a diamine derivative, a triamine derivative, or a tetramine derivative. Preferable examples of the diamine derivative include a tetraaryl-substituted benzidine derivative, and TPTE (4,4'-bis[N-phenyl-N-[4'-diphenylamino-1,1'-biphenyl-4-yl]amino]-1,1'-biphenyl).

The hole transporting material used for a layer adjacent to a phosphorescent layer preferably has a high triplet level. $Ar_1$ to $Ar_3$ in the formula (H) are preferably each independently at least one group selected from the group consisting of a substituent such as a fluorenyl group, spirofluorenyl group, phenyl group, biphenyl group, phenanthryl group, triphenylenyl group, and dibenzothiophenyl group, and a group formed by combining these substituents.

Emitting Layer

The emitting layer contains a highly emittable substance. Various materials are usable for the emitting layer. The emitting layer typically contains a highly emittable luminescent material (a dopant material) and a host material for promoting an efficient emission of the luminescent material. For instance, a fluorescent compound emitting fluorescence or a phosphorescent compound emitting phosphorescence is usable as the highly emittable substance. The fluorescent compound can emit in a singlet state. The phosphorescent compound can emit in a triplet state. The emitting layer containing the fluorescent compound is referred to as a fluorescent layer. The emitting layer containing the phosphorescent compound is referred to as a phosphorescent layer.

The fluorescent compound is widely usable as the dopant material for the fluorescent layer. Preferable examples of the dopant material for the fluorescent layer include a fused polycyclic aromatic derivative, styrylamine derivative, fused cyclic amine derivative, boron-containing compound, pyrrole derivative, indole derivative, and carbazole derivative. More preferably, the dopant material for the fluorescent layer is a fused cyclic amine derivative and a boron-containing compound. Examples of the fused cyclic amine derivative include a diaminopyrene derivative, diaminochrysene derivative, diaminoanthracene derivative, diaminofluorene derivative, and diaminofluorene derivative to which one or more benzofuro skeletons are fused. Examples of the boron-containing compound include a pyrromethene derivative and a triphenyl borane derivative. Herein, a derivative of a certain compound refers to a compound having a skeleton of the certain compound as a partial structure, and the derivative further encompasses a compound having the skeleton and an additional ring to form a fused ring and a compound having the skeleton, substituents of which form a ring. For instance, a fused polycyclic aromatic derivative refers to a compound having a fused polycyclic aromatic skeleton as a partial structure, and further encompasses a compound having the fused polycyclic aromatic skeleton and an additional ring to form a fused ring and a compound having the fused polycyclic aromatic skeleton, substituents of which form a ring.

A general fluorescent material is usable as the host material used in the fluorescent layer. The host material used in the fluorescent layer is preferably a compound having the fused polycyclic aromatic derivative as a main skeleton, particularly preferably an anthracene derivative, pyrene derivative, chrysene derivative, naphthacene derivative and the like. A particularly suitable host as a blue host material (i.e., a host material usable in combination with a blue fluorescent dopant material) and a green host material (a host material usable in combination with a green fluorescent dopant material) is an anthracene derivative represented by a formula (X) below.

[Formula 79]

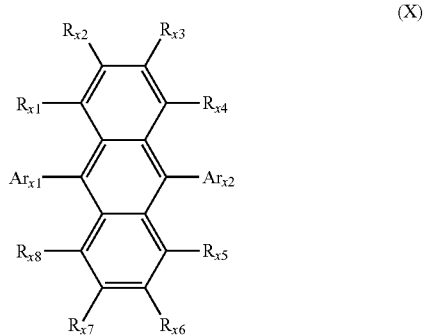

(X)

In the formula (X), $Ar_{X1}$ and $Ar_{X2}$ each independently represent a substituted or unsubstituted aryl group having 6 to 50 ring carbon atoms, or a substituted or unsubstituted heterocyclic group having 3 to 50 ring atoms. $Ar_{X1}$ and $Ar_{X2}$ preferably each independently represent a substituted or unsubstituted aryl group having 6 to 30 ring carbon atoms, or a heterocyclic group having 5 to 30 ring atoms.

A phosphorescent material (the dopant material) usable for the phosphorescent layer is exemplified by a metal complex such as an iridium complex, osmium complex, and platinum complex.

The phosphorescent material that is an ortho-metalated complex of a metal atom selected from the group consisting of iridium (Ir), osmium (Os) and platinum (Pt) is preferably a complex represented by a formula (a) below.

[Formula 80]

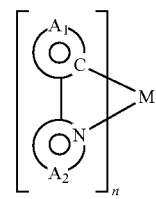

(α)

In the formula (α), M represents at least one metal selected from the group consisting of osmium, iridium, and platinum, and n represents a valence of the selected metal.

A ring $A_1$ represents a substituted or unsubstituted aryl group having 6 to 24 ring carbon atoms or a substituted or unsubstituted heteroaryl group having 5 to 30 ring atoms. A ring $A_2$ represents a substituted or unsubstituted heteroaryl group having 5 to 30 ring atoms and containing nitrogen as an atom forming a hetero ring.

The aryl group having 6 to 24 ring carbon atoms in the ring $A_1$ of the formula (α) is exemplified by the aryl group in the formula (1).

The heteroaryl group ring having 5 to 30 ring atoms in the rings $A_1$ and $A_2$ of the formula (α) is exemplified by the heteroaryl group in the formula (1).

The rings $A_1$ and $A_2$ of the formula (α) can have the same substituents as those in the formula (1).

Further preferably, the complex represented by the formula (α) is a complex represented by a formula (T) or (U) below.

[Formula 81]

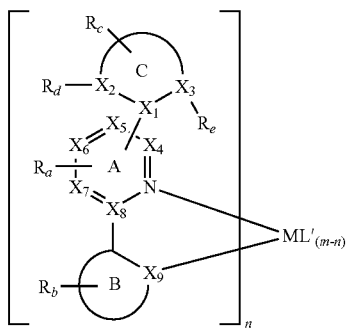

(T)

In the formula (T), M represents metal, and rings B and C each independently represent an aryl group or heteroaryl group having 5 or 6 ring atoms.

Ring A-Ring B represent a bonding pair of a heteroaryl group and an aryl or heteroaryl group. Ring A-Ring B are coordinated with the metal M through a nitrogen atom of the ring A and an $sp^2$ composite atom of the ring B.

Ring A-Ring C represent a bonding pair of a heteroaryl group and an aryl or heteroaryl group.

$R_a$, $R_b$ and $R_c$ each independently represent one selected from the group consisting of a hydrogen atom, a substituted or unsubstituted alkyl group having 1 to 25 carbon atoms, a substituted or unsubstituted alkoxy group having 1 to 25 carbon atoms, a substituted or unsubstituted amino group, a substituted or unsubstituted alkenyl group having 2 to 25 carbon atoms, a substituted or unsubstituted alkynyl group having 2 to 25 carbon atoms, a substituted or unsubstituted aralkyl group having 7 to 50 carbon atoms, a substituted or unsubstituted aryl group having 6 to 24 ring carbon atoms, and a substituted or unsubstituted heteroaryl group having 5 to 30 ring atoms. The number of each of $R_a$, $R_b$ and $R_c$ independently ranges from 1 to 4.

$X_1$ to $X_9$ each independently represent a carbon atom or a nitrogen atom.

$R_d$ and $R_e$ each independently represent one selected from the group consisting of a hydrogen atom, a substituted or unsubstituted alkyl group having 1 to 25 carbon atoms, a substituted or unsubstituted alkoxy group having 1 to 25 carbon atoms, a substituted or unsubstituted amino group, a substituted or unsubstituted alkenyl group having 2 to 25 carbon atoms, a substituted or unsubstituted alkynyl group having 2 to 25 carbon atoms, a substituted or unsubstituted aralkyl group having 7 to 50 carbon atoms, a substituted or unsubstituted aryl group having 6 to 24 ring carbon atoms, and a substituted or unsubstituted heteroaryl group having 5 to 30 ring atoms. At least one of $R_c$, $R_d$ and $R_e$ bonded to the ring C is not a hydrogen atom.

m represents an oxidized state of the metal M. n is 1 or more. $L^1$ represents a mono-anionic bidentate ligand.

In the formula (T), M is exemplified by osmium, iridium and platinum, among which iridium is preferable.

The aryl group having 5 or 6 ring atoms represented by the ring B and the ring C is exemplified by the above-described aryl group in the formula (1).

The heteroaryl group having 5 or 6 ring atoms represented by the ring B and the ring C is exemplified by the above-described heteroaryl group in the formula (1).

The substituted or unsubstituted alkyl group having 1 to 25 carbon atoms, substituted or unsubstituted alkoxy group having 1 to 25 carbon atoms, substituted or unsubstituted aralkyl having 7 to 50 carbon atoms, substituted or unsubstituted aryl group having 6 to 24 ring carbon atoms, and substituted or unsubstituted heteroaryl group having 5 to 30 ring atoms represented by $R_1$, $R_2$, $R_a$, $R_b$ and $R_c$ are the same as those described above.

The substituted or unsubstituted alkenyl group having 2 to 25 carbon atoms and substituted or unsubstituted alkynyl group having 2 to 25 carbon atoms represented by $R_1$, $R_2$, $R_a$, $R_b$ and $R_c$ are the same as those described above.

The mono-anionic bidentate ligand represented by L' is exemplified by a ligand represented by a formula (L') below.

[Formula 82]

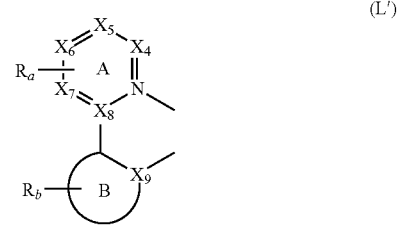

(L')

In the formula (L'), $X_4$ to $X_9$, $R_a$ and $R_b$ are the same as $X_4$ to $X_9$, $R_a$ and $R_b$ in the formula (T). Preferable examples of $X_4$ to $X_9$, $R_a$ and $R_b$ in the formula (L') are the same as those in the formula (T).

The ligand represented by the formula (L') is coordinated with the metal M represented in the formula (T) through a solid line extending from $X_9$ to an outside of the ring B and a dashed line extending from a nitrogen atom of the ring A to an outside of the ring A.

[Formula 83]

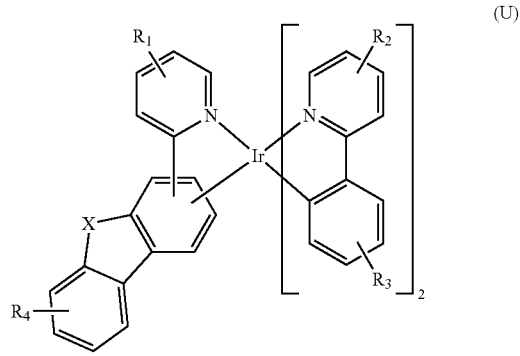

(U)

In the formula (U), X represents one selected from the group consisting of NR, an oxygen atom, a sulfur atom, BR, and a selenium atom. R represents a hydrogen atom or a substituted or unsubstituted alkyl group having 1 to 25 carbon atoms.

$R_1$, $R_2$, $R_3$ and $R_4$ each independently represent any one selected from the group consisting of a hydrogen atom, a substituted or unsubstituted alkyl group having 1 to 25 carbon atoms and a substituted or unsubstituted aryl group having 6 to 24 ring carbon atoms. The number of each of $R_1$, $R_2$, $R_3$ and $R_4$ independently ranges from 1 to 4.

In the formula (U), the alkyl group having 1 to 25 carbon atoms represented by R, $R_1$, $R_2$, $R_3$ and $R_4$ is exemplified by the above-described groups. Preferable examples of the alkyl group having 1 to 25 carbon atoms represented by R, $R_1$, $R_2$, $R_3$ and $R_4$ are the same as those described above.

Moreover, the aryl group having 6 to 24 ring carbon atoms represented by $R_1$, $R_2$, $R_3$ and $R_4$ is exemplified by the above-described groups. Preferable examples of the aryl group having 6 to 24 ring carbon atoms represented by $R_1$, $R_2$, $R_3$ and $R_4$ are the same as those described above.

The complex represented by the formula (T) or (U) is preferably compounds shown below, but is not limited thereto.

[Formula 84]

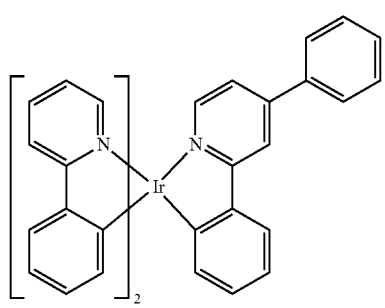

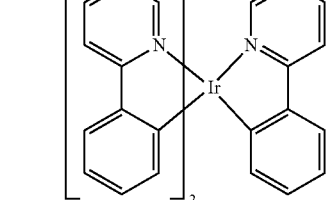

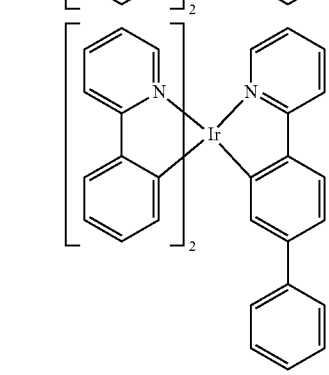

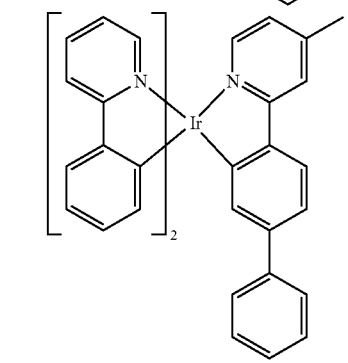

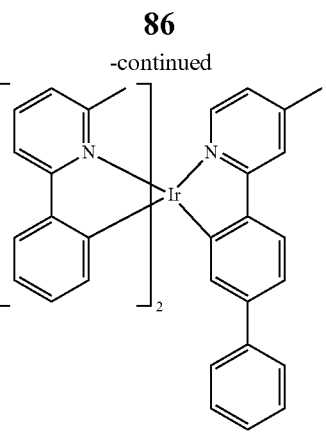

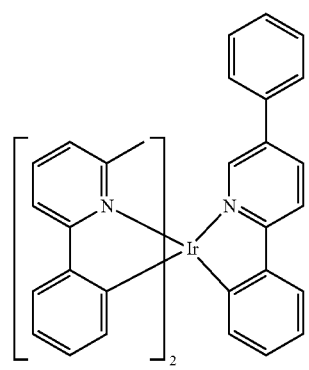

[Formula 85]

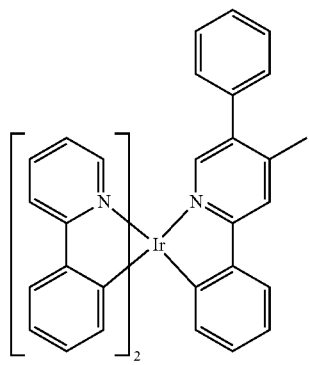

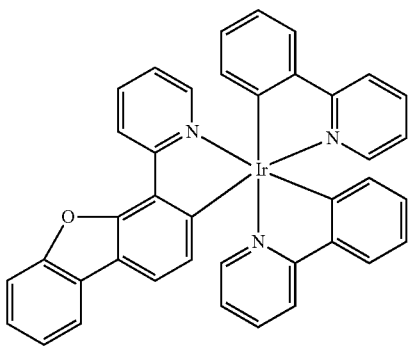

-continued
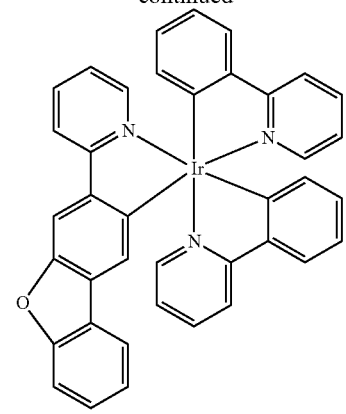
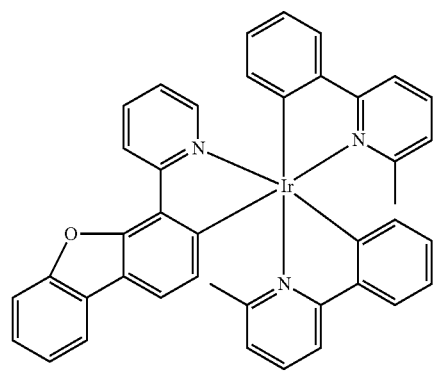
[Formula 86]
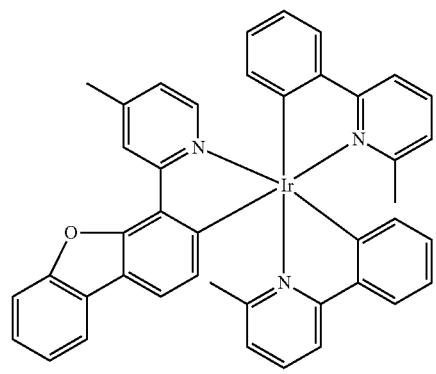
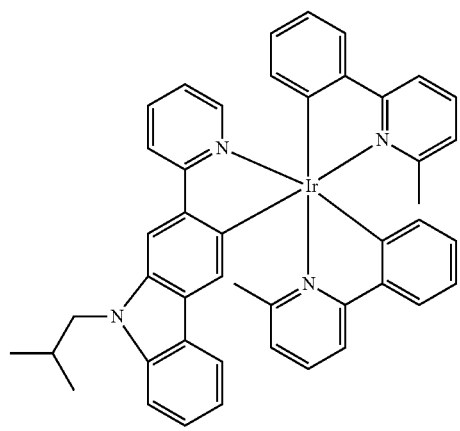
-continued
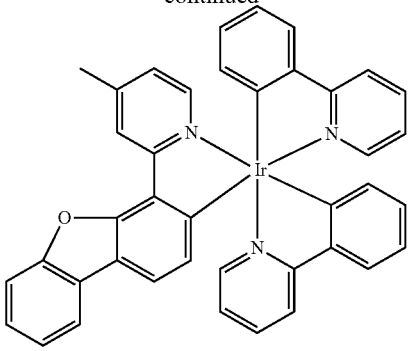
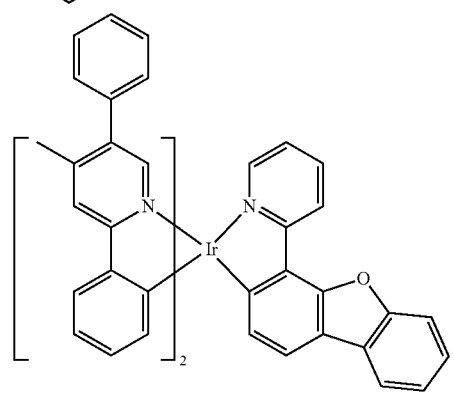
[Formula 87]
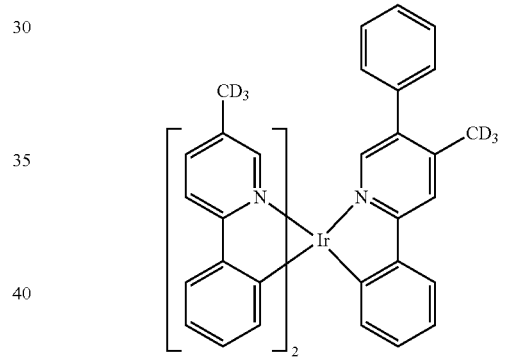
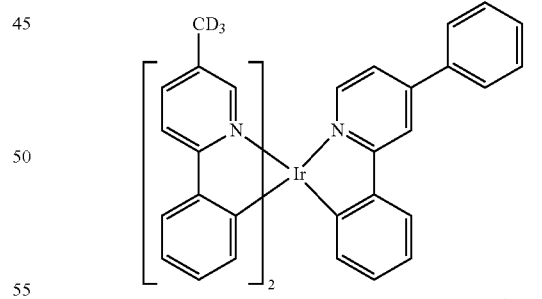
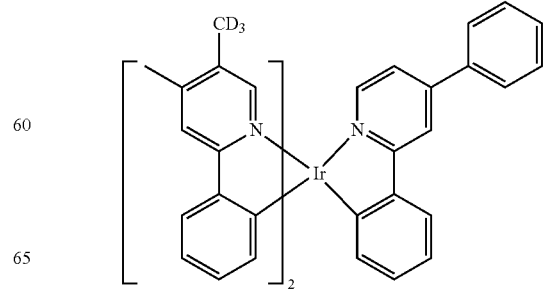

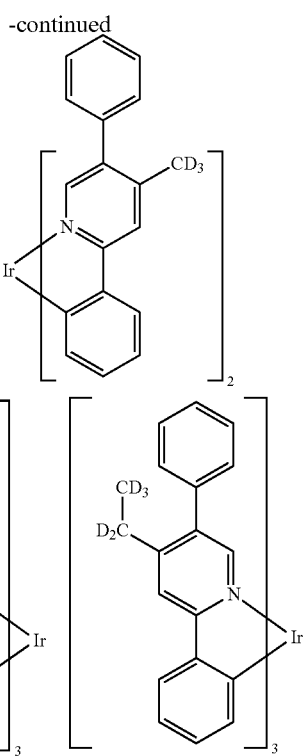

The phosphorescent material is also preferably an iridium complex represented by a formula (β) below.

[Formula 88]

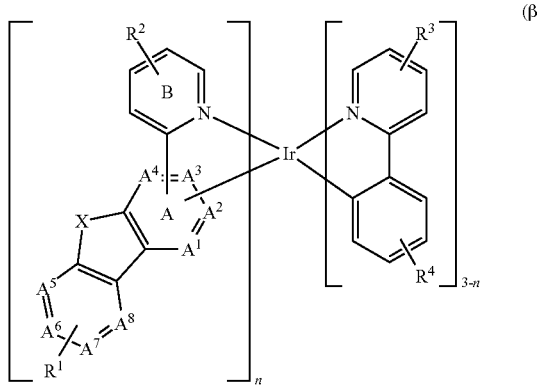

In the formula (β), $A^1$ to A include a carbon atom or a nitrogen atom, at least one of $A^1$ to $A^8$ is a nitrogen atom, the ring B is bonded to the ring A by C—C bond, and iridium (Ir) is bonded to the ring A by Ir—C bond.

In the formula (P), only one of $A^1$ to $A^8$ is preferably a nitrogen atom, more preferably only one of $A^5$ to $A^8$ is a nitrogen atom, and further preferably $A^5$ is a nitrogen atom. In the formula (P), $A^3$ and $A^4$ of $A^1$ to $A^4$ are preferably carbon atoms. In the formula (P), it is preferable that $A^5$ is a nitrogen atom and $A^1$ to $A^4$ and $A^6$ to $A^8$ are carbon atoms.

$A^6$ is preferably CR (carbon atom bonded with R), in which R is selected from the group consisting of a substituted or unsubstituted alkyl group having 1 to 25 carbon atoms, a substituted or unsubstituted cycloalkyl group having 3 to 25 ring carbon atoms, and a combination thereof. R is preferably a substituted or unsubstituted alkyl group having 1 to 25 carbon atoms or a substituted or unsubstituted cycloalkyl group having 3 to 25 ring carbon atoms.

In the formula (β), X is O, S or Se, preferably O.

In the formula (β), $R^1$ to $R^4$ are each independently mono-substituted, di-substituted, tri-substituted, tetra-substituted, or unsubstituted, in which adjacent ones of $R^1$ may be mutually bonded to form a ring, adjacent ones of $R^2$ may be mutually bonded to form a ring, adjacent ones of $R^3$ may be mutually bonded to form a ring, and adjacent ones of $R^4$ may be mutually bonded to form a ring. $R^1$ to $R^4$ are each independently selected from the group consisting of hydrogen, halogen, a substituted or unsubstituted alkyl group having 1 to 25 carbon atoms, a substituted or unsubstituted cycloalkyl group having 3 to 25 ring carbon atoms, a substituted or unsubstituted heteroalkyl group having 2 to 25 atoms, a substituted or unsubstituted arylalkyl group having 7 to 50 carbon atoms, a substituted or unsubstituted alkoxy group having 1 to 25 carbon atoms, a substituted or unsubstituted aryloxy group having 6 to 24 ring carbon atoms, a substituted or unsubstituted amino group, a substituted silyl group, a substituted or unsubstituted alkenyl group having 2 to 25 carbon atoms, a cycloalkenyl group having 3 to 25 ring carbon atoms, a heteroalkenyl group having 3 to 25 atoms, an alkynyl group having 2 to 25 carbon atoms, an aryl group having 6 to 24 ring carbon atoms, a heteroaryl group having 5 to 30 ring atoms, an acyl group, a substituted carbonyl group, carboxylic acid, ester, a nitrile group, an isonitrile group, a sulfanyl group, a sulfinyl group, a sulfonyl group, a phosphino group, and a combination thereof. The substituted silyl group is a silyl group substituted by at least one group selected from the group consisting of an alkyl group having 1 to 25 carbon atoms and an aryl group having 6 to 24 ring carbon atoms. The substituted carbonyl group is a carbonyl group substituted by at least one group selected from the group consisting of an alkyl group having 1 to 25 carbon atoms and an aryl group having 6 to 24 ring carbon atoms. In the formula (β), $R^1$ to $R^4$ are preferably each independently selected from the group consisting of hydrogen, an alkyl group having 1 to 25 carbon atoms and a combination thereof. At least one of $R^2$ and $R^3$ is preferably an alkyl group having 1 to 25 carbon atoms, in which the alkyl group is more preferably deuterated or partially deuterated.

In the formula (β), n is an integer of 1 to 3, preferably 1.

Examples of the iridium complex represented by the formula (p) are shown below, but the iridium complex is not limited to the examples.

[Formula 89]

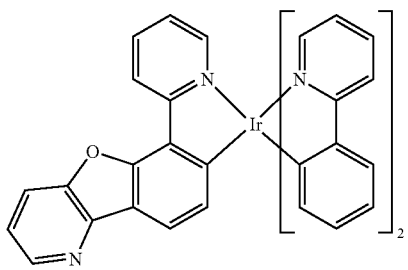

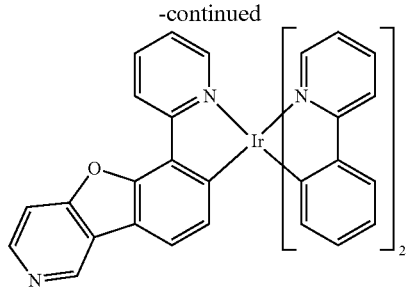
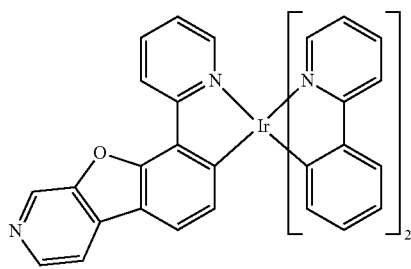
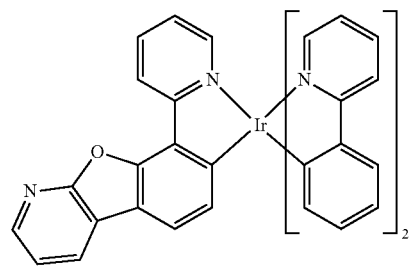
[Formula 90]
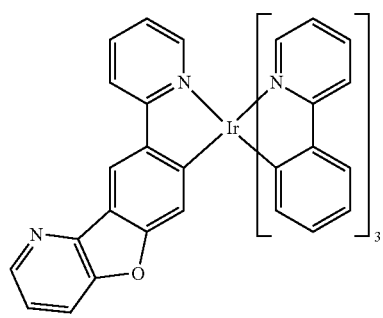
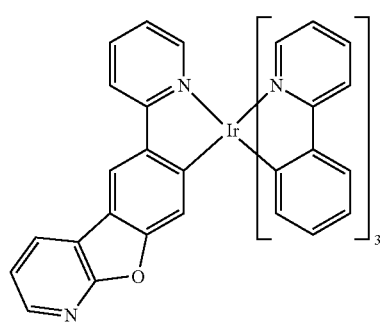
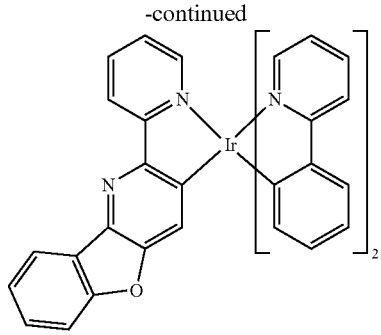
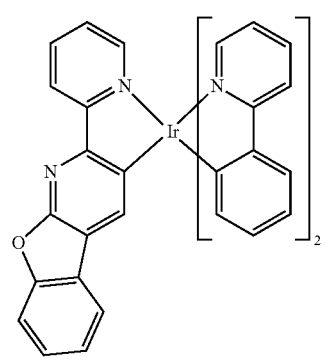
[Formula 91]
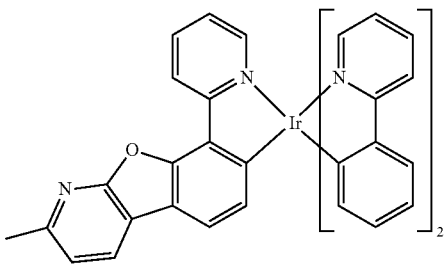
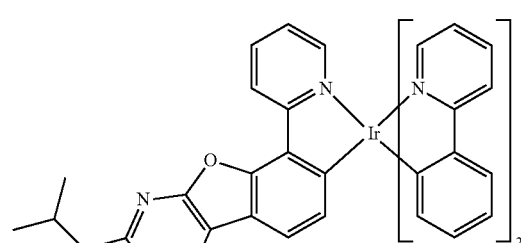
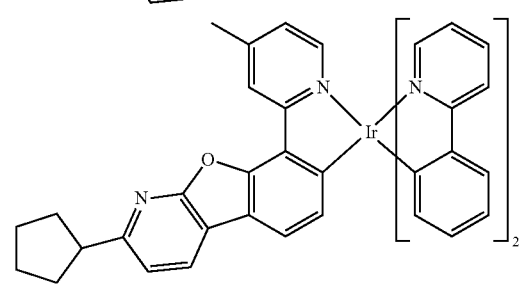

[Formula 92]
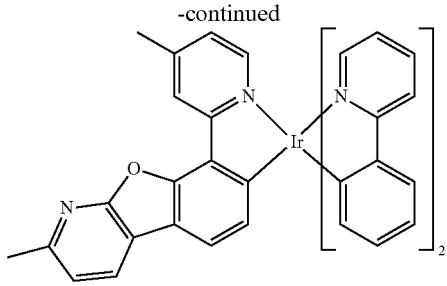
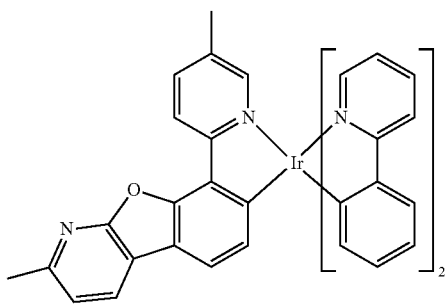
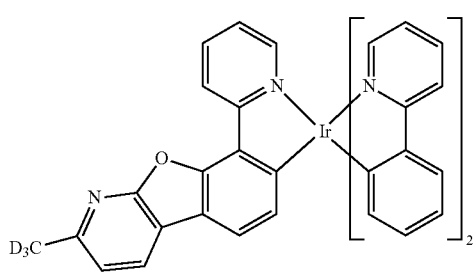
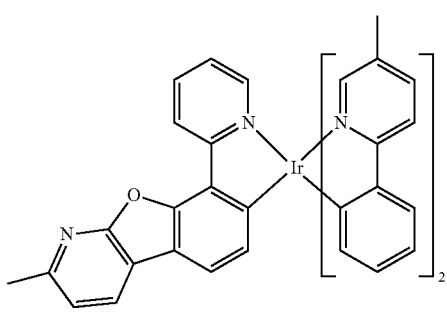
[Formula 93]
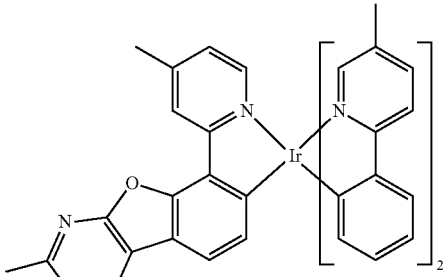
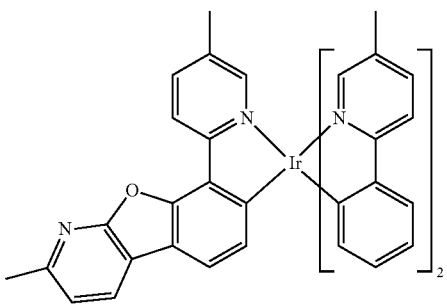
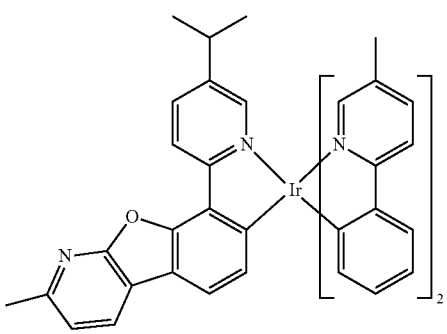
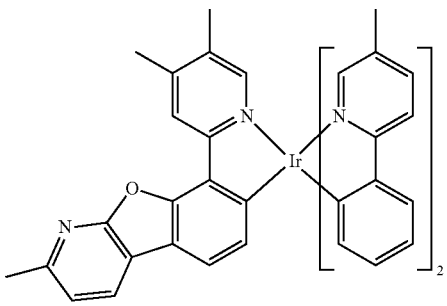
[Formula 94]
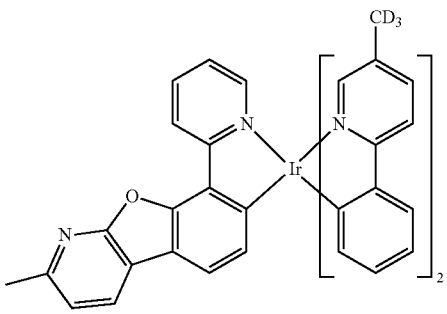

-continued

[Formula 95 structure]
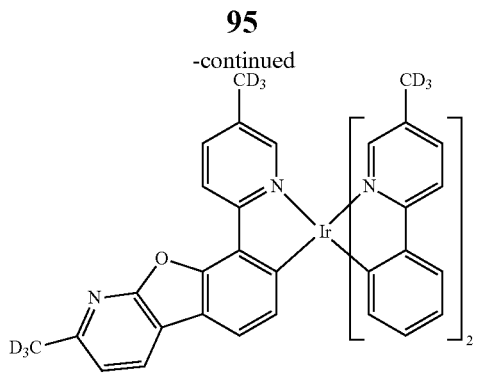

The complex represented by the formula (α) may be a complex represented by a formula (V), (X), (Y) or (Z) below in addition to the complex represented by the formula (T) or (U).

[Formula 95]

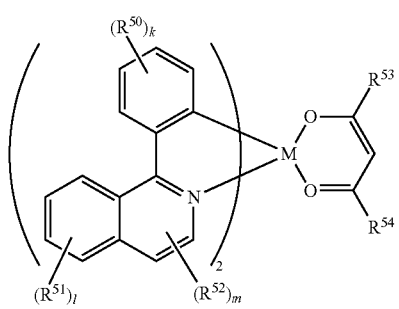
(V)

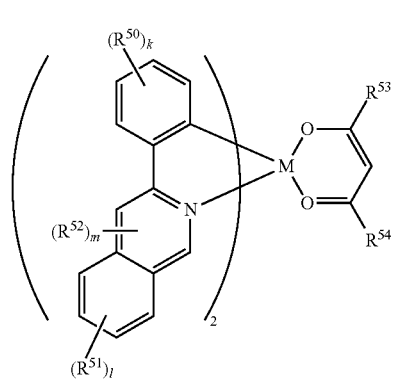
(X)

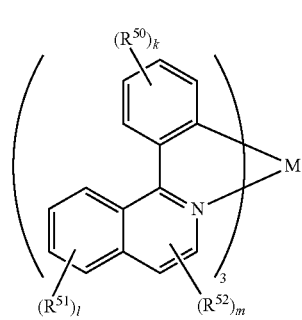
(Y)

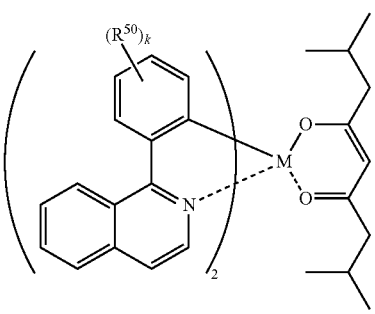
(Z)

In the formula (V), (X), (Y) or (Z), $R^{50}$ to $R^{54}$ each independently represent a hydrogen atom or a substituent, k is an integer of 1 to 4, l is an integer of 1 to 4, and m is an integer of 1 to 2. M is Ir, Os, or Pt.

Examples of the substituent represented by $R^{50}$ to $R^{54}$ are the same as the examples of the substituent represented by $R_a$, $R_b$ and $R_c$.

The formula (V) is preferably represented by a formula (V-1). The formula (X) is preferably represented by a formula (X-1) or (X-2). In the following formulae (V-1), (X-1) and (X-2), $R^{50}$, k and M represent the same as $R^{50}$, k and M described above.

[Formula 96]

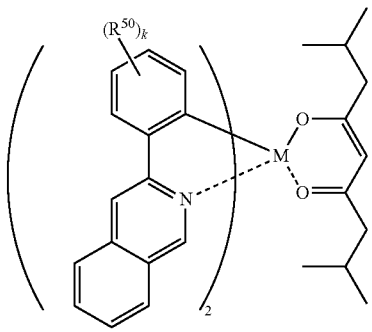
(V-1)

(X-1)

(X-2)
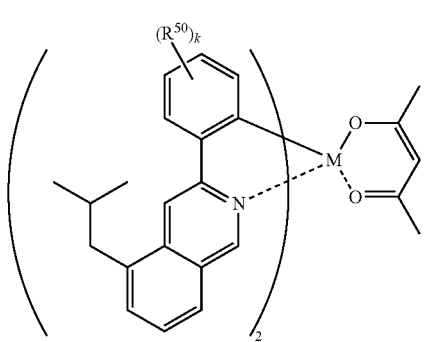
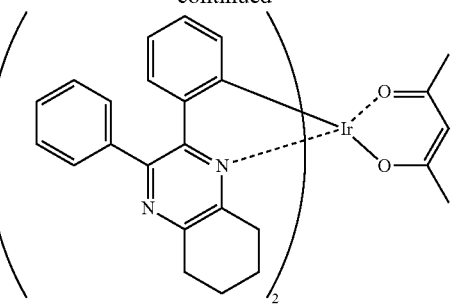
The phosphorescent material is also exemplified by the following complexes.
[Formula 97]
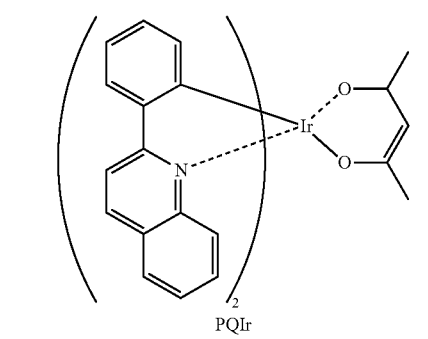
PQIr
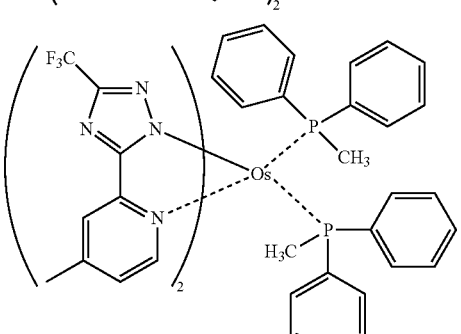
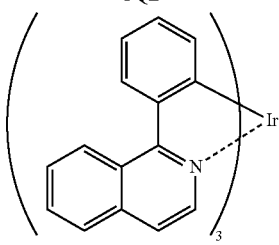
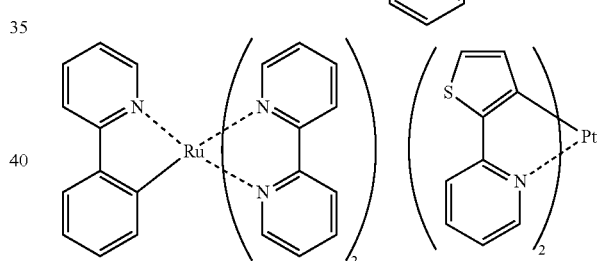
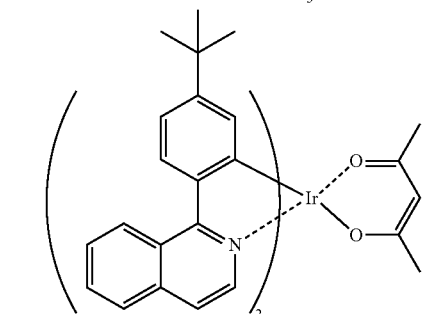
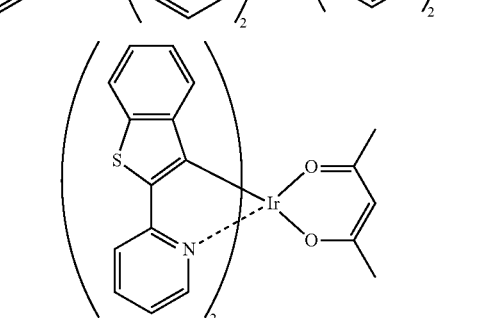
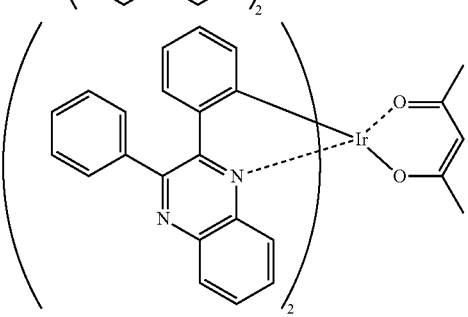
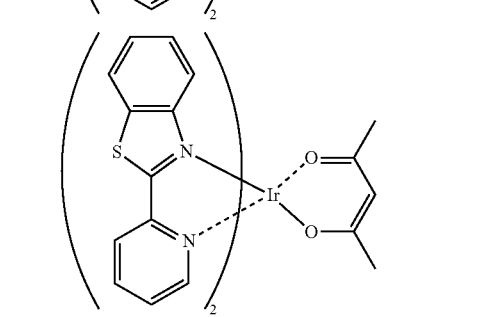

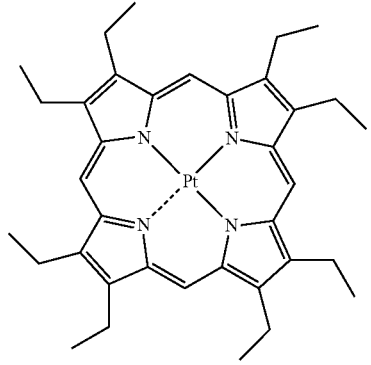
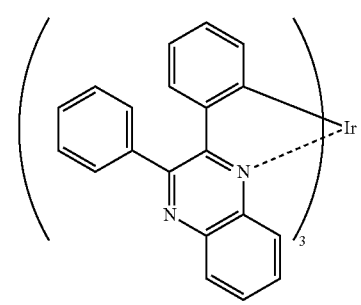
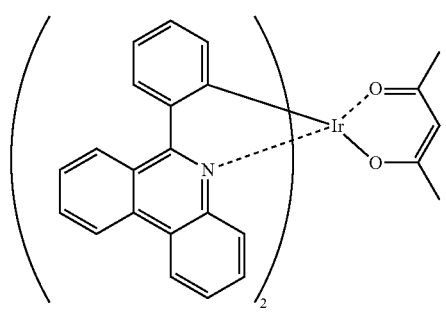
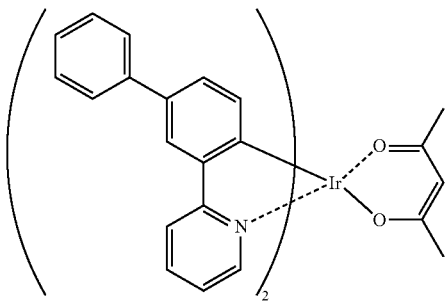
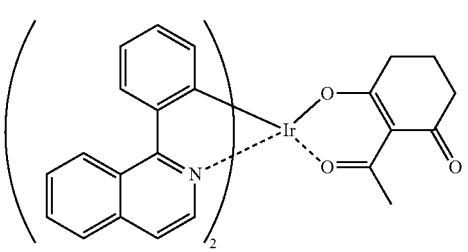
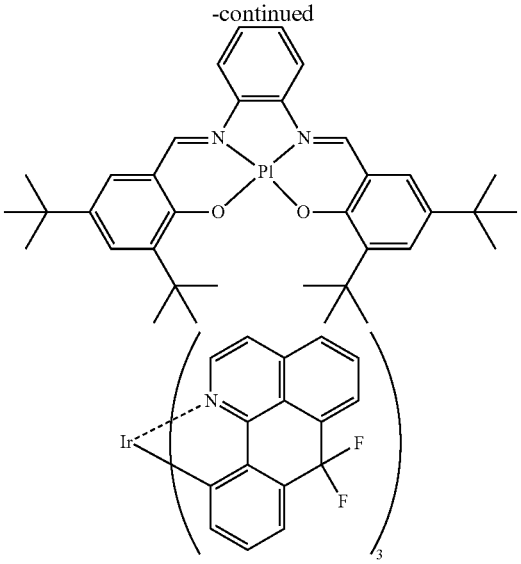
[Formula 98]
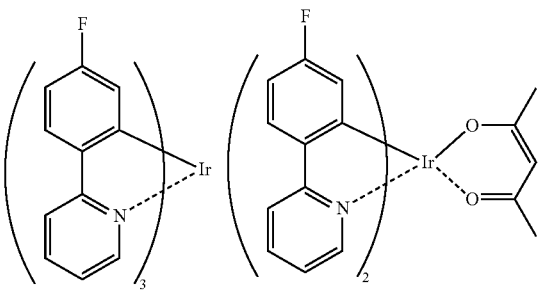
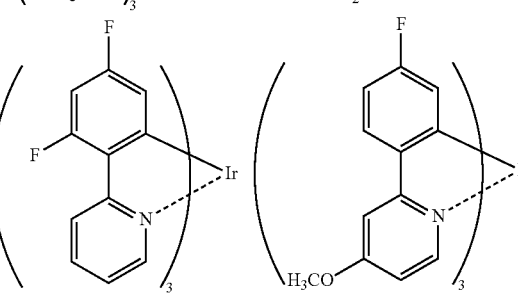
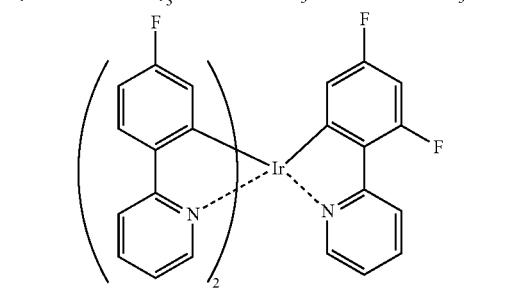
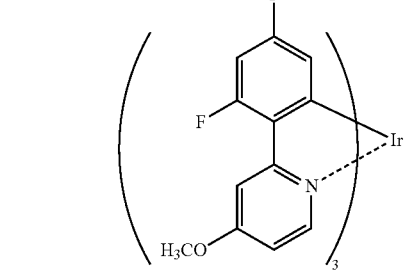

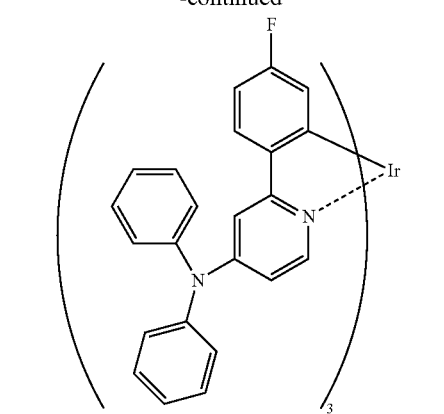
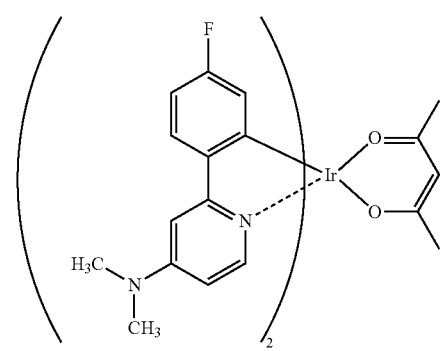
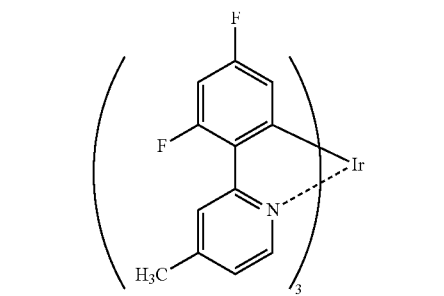
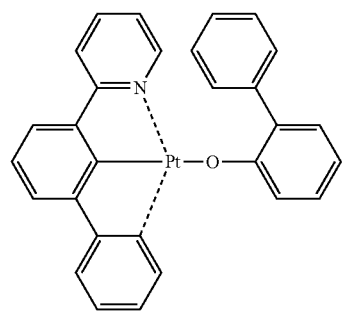
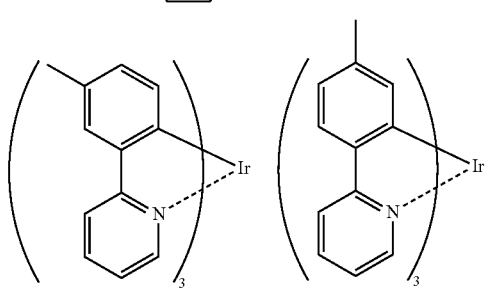
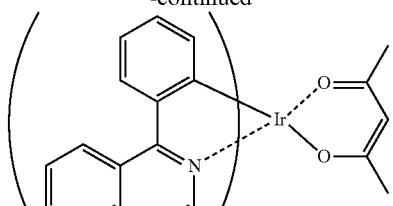
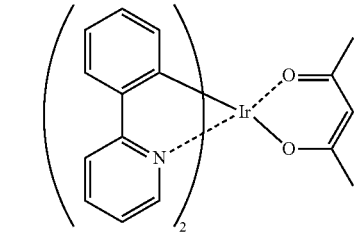
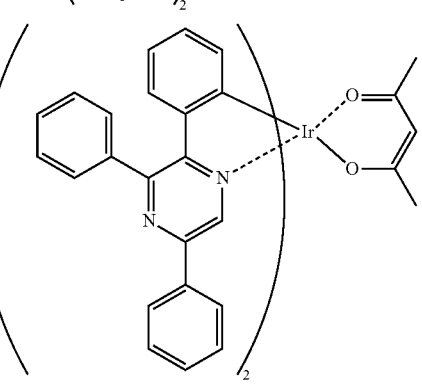
[Formula 99]
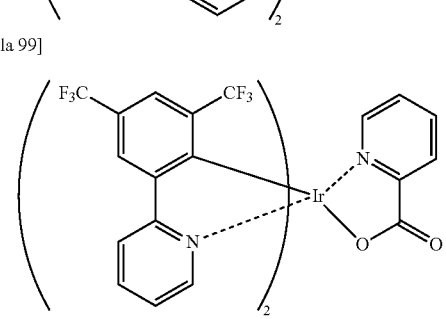
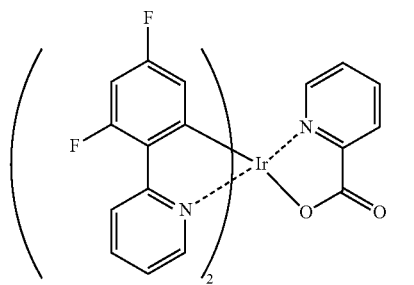
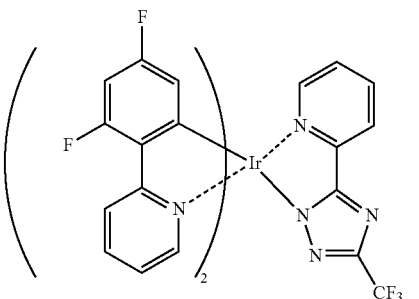

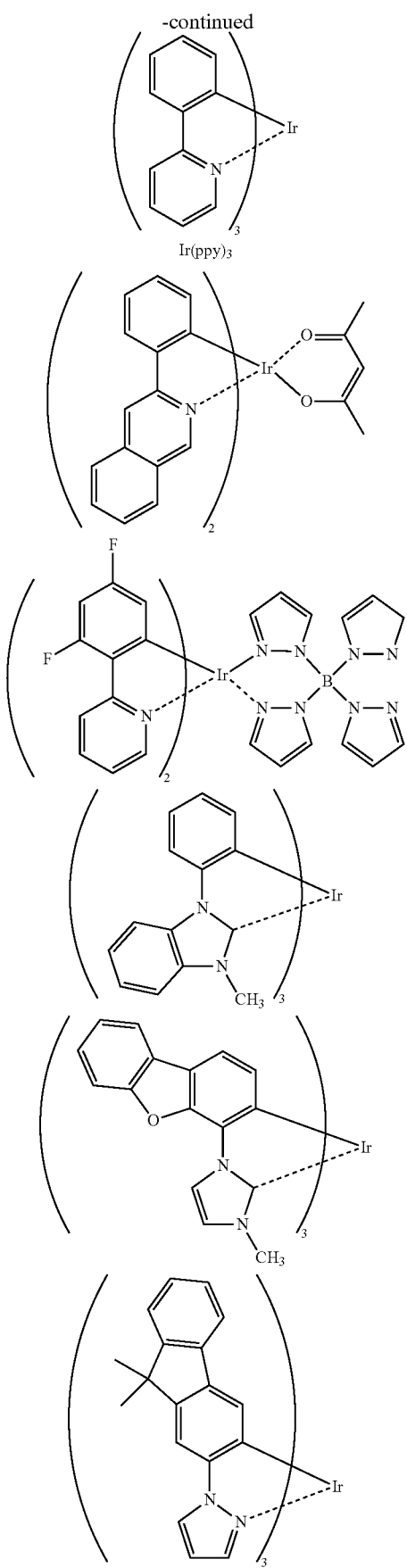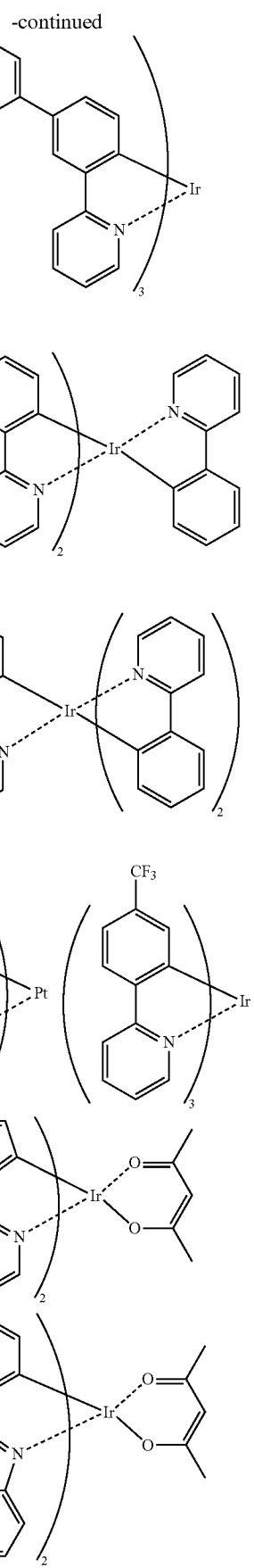
[Formula 100]

-continued
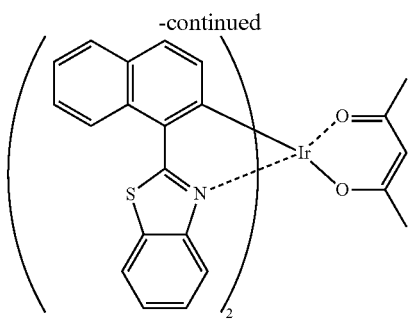
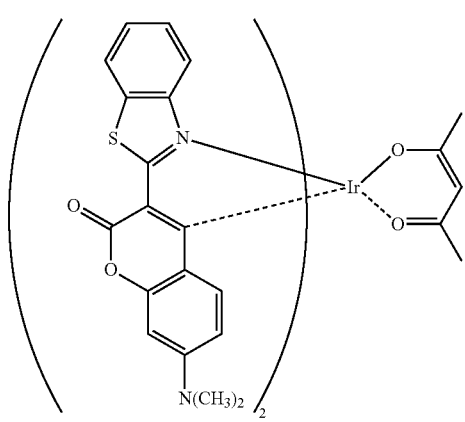
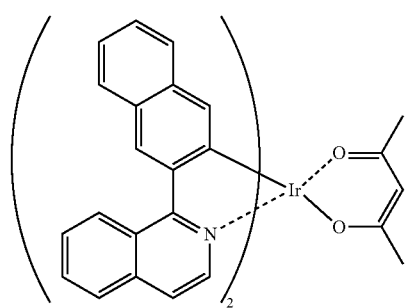
[Formula 101]
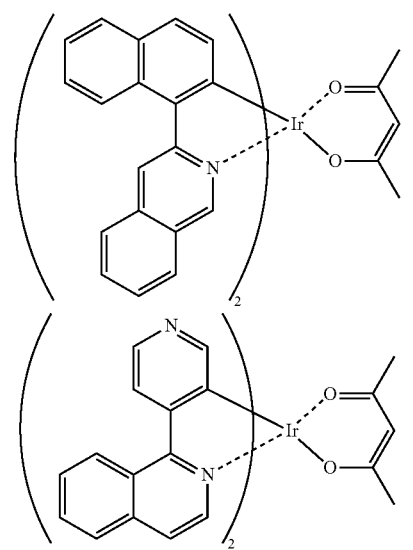
-continued
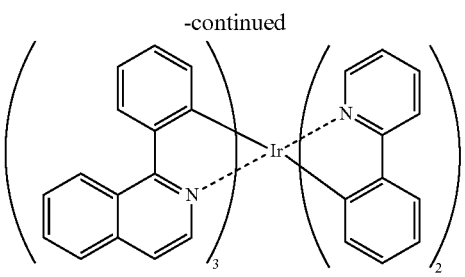
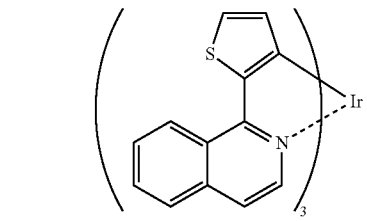
[Formula 102]
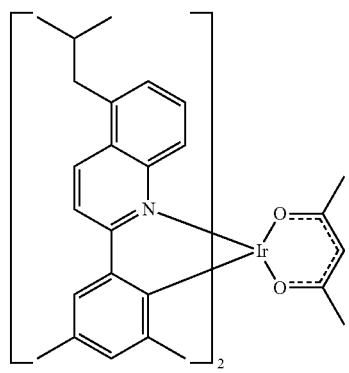
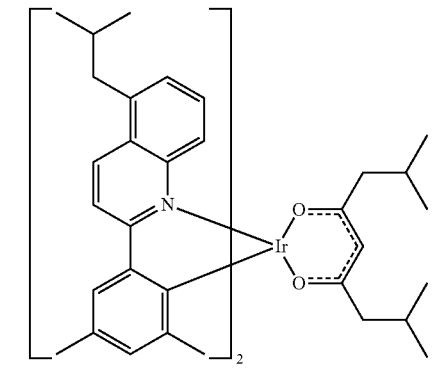
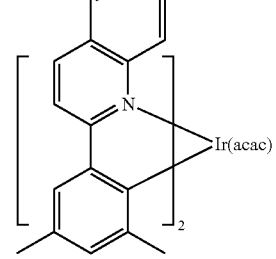

[Formula 103]

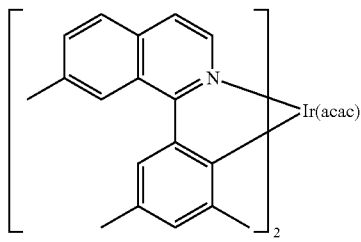

Host Material in Emitting Layer

The host material used in the phosphorescent layer is preferably a material having a higher triplet level than a phosphorescent dopant. A general phosphorescent host material such as an aromatic derivative, a heterocyclic derivative, and a metal complex is usable as the host material used in the phosphorescent layer. Among the examples of the host material used in the phosphorescent layer, an aromatic derivative and a heterocyclic derivative are preferable. Examples of the aromatic derivative include a naphthalene derivative, triphenylene derivative, phenanthrene derivative, and a fluoranthene derivative. Examples of the heterocyclic derivative include an indole derivative, carbazole derivative, pyridine derivative, pyrimidine derivative, triazine derivative, quinoline derivative, isoquinoline derivative, quinazoline derivative, dibenzofuran derivative, and dibenzothienyl derivative. Herein, the derivative is defined the same as described above.

The host material used in the phosphorescent layer is preferably exemplified by the first compound and the second compound of the exemplary embodiment of the invention.

Electron Transporting Layer

The electron transporting layer contains a highly electron-transporting substance.

At least one layer may be provided between the electron transporting layer and the emitting layer in order to improve the performance of the organic EL device. The at least one layer is referred to as a second electron transporting layer, hole blocking layer or triplet block layer. In order to improve hole blocking capability, a material having a deep HOMO level is preferably used. In order to improve triplet block capability, a material having a high triplet level is preferably used.

In the electron transporting layer, a metal complex such as an aluminum complex, beryllium complex and zinc complex; a hetero cyclic compound such as an imidazole derivative, benzimidazole derivative, azine derivative, carbazole derivative, and phenanthroline derivative; a fused aromatic hydrocarbon derivative; and a high-molecular compound are usable. Preferable examples of the material for the electron transporting layer include an imidazole derivative (e.g., a benzimidazole derivative, imidazopyridine derivative, and benzimidazophenanthridine derivative), an azine derivative (e.g., a pyrimidine derivative, triazine derivative, quinoline derivative, isoquinoline derivative, and phenanthroline derivative (i.e., a hetero ring), which may be substituted by a phosphine oxide substituent), and an aromatic hydrocarbon derivative (e.g., an anthracene derivative and fluoranthene derivative).

The composition of the exemplary embodiment is a preferable example of the material included in the electron transporting layer, the hole blocking layer or the triplet block layer.

As a preferable example, the electron transporting layer may include at least one selected from the group consisting of an alkali metal (e.g., Li and Cs), an alkaline earth metal (e.g., Mg), an alloy thereof, a derivative of the alkali metal (e.g., a lithium quinolinato complex), and a derivative of the alkaline earth metal. When the electron transporting layer includes at least one of the alkali metal, the alkaline earth metal, and the alloy thereof, a content ratio of the at least one included in the electron transporting layer is preferably in a range from 0.1 to 50 mass %, more preferably in a range from 0.1 to 20 mass %, further preferably in a range from 1 to 10 mass %. When the electron transporting layer includes at least one of the derivative of the alkali metal and the derivative of the alkaline earth metal, a content ratio of the at least one derivative included in the electron transporting layer is preferably in a range from 1 to 99 mass %, more preferably in a range from 10 to 90 mass %.

Electron Injecting Layer

The electron injecting layer contains a highly electron-injectable substance. Examples of a material for the electron injecting layer include an alkali metal, an alkaline earth metal, and an alloy thereof, examples of which include lithium (Li), lithium fluoride (LiF), cesium fluoride (CsF), calcium fluoride ($CaF_2$), and lithium oxide (LiOx), a derivative of the alkali metal (e.g., a lithium quinolinato complex), and a derivative of the alkaline earth metal.

Cathode

Metal, an alloy, an electrically conductive compound, a mixture thereof and the like, which have a small work function, specifically, of 3.8 eV or less, is preferably usable as a material for the cathode. Examples of the material for the cathode include elements belonging to Groups 1 and 2 in the periodic table of the elements, specifically, an alkali metal such as lithium (Li) and cesium (Cs), an alkaline earth metal such as magnesium (Mg), and an alloy (e.g., MgAg and AlLi) including the alkali metal or the alkaline earth metal, a rare earth metal, and an alloy including the rare earth metal.

Herein, a hydrogen atom encompasses isotopes having different numbers of neutrons, specifically, protium, deuterium and tritium.

Herein, the number of carbon atoms forming a ring (also referred to as ring carbon atoms) means the number of carbon atoms included in atoms forming the ring itself of a compound in which the atoms are bonded to form the ring (e.g., a monocyclic compound, a fused ring compound, a cross-linked compound, a carbocyclic compound, and a heterocyclic compound). When the ring is substituted by a substituent, the "ring carbon atoms" do not include carbon(s) contained in the substituent. Unless specifically described, the same applies to the "ring carbon atoms" described later. For instance, a benzene ring has 6 ring carbon atoms, a naphthalene ring has 10 ring carbon atoms, a pyridinyl group has 5 ring carbon atoms, and a furanyl group has 4 ring carbon atoms. When the benzene ring and/or the naphthalene ring is substituted by, for instance, an alkyl group, the number of carbon atoms of the alkyl group is not included in the number of the ring carbon atoms. When a fluorene ring is substituted by, for instance, a fluorene ring (e.g., a spirofluorene ring), the number of carbon atoms of the fluorene ring as a substituent is not counted in the number of the ring carbon atoms for the fluorene ring.

Herein, the number of atoms forming a ring (also referred to as ring atoms) means the number of atoms forming the ring itself of a compound in which the atoms are bonded to form the ring (e.g., a monocyclic compound, a fused ring compound, a cross-linked compound, a carbocyclic compound, and a heterocyclic compound). Herein, the number of atoms forming a ring (also referred to as ring atoms) means the number of atoms forming the ring itself of a compound in which the atoms are bonded to form the ring (e.g., a monocyclic compound, a fused ring compound, a cross-linked compound, a carbocyclic compound, and a heterocyclic compound). Unless specifically described, the same applies to the "ring atoms" described later. For instance, a pyridine ring has 6 ring atoms, a quinazoline ring has 10 ring atoms, and a furan ring has 5 ring atoms. Hydrogen atoms respectively bonded to carbon atoms of the pyridine ring and the quinazoline ring and atoms forming the substituents are not counted in the number of the ring atoms. When a fluorene ring is substituted by, for instance, a fluorene ring (e.g., a spirofluorene ring), the number of atoms of the fluorene ring as a substituent is not counted in the number of the ring atoms for the fluorene ring.

Herein, "XX to YY carbon atoms" in the description of "a substituted or unsubstituted ZZ group having XX to YY carbon atoms" represent carbon atoms of an unsubstituted ZZ group and do not include carbon atoms of a substituent(s) of the substituted ZZ group.

Herein, "XX to YY atoms" in the description of "substituted or unsubstituted ZZ group having XX to YY atoms" represent atoms of an unsubstituted ZZ group and does not include atoms of a substituent(s) of the substituted ZZ group.

"Unsubstituted" in "substituted or unsubstituted" herein means that a group is not substituted by the above-described substituents but bonded with a hydrogen atom.

Specific examples of each of the group in the formulae and specific examples of the substituent in the description of "substituted or unsubstituted" herein will be described.

Herein, the substituent (first substituent) in the description of "substituted or unsubstituted" is at least one group selected from the group consisting of an aryl group having 6 to 30 ring carbon atoms, heteroaryl group having 5 to 30 ring atoms, alkyl group (a linear or branched alkyl group) having 1 to 25 carbon atoms, cycloalkyl group having 3 to 25 ring carbon atoms, halogenated alkyl group having 1 to 25 carbon atoms, alkylsilyl group having 3 to 25 carbon atoms, arylsilyl group having 6 to 30 ring carbon atoms, alkoxy group having 1 to 25 carbon atoms, aryloxy group having 6 to 30 ring carbon atoms, heteroaryloxy group having 5 to 30 ring atoms, substituted amino group, alkylthio group having 1 to 25 carbon atoms, arylthio group having 6 to 30 ring carbon atoms, heteroarylthio group having 5 to 30 ring atoms, aralkyl group having 7 to 30 carbon atoms, alkyl group substituted by a heteroaryl group having 5 to 30 carbon atoms, alkenyl group having 2 to 30 carbon atoms, alkynyl group having 2 to 30 carbon atoms, phosphoryl group substituted by an aryl group having 6 to 30 carbon atoms or a heterocyclic group having 5 to 30 atoms, boryl group substituted by an aryl group having having 6 to 30 carbon atoms or a heterocyclic group having 5 to 30 atoms, halogen atom, cyano group, hydroxyl group, nitro group, and carboxy group.

Herein, the substituent (first substituent) in the description of "substituted or unsubstituted" is preferably at least one group selected from the group consisting of an aryl group having 6 to 30 ring carbon atoms, heteroaryl group having 5 to 30 ring atoms, an alkyl group having 1 to 25 carbon atoms (a linear or branched alkyl group), alkylsilyl group having 3 to 25 carbon atoms, arylsilyl group having 6 to 30 ring carbon atoms, and cyano group, further preferably the preferable examples of each of the substituents in the description.

Herein, the substituent (first substituent) in the description of "substituted or unsubstituted" may be further substituted by at least one group selected from the group consisting of an aryl group having 6 to 30 ring carbon atoms, heteroaryl group having 5 to 30 ring atoms, alkyl group (a linear or branched alkyl group) having 1 to 25 carbon atoms, cycloalkyl group having 3 to 25 ring carbon atoms, alkylsilyl group having 3 to 25 carbon atoms, arylsilyl group having 6 to 30 ring carbon atoms, alkoxy group having 1 to 25 carbon atoms, aryloxy group having 6 to 30 ring carbon atoms, substituted amino group, alkylthio group having 1 to 25 carbon atoms, arylthio group having 6 to 30 ring carbon atoms, aralkyl group having 7 to 30 carbon atoms, alkenyl group having 2 to 30 carbon atoms, alkynyl group having 2 to 30 carbon atoms, halogen atom, cyano group, hydroxyl group, nitro group, and carboxy group. In addition, plural ones of these substituents are mutually bonded to form a ring, or not bonded.

Herein, the substituent (second substituent) for the substituent (first substituent) in the description of "substituted or unsubstituted" is preferably at least one group selected from the group consisting of an aryl group having 6 to 30 ring carbon atoms, heteroaryl group having 5 to 30 ring atoms, an alkyl group having 1 to 25 carbon atoms (a linear or branched alkyl group), halogen atom, and cyano group, further preferably the preferable examples of each of the substituents in the description.

Examples of the alkyl group include a methyl group, ethyl group, n-propyl group, isopropyl group, n-butyl group, isobutyl group, s-butyl group, t-butyl group, pentyl group (including an isomer group thereof), hexyl group (including an isomer group thereof), heptyl group (including an isomer group thereof), octyl group (including an isomer group thereof), nonyl group (including an isomer group thereof), decyl group (including an isomer group thereof), undecyl group (including an isomer group thereof), and dodecyl group (including an isomer group thereof). Among the examples, a methyl group, ethyl group, n-propyl group, isopropyl group, n-butyl group, isobutyl group, s-butyl group, t-butyl group and pentyl group (including an isomer group of each group) are preferable. A methyl group, ethyl group, n-propyl group, isopropyl group, n-butyl group, isobutyl group, s-butyl group and t-butyl group are more preferable. A methyl group, ethyl group, isopropyl group and t-butyl group are further preferable.

An alkyl group has 1 to 25 carbon atoms, preferably 1 to 10 carbon atoms.

A halogenated alkyl group provided by substituting the alkyl group with a halogen atom is exemplified by a halogenated alkyl group provided by substituting the alkyl group having 1 to 25 carbon atoms with one or more halogen atoms, preferably with a fluorine atom(s).

Specific examples of the halogenated alkyl group having 1 to 25 carbon atoms includes a fluoromethyl group, difluoromethyl group, trifluoromethyl group, fluoroethyl group, trifluoromethylmethyl group, trifluoroethyl group, and pentafluoroethylgroup.

An alkenyl group is a group having a double bond in the above alkyl group and has 2 to 25 carbon atoms, preferably 2 to 10 carbon atoms. An alkenyl group is more preferably a vinyl group.

An alkynyl group is a group having a triple bond in the above alkyl group and has 2 to 25 carbon atoms, preferably 2 to 10 carbon atoms. The alkynyl group is more preferably an ethynyl group.

Examples of the cycloalkyl group are a cyclopropyl group, cyclobutyl group, cyclopentyl group, cyclohexyl group, cycloheptyl group, cyclooctyl group and adamantly group. Among the examples, a cyclopentyl group and a cyclohexyl group are preferable.

The cycloalkyl group has 3 to 25 ring carbon atoms, preferably 3 to 10 ring carbon atoms, more preferably 3 to 8 ring carbon atoms, further preferably 3 to 6 ring carbon atoms.

An alkoxy group is represented by —OY$^{10}$. Examples of Y$^{10}$ are the same as the examples of the alkyl group and the cycloalkyl group. The alkoxy group preferably has 1 to 25 carbon atoms, more preferably 1 to 10 carbon atoms.

An alkylthio group is represented by —SY$^{10}$. Examples of Y$^{10}$ are the same as the examples of the alkyl group and the cycloalkyl group.

The alkylthio group has 1 to 25 carbon atoms, preferably 1 to 10 carbon atoms.

Examples of the halogen atom are a fluorine atom, a chlorine atom, a bromine atom and a iodine atom, among which the fluorine atom is preferable.

Examples of the aryl group include a phenyl group, biphenylyl group, terphenylyl group, naphthyl group, acenaphthylenyl group, anthryl group, benzanthryl group, aceanthryl group, phenanthryl group, benzo[c]phenanthryl group, phenalenyl group, fluorenyl group, picenyl group, pentaphenyl group, pyrenyl group, chrysenyl group, benzo[g]chrysenyl group, s-indacenyl group, as-indacenyl group, fluoranthenyl group, benzo[k]fluoranthenyl group, triphenylenyl group, benzo[b]triphenylenyl group and perylenyl group. Among the examples, a phenyl group, biphenylyl group, terphenylyl group, naphthyl group, phenanthryl group, triphenylenyl group, fluoranthenyl group, and fluorenyl group are preferable. A phenyl group, biphenylyl group, and terphenylyl group are more are preferable. A phenyl group is further preferable.

The aryl group has 6 to 30 ring carbon atoms, preferably 6 to 24 ring carbon atoms, more preferably 6 to 20 ring carbon atoms, further preferably 6 to 18 ring carbon atoms.

An arylene group is a divalent group provided by further removing one hydrogen atom or substituent from the above aryl group.

An aralkyl group is represented by —Y$^{11}$—Y$^{20}$. Y$^{11}$ is exemplified by a divalent group (an alkylene group or cycloalkylene group) provided by further removing one hydrogen atom or substituent from the above examples of the alkyl group and the cycloalkyl group. Y$^{20}$ is exemplified by the above aryl group.

An aryloxy group is represented by —OY$^{20}$. Examples of Y$^{20}$ are the same as the examples of the aryl group.

A heteroaryloxy group is represented by —OY$^{30}$. Examples of Y$^{30}$ are the same as the examples of the heteroaryl group.

An arylthio group is represented by —SY$^{20}$. Examples of Y$^{20}$ are the same as the examples of the aryl group.

A heteroarylthio group is represented by —SY$^{30}$. Examples of Y$^{30}$ are the same as the examples of the heteroaryl group.

An arylcarbonyloxy group is represented by —O—(C=O)—Y$^{20}$. Examples of Y$^{20}$ are the same as the examples of the aryl group.

A substituted carbonyl group having a substituent selected from an alkyl group and an aryl group is represented by —(C=O)—Y$^1$ or —(C=O)—Y$^{20}$. Examples of Y$^{10}$ are the same as the examples of the alkyl group and the cycloalkyl group. Examples of Y$^{20}$ are the same as the examples of the aryl group.

A heterocyclic group includes a heterocyclic group having no aromatic property and an aromatic heterocyclic group having an aromatic property (i.e., referred to as a heteroaryl group when the heterocyclic group is monovalent, and a heteroarylene group when the heterocyclic group is divalent).

Examples of the heterocyclic group having no aromatic property include a heterocyclic group having 3 to 30 ring atoms, preferably 3 to 20 ring atoms, including a nitrogen atom, oxygen atom and/or sulfur atom. Specific examples of the heterocyclic group having no aromatic property include aziridine, oxirane, thiirane, azetidine, oxetane, trimethylene sulfide, pyrrolidine, tetrahydrofuran, tetrahydrothiophene, piperidine, tetrahydropyrane, and tetrahydrothiopyrane.

The heterocyclic group is exemplified by a cyclic group including a hetero atom such as a nitrogen atom, oxygen atom, sulfur atom, and phosphorus atom. The ring atoms preferably include an atom selected from the group consisting of a nitrogen atom, oxygen atom and sulfur atom. The heterocyclic group is preferably a heteroaryl group having an aromatic property. Examples of the heteroaryl group includes a pyrrolyl group, furyl group, thienyl group, pyridyl group, imidazopyridyl group, pyridazynyl group, pyrimidinyl group, pyrazinyl group, triazinyl group, imidazolyl group, oxazolyl group, thiazolyl group, pyrazolyl group, isooxazolyl group, isothiazolyl group, oxadiazolyl group, thiadiazolyl group, triazolyl group, tetrazolyl group, indolyl group, isoindolyl group, benzofuranyl group, isobenzofuranyl group, benzothiophenyl group, isobenzothiophenyl group, indolizinyl group, quinolizinyl group, quinolyl group, isoquinolyl group, cinnolyl group, phthalazinyl group, quinazolinyl group, quinoxalinyl group, benzimidazolyl group, benzoxazolyl group, benzothiazolyl group, indazolyl group, benzisoxazolyl group, benzisothiazolyl group, dibenzofuranyl group, dibenzothiophenyl group, carbazolyl group, 9-phenylcarbazolyl group, phenanthridinyl group, acridinyl group, phenanthrolinyl group, phenazinyl group, phenothiazinyl group, phenoxazinyl group and xanthenyl group. Among the example, a pyridyl group, imidazopyridyl group, pyridazynyl group, pyrimidinyl group, pyrazinyl group, triazinyl group, benzimidazolyl group, dibenzofuranyl group, dibenzothiophenyl group, carbazolyl group, carbazolyl group substituted at a position 9 by an aryl group or a heterocyclic group, phenanthrolinyl group and quinazolinyl group are preferable.

The heterocyclic group has 3 to 30 ring atoms, preferably 5 to 24 ring atoms, more preferably 5 to 18 ring atoms.

The heteroaryl group has 5 to 30 ring atoms, preferably 5 to 24 ring atoms, more preferably 5 to 18 ring atoms.

The ring atoms of the heteroaryl group are preferably a nitrogen atom, oxygen atom or sulfur atom in addition to a carbon atom.

A heteroarylene group is a divalent group provided by further removing one hydrogen atom or substituent from the above heteroaryl group.

Herein, the heterocyclic group may be a group derived from any one of partial structures represented by formulae (XY-1) to (XY-18) below.

[Formula 104]

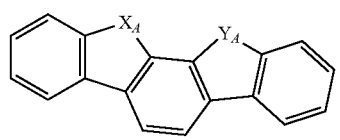

(XY-1)

(XY-2)
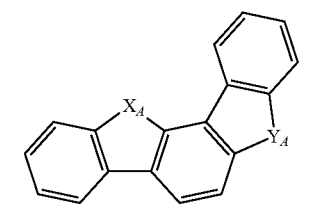
(XY-3)
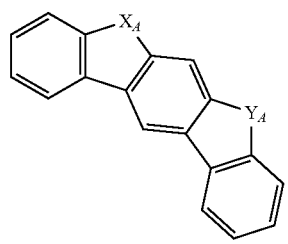
(XY-4)
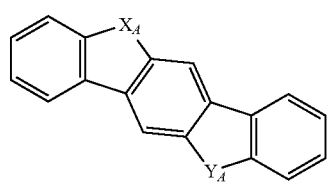
(XY-5)
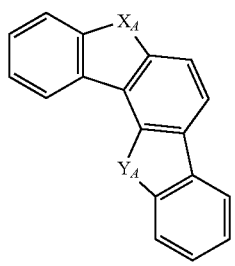
(XY-6)
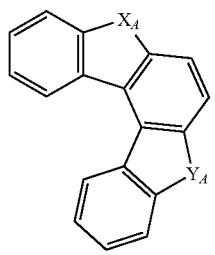
[Formula 105]
(XY-7)
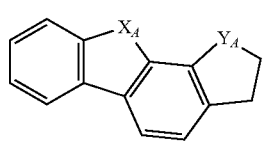
(XY-8)
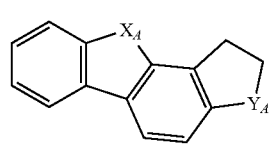
(XY-9)
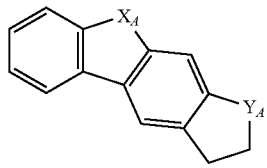
(XY-10)
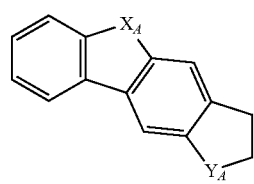
(XY-11)
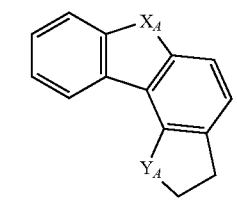
(XY-12)
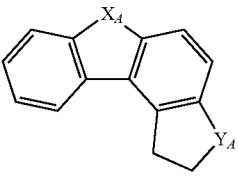
[Formula 106]
(XY-13)
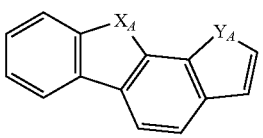
(XY-14)
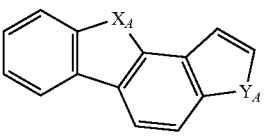
(XY-15)
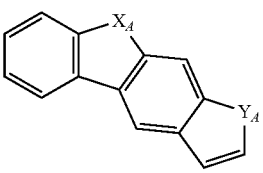
(XY-16)
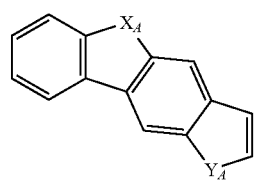

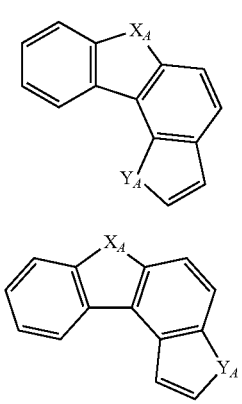

(XY-17)

(XY-18)

In the formulae (XY-1) to (XY-18), $X_A$ and $Y_A$ each independently represent a hetero atom, and preferably represent an oxygen atom, sulfur atom, selenium atom, silicon atom or germanium atom. The partial structures represented by the formulae (XY-1) to (XY-18) may each be bonded in any position to be a heterocyclic group, which may be substituted.

A mono-substituted amino group having a substituent selected from an alkyl group and aryl group is represented by —NH($Y^{10}$) or —NH($Y^{20}$), in which $Y^{10}$ and $Y^{20}$ are the same as the above.

A di-substituted amino group having substituents selected from an alkyl group and aryl group is represented by —N($Y^{10}$)$_2$, —N($Y^{20}$)$_2$ or —N($Y^{10}$)($Y^{20}$), in which $Y^{10}$ and $Y^{20}$ are the same as the above. When two $Y^{10}$ or two $Y^{20}$ are present, the two $Y^{10}$ or two $Y^{20}$ may be mutually the same or different.

A mono-substituted silyl group having a substituent selected from an alkyl group and aryl group is represented by —SiH$_2$($Y^{10}$) or —SiH$_2$($Y^{20}$).

A di-substituted silyl group having substituents selected from an alkyl group and aryl group is represented by —SiH($Y^{10}$)$_2$, —SiH($Y^{20}$)$_2$ or —SiH($Y^{10}$)($Y^{20}$)

A tri-substituted silyl group having substituents selected from an alkyl group and aryl group is represented by —Si($Y^{10}$)$_3$, —Si($Y^{20}$)$_3$, —Si($Y^{10}$)$_2$($Y^{20}$) or —Si($Y^{10}$)($Y^{20}$)$_2$. $Y^{10}$ and $Y^{20}$ are the same as the above. When a plurality of $Y^{10}$ or a plurality of $Y^{20}$ are present, the plurality of $Y^{10}$ or the plurality of $Y^{20}$ may be mutually the same or different.

A substituted sulfonyl group having a substituent selected from an alkyl group and aryl group is represented by —S(=O)$_2$—$Y^{10}$ or —S(=O)$_2$—$Y^{20}$, in which $Y^{10}$ and $Y^{20}$ are the same as the above.

A di-substituted phosphoryl group having substituents selected from an alkyl group and aryl group is represented by —O—P(=O)($Y^{10}$)$_2$, —O—P(=O)($Y^{20}$)$_2$ or —O—P(=O)($Y^{10}$)($Y^{20}$) $Y^{10}$ and $Y^{20}$ are the same as the above. When two $Y^{10}$ or two $Y^{20}$ are present, the two $Y^{10}$ or the two $Y^{20}$ may be mutually the same or different.

An alkylsulphonyl group having an alkyl group is represented by —O—S(=O)$_2$($Y^{10}$), in which $Y^1$ is the same as the above.

An arylsulphonyloxy group having a substituent selected from an aryl group is represented by —O—S(=O)$_2$($Y^{20}$), in which $Y^{20}$ is the same as the above.

Electronic Device

An electronic device according to an exemplary embodiment of the invention includes the organic electroluminescence device of the above exemplary embodiment.

The organic electroluminescence device of the above exemplary embodiment is usable for various electronic devices. For example, the organic electroluminescence device of the above exemplary embodiment is usable for a light source of a flat light-emitting body, a backlight, instruments and the like, a display plate, sign lamp and the like. The flat light-emitting body is exemplified by a flat panel display of a wall-hanging TV. The backlight is exemplified by a backlight of a copier, a printer, a liquid crystal display and the like.

Moreover, the compound according to the exemplary embodiment is usable not only in the organic EL device but also in fields such as an electrophotographic photoreceptor, photoelectric conversion element, solar battery and image sensor.

Composition

A composition according to a first exemplary embodiment of the invention is a composition in a mixture of at least two compounds.

The composition of the exemplary embodiment at least contains the first compound represented by the formula (1) and the second compound represented by the formula (2). The first compound is different from the second compound in a molecule structure.

The composition of the exemplary embodiment may be in any forms. Examples of the forms of the composition of the exemplary embodiment include solid, powder, a solution and a film. When the composition of the exemplary embodiment is solid, the composition may be pelletized.

Use of the composition of the exemplary embodiment including the first compound and the second compound can provide an organic electroluminescence device having the same level of an external quantum efficiency and a longer lifetime as compared with a typical organic electroluminescence device.

Compounding Ratio of Composition

In the exemplary embodiment of the invention, a compounding ratio of the first compound and the second compound is not particularly limited. The compounding ratio of the first compound and the second compound only needs to be appropriately determined depending on desired effects of the composition. The compounding ratio (mass ratio) represented by the first compound:the second compound is usually in a range from 1:99 to 99:1, preferably in a range from 10:90 to 90:10.

Material for Organic Electroluminescence Device

A material for an organic electroluminescence device (hereinafter, referred to as an organic-electroluminescence-device material) according to the exemplary embodiment includes the composition according to the exemplary embodiment. Specifically, the organic-electroluminescence-device material according to the exemplary embodiment includes the first compound and the second compound.

The organic-electroluminescence-device material according to the exemplary embodiment may further include an additional compound. When the organic-electroluminescence-device material according to the exemplary embodiment further includes the additional compound, the additional compound may be solid or liquid.

Composition Film

A composition film according to the exemplary embodiment includes the composition according to the exemplary embodiment. Specifically, a film containing the composition according to the exemplary embodiment (hereinafter, also referred to as a composition film) means a film containing the first compound and the second compound.

The composition film according to the exemplary embodiment may further include an additional compound.

A forming method of the composition film according to the exemplary embodiment is not particularly limited unless otherwise specified herein. Known methods such as a dry film-forming method and a wet film-forming method are usable as the forming method of the composition film. Examples of the dry film-forming method include vacuum evaporation, sputtering, plasma deposition and ion plating. Examples of the wet film-forming include spin coating, dipping, flow coating and ink-jet.

MODIFICATION OF EMBODIMENT(S)

It should be noted that the invention is not limited to the above exemplary embodiment but may include any modification and improvement as long as such modification and improvement are compatible with the invention.

The above exemplary embodiment in which the first and second compounds are contained in the emitting layer is exemplarily described. An organic EL device according to a modification includes the first and second compounds in a single layer of the organic layer(s) except for the emitting layer. For instance, an organic EL device includes an anode, a cathode, an emitting layer provided between the anode and the cathode, and an electron transporting zone provided between the emitting layer and the cathode, in which the electron transporting zone includes the composition of the above exemplary embodiment.

For instance, the emitting layer is not limited to a single layer, but may be provided by laminating a plurality of emitting layers. When the organic EL device has a plurality of emitting layers, it is only required that at least one of the emitting layers satisfies the conditions described in the above exemplary embodiment. For instance, the rest of the emitting layer may be a fluorescent emitting layer or a phosphorescent emitting layer with use of emission by electron transfer from the triplet state directly to the ground state.

When the organic EL device includes the plurality of emitting layers, the plurality of emitting layers may be adjacent to each other, or provide a so-called tandem-type organic EL device in which a plurality of emitting units are layered through an intermediate layer.

For instance, a blocking layer may be provided adjacent to at least one side of a side near the anode and a side near the cathode of the emitting layer. The blocking layer is preferably provided in contact with the emitting layer to at least block holes, electrons or excitons.

For instance, when the blocking layer is provided in contact with the cathode-side of the emitting layer, the blocking layer permits transport of electrons, but blocks holes from reaching a layer provided near the cathode (e.g., the electron transporting layer) beyond the blocking layer. When the organic EL device includes the electron transporting layer, the blocking layer is preferably interposed between the emitting layer and the electron transporting layer.

When the blocking layer is provided in contact with the anode-side of the emitting layer, the blocking layer permits transport of holes, but blocks electrons from reaching a layer provided near the anode (e.g., the hole transporting layer) beyond the blocking layer. When the organic EL device includes the hole transporting layer, the blocking layer is preferably interposed between the emitting layer and the hole transporting layer.

Further, the blocking layer may be provided in contact with the emitting layer to prevent an excitation energy from leaking from the emitting layer into neighboring layers. The blocking layer blocks excitons generated in the emitting layer from moving into a layer provided near the electrode (e.g., the electron transporting layer and the hole transporting layer) beyond the blocking layer.

The emitting layer is preferably in contact with the blocking layer.

Specific structure and shape of the components in the present invention may be designed in any manner as long as the object of the present invention can be achieved.

EXAMPLES

Examples of the invention will be described below. However, the invention is not limited to Example(s).

Compounds

Compounds used for manufacturing the organic EL device will be shown below.

[Formula 107]

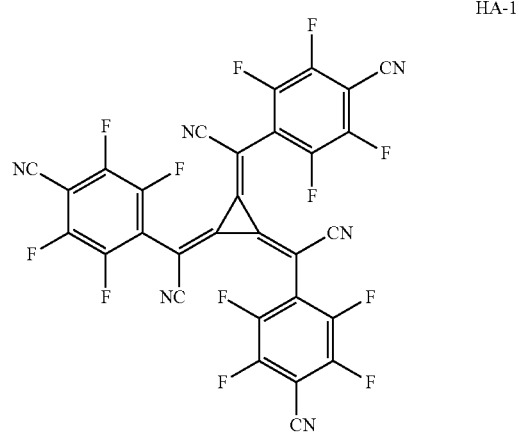

HA-1

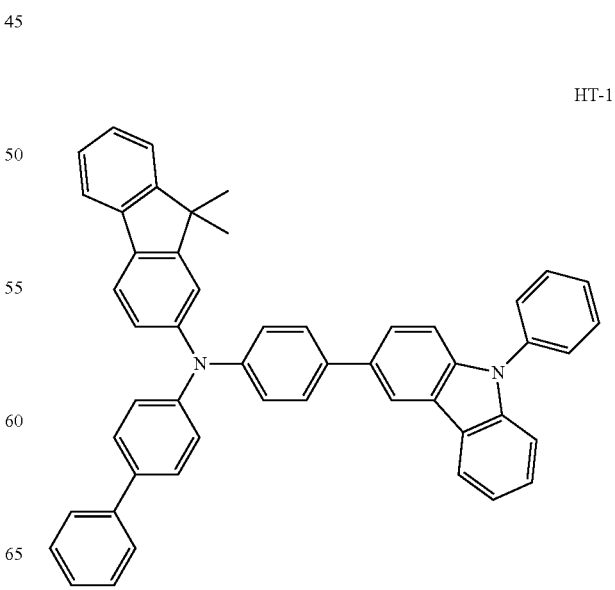

HT-1

HT-2
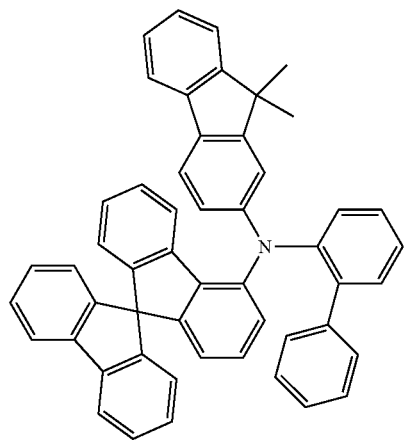
[Formula 108]
PDG
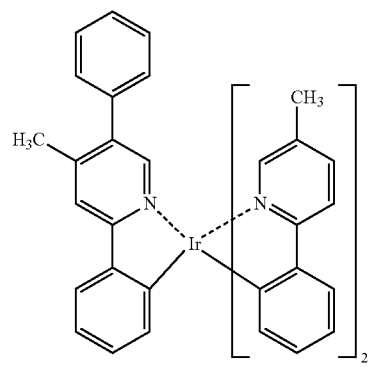
ET-1
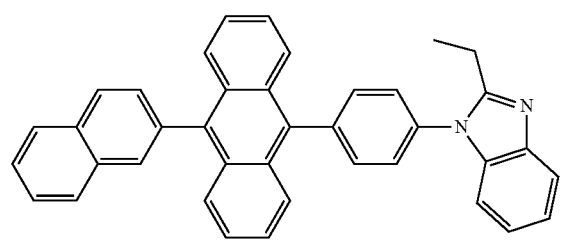
[Formula 109]
PGH-N1
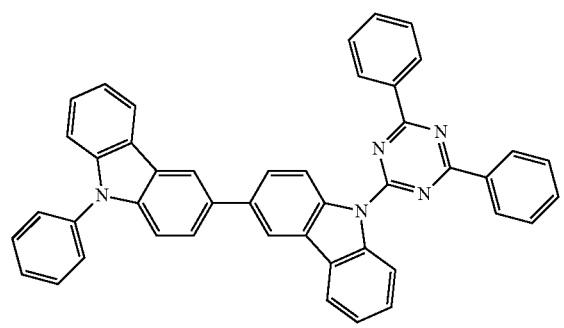
-continued
PGH-N2
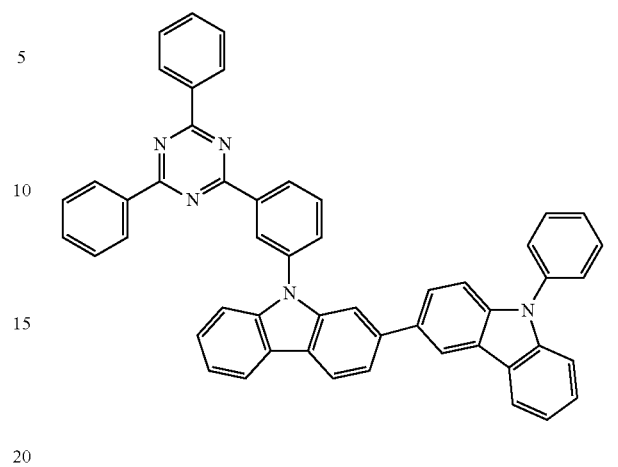
[Formula 110]
PGH-N3
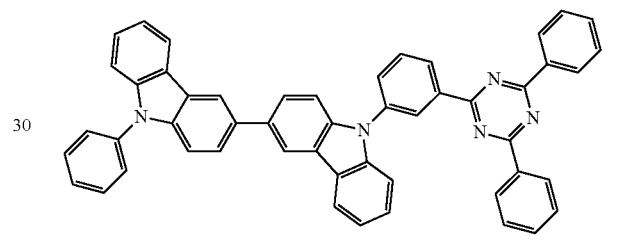
[Formula 111]
PGH-N4
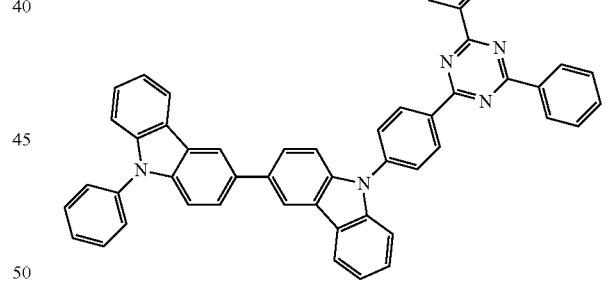
[Formula 112]
PGH-P1
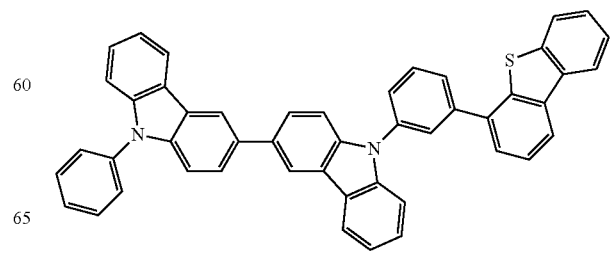

-continued

[Formula 113]

PGH-P2

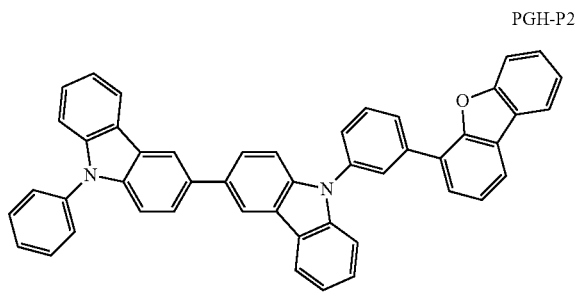

[Formula 114]

PGH-P3

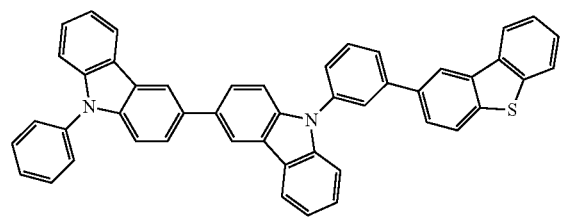

[Formula 115]

PGH-P4

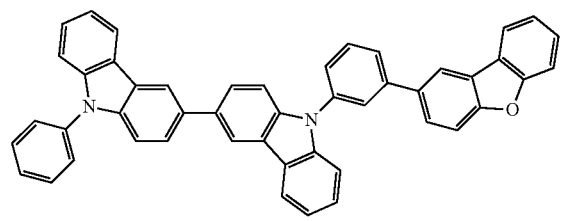

[Formula 116]

PGH-C1

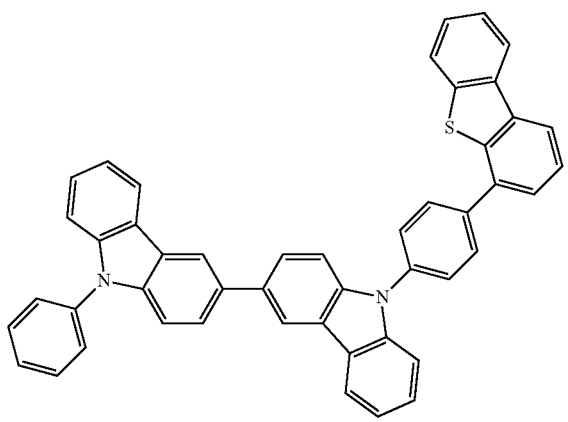

PGH-C2

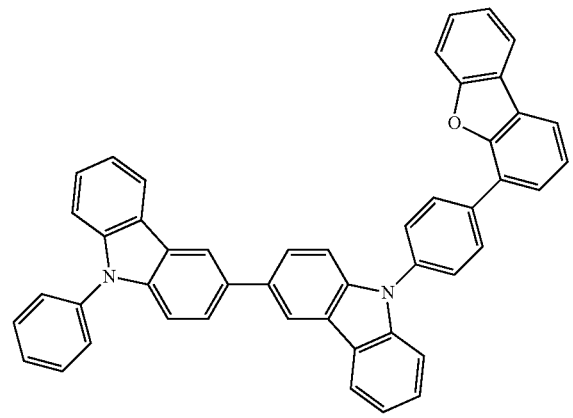

Manufacturing of Organic EL Device

The organic EL device was manufactured as follows.

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was set to be 130-nm thick. After the glass substrate having the transparent electrode line was cleaned, the glass substrate was mounted on a substrate holder of a vacuum evaporation apparatus. Firstly, a compound HT-1 and a compound HA-1 in a mixture were co-deposited on a surface of the glass substrate where the transparent electrode line was provided so as to cover the transparent electrode, thereby forming a 10-nm thick hole injecting layer. A concentration of the compound HA-1 in the hole injecting layer was set at 3 mass %.

Next, on the hole injecting layer, the compound HT-1 was deposited to form a 110-nm thick HT-1 film, thereby providing a first hole transporting layer. Next, on the first hole transporting layer, a compound HT-2 was deposited to form a 35-nm thick HT-2 film, thereby providing a second hole transporting layer. Next, on the second hole transporting layer, a compound PGH-N1 (first host material), a compound PGH-P1 (second host material), and a compound PGD (phosphorescent dopant material) were co-deposited to form a film, thereby providing a 40-nm thick emitting layer. A concentration of the compound PGH-P1 contained in the emitting layer was set at 47.5 mass %. A concentration of the compound PGD was set at 5 mass %.

Subsequent to the formation of the emitting layer, a compound ET-1 and 8-quinolinolato lithium (Liq) were co-deposited at the mass ratio of 50:50 to form a 30-nm thick electron transporting layer.

Liq was deposited on the electron transporting layer to form a 1-nm thick electron injecting layer.

A metal Al was deposited on the electron injecting layer to form an 80-nm thick metal cathode.

Thus, the organic EL device of Example 1 was prepared.

Evaluation of Organic EL Devices

The prepared organic EL devices were evaluated in terms of an external quantum efficiency (EQE) and a lifetime (LT95). The evaluation results are shown in Table 1.

External Quantum Efficiency EQE

Voltage was applied on each of the organic EL devices such that a current density was 10 mA/cm$^2$, where spectral radiance spectra were measured by a spectroradiometer CS-1000 (manufactured by Konica Minolta, Inc.). The external quantum efficiency EQE (unit: %) was calculated based on the obtained spectral-radiance spectra, assuming that the spectra was provided under a Lambertian radiation.

Lifetime LT95

Time (LT95) elapsed before the luminance intensity was decreased to 95% was obtained based on the initial luminance intensity 10,000 nit (cd/m$^2$). A unit of the lifetime LT95 was hours (hrs).

Examples 2 to 13 and Comparatives 1 and 2

Organic EL devices in Examples 2 to 13 and Comparatives 1 and 2 were manufactured in the same manner as in Example 1 except that the first and second host materials in Example 1 were replaced as shown in Table 1. These organic EL devices were evaluated in the same manner as in Example 1. The results are shown in Table 1.

TABLE 1

| | First Host Material | Second Host Material | EQE (%) | Lifetime (LT95) |
|---|---|---|---|---|
| Example 1 | PGH-N1 | PGH-P1 | 20 | 250 |
| Example 2 | PGH-N2 | PGH-P2 | 22 | 270 |
| Example 3 | PGH-N2 | PGH-P1 | 21 | 300 |
| Example 4 | PGH-N3 | PGH-P1 | 21 | 310 |
| Example 5 | PGH-N4 | PGH-P1 | 20 | 320 |
| Example 6 | PGH-N3 | PGH-P2 | 21 | 280 |
| Example 7 | PGH-N4 | PGH-P2 | 21 | 300 |
| Example 8 | PGH-N2 | PGH-P3 | 21 | 290 |
| Example 9 | PGH-N3 | PGH-P3 | 21 | 300 |
| Example 10 | PGH-N4 | PGH-P3 | 20 | 310 |
| Example 11 | PGH-N2 | PGH-P4 | 22 | 260 |
| Example 12 | PGH-N3 | PGH-P4 | 21 | 270 |
| Example 13 | PGH-N4 | PGH-P4 | 20 | 280 |
| Comparative 1 | PGH-N1 | PGH-C1 | 20 | 150 |
| Comparative 2 | PGH-N2 | PGH-C2 | 21 | 200 |

As shown in Table 1, it has been found that the organic EL devices in Examples exhibit the same level of the external quantum efficiency and a longer lifetime as compared with the organic EL devices in Comparatives.

The invention claimed is:

1. An organic electroluminescence device comprising:
   an anode;
   a cathode; and
   at least one organic layer provided between the anode and the cathode, wherein
   the at least one organic layer comprises a first compound represented by a formula (1) and a second compound represented by a formula (2),

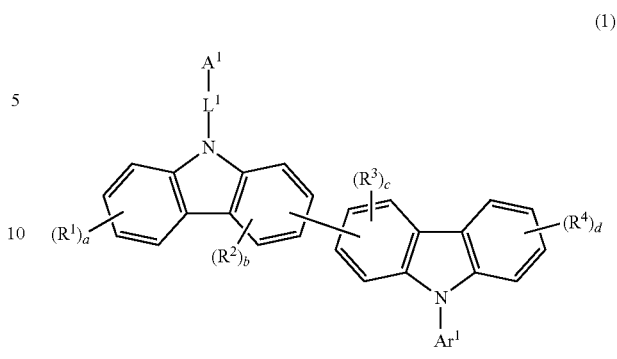

(1)

where: $R^1$, $R^2$, $R^3$ and $R^4$ each independently represent a halogen atom, a substituted or unsubstituted alkyl group having 1 to 25 carbon atoms, a substituted or unsubstituted cycloalkyl group having 3 to 25 ring carbon atoms, a substituted or unsubstituted aryl group having 6 to 24 ring carbon atoms, a substituted or unsubstituted heterocyclic group having 3 to 30 ring atoms, a substituted or unsubstituted alkoxy group having 1 to 25 carbon atoms, a substituted or unsubstituted aryloxy group having 6 to 24 ring carbon atoms, a substituted or unsubstituted alkylthio group having 1 to 25 carbon atoms, a substituted or unsubstituted arylthio group having 6 to 24 ring carbon atoms, a substituted or unsubstituted aralkyl group having 7 to 25 carbon atoms, a silyl group substituted by at least one group selected from the group consisting of an alkyl group having 1 to 25 carbon atoms and an aryl group having 6 to 24 ring carbon atoms, or a cyano group;

a is 0, 1, 2, 3 or 4;

b is 0, 1, 2 or 3;

c is 0, 1, 2 or 3;

d is 0, 1, 2, 3 or 4;

a plurality of $R^1$ are mutually the same or different when a is 2 or more; the plurality of $R^1$ are mutually bonded to form a ring, or not bonded;

a plurality of $R^2$ are mutually the same or different when b is 2 or more; the plurality of $R^2$ are mutually bonded to form a ring, or not bonded;

a plurality of $R^3$ are mutually the same or different when c is 2 or more; the plurality of $R^3$ are mutually bonded to form a ring, or not bonded;

a plurality of $R^4$ are mutually the same or different when d is 2 or more; the plurality of $R^4$ are mutually bonded to form a ring, or not bonded;

$A^1$ is a substituted or unsubstituted nitrogen-containing heterocyclic group having 5 to 24 ring atoms;

$L^1$ is a single bond, a substituted or unsubstituted divalent aryl group having 6 to 24 ring carbon atoms, or a substituted or unsubstituted divalent heterocyclic group having 5 to 24 ring atoms; and $Ar^1$ is a substituted or unsubstituted aryl group having 6 to 24 ring carbon atoms, or a substituted or unsubstituted heterocyclic group having 5 to 24 ring atoms, (2)

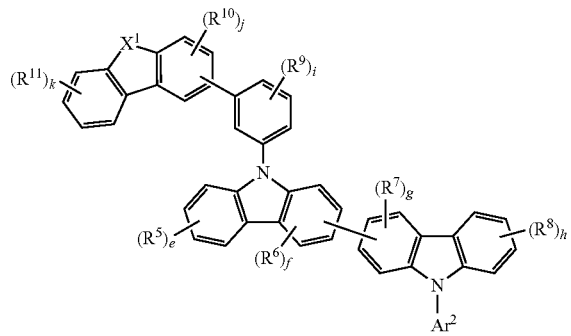

where: $R^5$, $R^6$, $R^7$, $R^8$, $R^9$, $R^{11}$ and each independently represent a halogen atom, a substituted or unsubstituted alkyl group having 1 to 25 carbon atoms, a substituted or unsubstituted cycloalkyl group having 3 to 25 ring carbon atoms, a substituted or unsubstituted aryl group having 6 to 24 ring carbon atoms, a substituted or unsubstituted heterocyclic group having 3 to 30 ring atoms, a substituted or unsubstituted alkoxy group having 1 to 25 carbon atoms, a substituted or unsubstituted aryloxy group having 6 to 24 ring carbon atoms, a substituted or unsubstituted alkylthio group having 1 to 25 carbon atoms, a substituted or unsubstituted arylthio group having 6 to 24 ring carbon atoms, a substituted or unsubstituted aralkyl group having 7 to 25 carbon atoms, a silyl group substituted by at least one group selected from the group consisting of an alkyl group having 1 to 25 carbon atoms and an aryl group having 6 to 24 ring carbon atoms, or a cyano group;

e is 0, 1, 2, 3 or 4;
f is 0, 1, 2 or 3;
g is 0, 1, 2 or 3;
h is 0, 1, 2, 3 or 4;
i is 0, 1, 2, 3 or 4;
j is 0, 1, 2 or 3;
k is 0, 1, 2, 3 or 4;
a plurality of $R^5$ are mutually the same or different when e is 2 or more; the plurality of $R^5$ are mutually bonded to form a ring, or not bonded;
a plurality of $R^6$ are mutually the same or different when f is 2 or more; the plurality of $R^6$ are mutually bonded to form a ring, or not bonded;
a plurality of $R^7$ are mutually the same or different when g is 2 or more; the plurality of $R^7$ are mutually bonded to form a ring, or not bonded;
a plurality of $R^8$ are mutually the same or different when h is 2 or more; the plurality of $R^8$ are mutually bonded to form a ring, or not bonded;
a plurality of $R^9$ are mutually the same or different when i is 2 or more; the plurality of $R^9$ are mutually bonded to form a ring, or not bonded;
a plurality of $R^{10}$ are mutually the same or different when j is 2 or more; the plurality of $R^{10}$ are mutually bonded to form a ring, or not bonded;
a plurality of $R^{11}$ are mutually the same or different when k is 2 or more; the plurality of $R^{11}$ are mutually bonded to form a ring, or not bonded;
$Ar^2$ is a substituted or unsubstituted aryl group having 6 to 24 ring carbon atoms, or a substituted or unsubstituted heterocyclic group having 5 to 24 ring atoms; and
$X^1$ is an oxygen atom or a sulfur atom, and wherein the at least one organic layer comprises an emitting layer, the emitting layer comprises the first compound, the second compound and a phosphorescent material, and the phosphorescent material is an ortho-metalated complex of a metal atom selected from the group consisting of iridium, osmium and platinum.

2. The organic electroluminescence device according to claim 1, wherein
the compound represented by the formula (1) is represented by a formula (3) or a formula (4), (3)

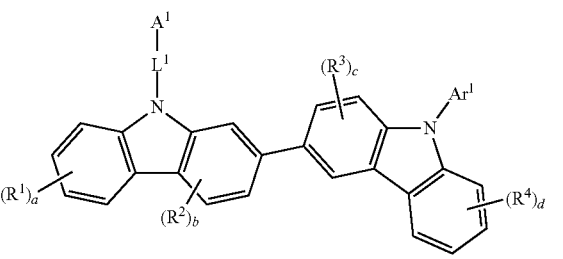

(4)

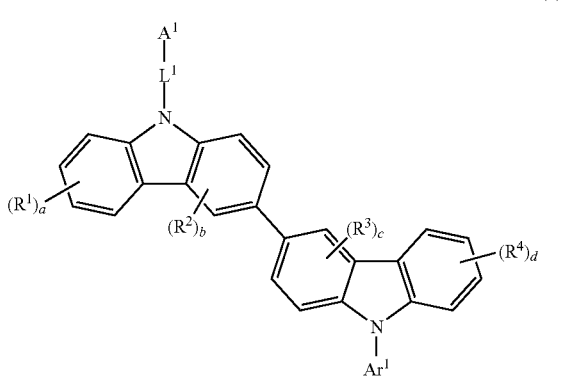

where: $R^1$, $R^2$, $R^3$ and $R^4$ each independently represent a halogen atom, a substituted or unsubstituted alkyl group having 1 to 25 carbon atoms, a substituted or unsubstituted cycloalkyl group having 3 to 25 ring carbon atoms, a substituted or unsubstituted aryl group having 6 to 24 ring carbon atoms, a substituted or unsubstituted heterocyclic group having 3 to 30 ring atoms, a substituted or unsubstituted alkoxy group having 1 to 25 carbon atoms, a substituted or unsubstituted aryloxy group having 6 to 24 ring carbon atoms, a substituted or unsubstituted alkylthio group having 1 to 25 carbon atoms, a substituted or unsubstituted arylthio group having 6 to 24 ring carbon atoms, a substituted or unsubstituted aralkyl group having 7 to 25 carbon atoms, a silyl group substituted by at least one group selected from the group consisting of an alkyl group having 1 to 25 carbon atoms and an aryl group having 6 to 24 ring carbon atoms, or a cyano group;

a is 0, 1, 2, 3 or 4;
b is 0, 1, 2 or 3;
c is 0, 1, 2 or 3;
d is 0, 1, 2, 3 or 4;
a plurality of $R^1$ are mutually the same or different when a is 2 or more; the plurality of $R^1$ are mutually bonded to form a ring, or not bonded;
a plurality of $R^2$ are mutually the same or different when b is 2 or more; the plurality of $R^2$ are mutually bonded to form a ring, or not bonded;

a plurality of $R^3$ are mutually the same or different when c is 2 or more; the plurality of $R^3$ are mutually bonded to form a ring, or not bonded;

a plurality of $R^4$ are mutually the same or different when d is 2 or more; the plurality of $R^4$ are mutually bonded to form a ring, or not bonded;

$A^1$ is a substituted or unsubstituted nitrogen-containing heterocyclic group having 5 to 24 ring atoms;

$L^1$ is a single bond, a substituted or unsubstituted divalent aryl group having 6 to 24 ring carbon atoms, or a substituted or unsubstituted divalent heterocyclic group having 5 to 24 ring atoms; and $Ar^1$ is a substituted or unsubstituted aryl group having 6 to 24 ring carbon atoms, or a substituted or unsubstituted heterocyclic group having 5 to 24 ring atoms.

3. The organic electroluminescence device according to claim 1, wherein $A^1$ is a substituent represented by a formula (5),

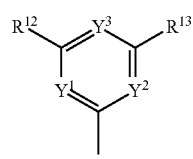

(5)

where: $Y^1$, $Y^2$ and $Y^3$ each independently represent $CR^{14}$ or a nitrogen atom;

at least one of $Y^1$, $Y^2$ and $Y^3$ is a nitrogen atom;

$R^{12}$, $R^{13}$ and $R^{14}$ represent a hydrogen atom, a halogen atom, a substituted or unsubstituted alkyl group having 1 to 25 carbon atoms, a substituted or unsubstituted cycloalkyl group having 3 to 25 ring carbon atoms, a substituted or unsubstituted aryl group having 6 to 24 ring carbon atoms, a substituted or unsubstituted heterocyclic group having 3 to 30 ring atoms, a substituted or unsubstituted alkoxy group having 1 to 25 carbon atoms, a substituted or unsubstituted aryloxy group having 6 to 24 ring carbon atoms, a substituted or unsubstituted alkylthio group having 1 to 25 carbon atoms, a substituted or unsubstituted arylthio group having 6 to 24 ring carbon atoms, a substituted or unsubstituted aralkyl group having 7 to 25 carbon atoms, a silyl group substituted by at least one group selected from the group consisting of an alkyl group having 1 to 25 carbon atoms and an aryl group having 6 to 24 ring carbon atoms, or a cyano group;

$R^{12}$ and $R^{14}$ are mutually bonded to form a ring, or not bonded; and $R^{13}$ and $R^{14}$ are mutually bonded to form a ring, or not bonded.

4. The organic electroluminescence device according to claim 3, wherein at least two of $Y^1$, $Y^2$ and $Y^3$ are nitrogen atoms.

5. The organic electroluminescence device according to claim 1, wherein $L^1$ is a substituted or unsubstituted divalent aryl group having 6 to 24 ring carbon atoms, or a substituted or unsubstituted divalent heterocyclic group having 5 to 24 ring atoms.

6. The organic electroluminescence device according to claim 1, wherein a, b, c and d are 0.

7. The organic electroluminescence device according to claim 1, wherein the compound represented by the formula (2) is represented by a formula (6),

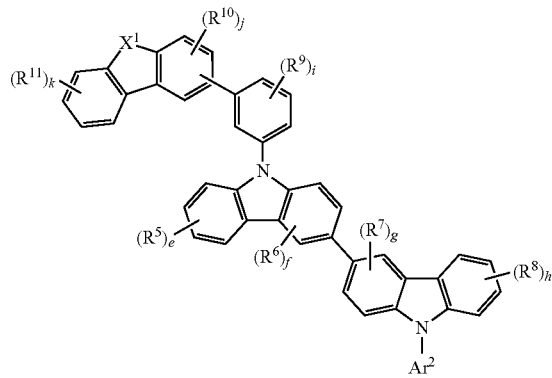

(6)

where: $R^5$, $R^6$, $R^7$, $R^8$, $R^9$, $R^{11}$ and each independently represent a halogen atom, a substituted or unsubstituted alkyl group having 1 to 25 carbon atoms, a substituted or unsubstituted cycloalkyl group having 3 to 25 ring carbon atoms, a substituted or unsubstituted aryl group having 6 to 24 ring carbon atoms, a substituted or unsubstituted heterocyclic group having 3 to 30 ring atoms, a substituted or unsubstituted alkoxy group having 1 to 25 carbon atoms, a substituted or unsubstituted aryloxy group having 6 to 24 ring carbon atoms, a substituted or unsubstituted alkylthio group having 1 to 25 carbon atoms, a substituted or unsubstituted arylthio group having 6 to 24 ring carbon atoms, a substituted or unsubstituted aralkyl group having 7 to 25 carbon atoms, a silyl group substituted by at least one group selected from the group consisting of an alkyl group having 1 to 25 carbon atoms and an aryl group having 6 to 24 ring carbon atoms, or a cyano group;

e is 0, 1, 2, 3 or 4;
f is 0, 1, 2 or 3;
g is 0, 1, 2 or 3;
h is 0, 1, 2, 3 or 4;
i is 0, 1, 2, 3 or 4;
j is 0, 1, 2 or 3;
k is 0, 1, 2, 3 or 4;

a plurality of $R^5$ are mutually the same or different when e is 2 or more; the plurality of $R^5$ are mutually bonded to form a ring, or not bonded;

a plurality of $R^6$ are mutually the same or different when f is 2 or more; the plurality of $R^6$ are mutually bonded to form a ring, or not bonded;

a plurality of $R^7$ are mutually the same or different when g is 2 or more; the plurality of $R^7$ are mutually bonded to form a ring, or not bonded;

a plurality of $R^8$ are mutually the same or different when h is 2 or more; the plurality of $R^8$ are mutually bonded to form a ring, or not bonded;

a plurality of $R^9$ are mutually the same or different when i is 2 or more; the plurality of $R^9$ are mutually bonded to form a ring, or not bonded;

a plurality of $R^{10}$ are mutually the same or different when j is 2 or more; the plurality of $R^{11}$ are mutually bonded to form a ring, or not bonded;

a plurality of $R^{11}$ are mutually the same or different when k is 2 or more; the plurality of $R^{11}$ are mutually bonded to form a ring, or not bonded;

$Ar^2$ is a substituted or unsubstituted aryl group having 6 to 24 ring carbon atoms, or a substituted or unsubstituted heterocyclic group having 5 to 24 ring atoms; and $X^1$ is an oxygen atom or a sulfur atom.

8. The organic electroluminescence device according to claim 1, wherein $Ar_2$ is a substituted or unsubstituted aryl group having 6 to 24 ring carbon atoms.

9. The organic electroluminescence device according to claim 8, wherein when $Ar^2$ has a substituent, the substituent is an unsubstituted aryl group having 6 to 24 ring carbon atoms.

10. The organic electroluminescence device according to claim 1, wherein $X^1$ is a sulfur atom.

11. The organic electroluminescence device according to claim 1, wherein e, f, g, h, j and k are 0.

12. The organic electroluminescence device according to claim 1, wherein the at least one organic layer comprises a plurality of organic layers, and one of the plurality of organic layers comprises the first compound and the second compound.

13. The organic electroluminescence device according to claim 1, further comprising:

a hole transporting layer between the anode and the emitting layer.

14. The organic electroluminescence device according to claim 1, further comprising:

an electron transporting layer between the cathode and the emitting layer.

15. An electronic device comprising the organic electroluminescence device according to claim 1.

* * * * *